United States Patent
Hong et al.

(10) Patent No.: US 11,574,912 B2
(45) Date of Patent: Feb. 7, 2023

(54) MEMORY DEVICES AND METHODS OF MANUFACTURING THE SAME

(71) Applicant: Samsung Electronics Co., Ltd., Suwon-si (KR)

(72) Inventors: Augustin Jinwoo Hong, Seoul (KR); Young-Ju Lee, Yongin-si (KR); Joon-Yong Choe, Hwaseong-si (KR); Jung-Hyun Kim, Seoul (KR); Sang-Jun Lee, Incheon (KR); Hyeon-Kyu Lee, Suwon-si (KR); Yoon-Chul Cho, Seoul (KR); Je-Min Park, Suwon-si (KR); Hyo-Dong Ban, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 223 days.

(21) Appl. No.: 17/112,195

(22) Filed: Dec. 4, 2020

(65) Prior Publication Data

US 2021/0091086 A1    Mar. 25, 2021

Related U.S. Application Data

(62) Division of application No. 16/106,087, filed on Aug. 21, 2018, now Pat. No. 10,886,277.

(30) Foreign Application Priority Data

Nov. 9, 2017   (KR) .................. 10-2017-0149037

(51) Int. Cl.
  *H01L 27/108*   (2006.01)
  *H01L 21/768*   (2006.01)
  *H01L 23/535*   (2006.01)

(52) U.S. Cl.
  CPC .. *H01L 27/10823* (2013.01); *H01L 21/76895* (2013.01); *H01L 23/535* (2013.01);
  (Continued)

(58) Field of Classification Search
  CPC ......... H01L 21/76895; H01L 27/10823; H01L 27/10885; H01L 27/10888
  See application file for complete search history.

(56) References Cited

U.S. PATENT DOCUMENTS 6,780,732 B2    8/2004   Durcan et al.
8,298,893 B2   10/2012   Kim
(Continued)

FOREIGN PATENT DOCUMENTS

JP    2014053361 A    3/2014
JP    2014120652 A    6/2014
JP    2015002301 A    1/2015

OTHER PUBLICATIONS

Indian Examination Report dated Dec. 4, 2020 for corresponding Indian Application No. 201844041980, and English-language translation thereof.

*Primary Examiner* — Matthew C Landau
*Assistant Examiner* — Mark Hatzilambrou
(74) *Attorney, Agent, or Firm* — Harness, Dickey & Pierce, P.L.C.

(57) ABSTRACT

A memory device includes cell transistors on active regions defined by a device isolation layer on a substrate such that each cell transistor has a buried cell gate and a junction portion adjacent to and at least partially distal to the substrate in relation to the buried cell gate, an insulation pattern on the substrate and covering the cell transistors and the device isolation layer, and a bit line structure on the insulation pattern and connected to the junction portion. The bit line structure includes a buffer pattern on the pattern and having a thermal oxide pattern, a conductive line on the (Continued)

buffer pattern, and a contact extending from the conductive line to the junction portion through the buffer pattern and the insulation pattern.

20 Claims, 50 Drawing Sheets

(52) U.S. Cl.
CPC .. *H01L 27/10814* (2013.01); *H01L 27/10852* (2013.01); *H01L 27/10876* (2013.01); *H01L 27/10885* (2013.01); *H01L 27/10888* (2013.01)

(56) References Cited

U.S. PATENT DOCUMENTS

| | | |
|---|---|---|
| 8,648,415 B2 | 2/2014 | Taniguchi |
| 8,648,423 B2 | 2/2014 | Han et al. |
| 8,941,162 B2 | 1/2015 | Sukekawa |
| 9,343,475 B2 | 5/2016 | Jang et al. |
| 9,460,964 B2 | 10/2016 | Kim |
| 9,514,980 B2 | 12/2016 | Lee et al. |
| 2012/0217576 A1 | 8/2012 | Yeo |
| 2013/0056823 A1 | 3/2013 | Kim et al. |
| 2015/0303201 A1 | 10/2015 | Lee et al. |
| 2016/0181198 A1 | 6/2016 | Kim et al. |
| 2016/0372359 A1 | 12/2016 | Kong et al. |
| 2018/0158773 A1 | 6/2018 | Hong et al. |

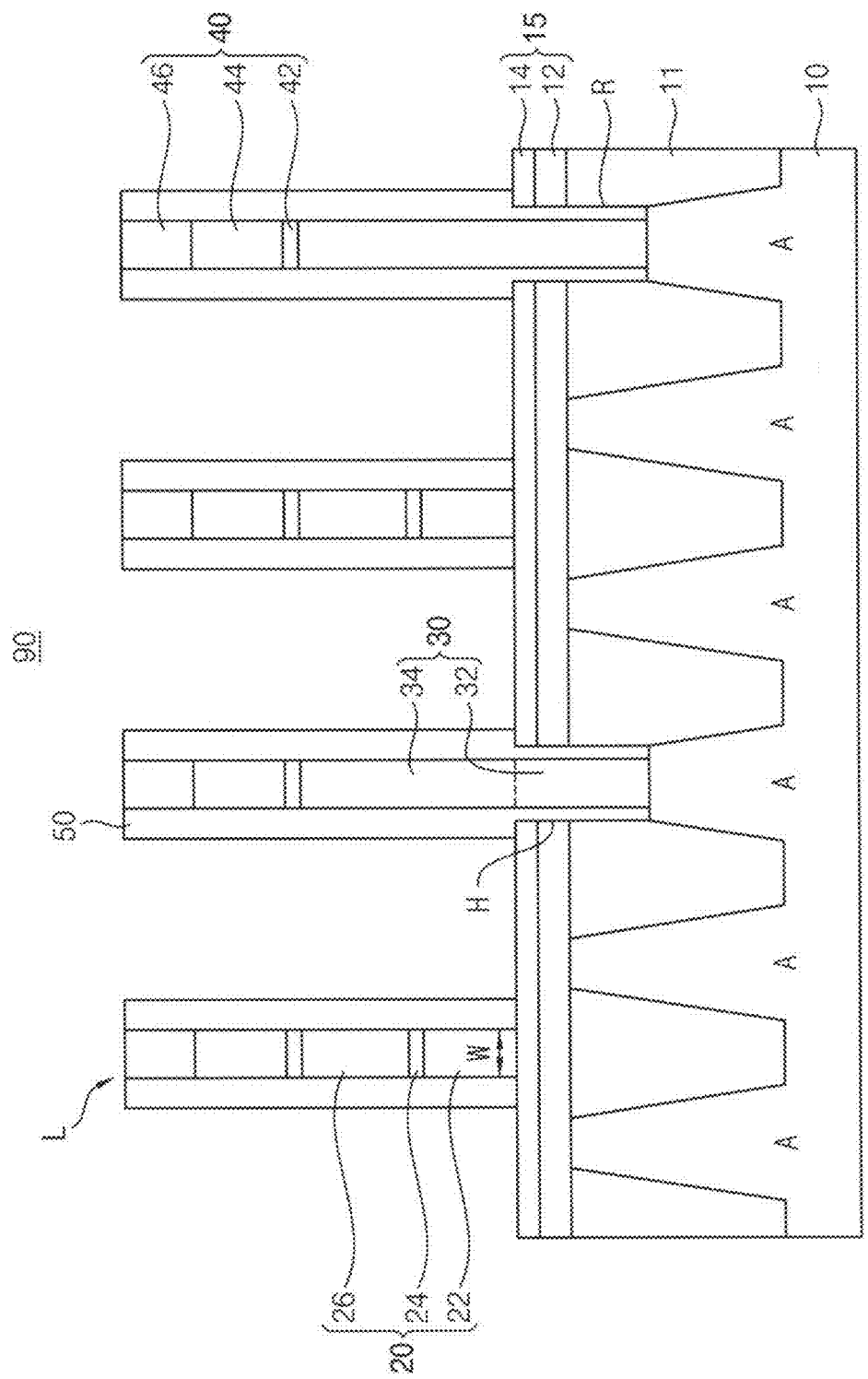

MEMORY DEVICES AND METHODS OF MANUFACTURING THE SAME

CROSS-REFERENCE TO RELATED APPLICATIONS

This application is a divisional of U.S. application Ser. No. 16/106,087, filed on Aug. 21, 2018, which claims priority under 35 U.S.C. § 119 to Korean Patent Application No. 10-2017-0149037 filed on Nov. 9, 2017 in the Korean Intellectual Property Office, the contents of each of which are incorporated by reference herein in its entirety.

BACKGROUND

1. Field

Example embodiments relate to memory devices and methods of manufacturing the same, and more particularly, to dynamic random access memory (DRAM) devices having buried channel arrays and methods of manufacturing having the same.

2. Description of the Related Art

As the designs of semiconductor devices have been downsized and more highly-integrated over time, the pattern width associated with semiconductor devices has been reduced and the channel length has been shortened in each cell transistor of the semiconductor devices. In some cases, a difficulty associated with manufacturing semiconductor devices configured to obtain a sufficient refresh time of memory devices has increased due to a short channel effect that may result from reduced pattern width and channel length associated with the semiconductor devices.

A buried channel array transistor (BCAT), also referred to herein interchangeably as a "cell transistor," has been widely used to obtain a sufficient effective channel length in such a way that the surface of the gate electrode is positioned below the surface of the silicon substrate. Since the gate structure of the BCAT is fully buried in the silicon substrate, the channel length and width of the gate structure can be sufficiently obtained and the parasitic capacitance between neighboring bit lines can be minimize in the BCAT.

A peripheral gate structure of the BCAT-based memory device (hereinafter, referred to as BCAT memory device) is still provided as a planar type, so the BCAT memory device has a large stepped portion between the cell area and the peripheral area. Thus, the bit line and the peripheral gate structure tend to be simultaneously formed in the cell area and the peripheral area, respectively, of the BCAT memory device so as to reduce the height difference due to the stepped portion as much as possible. The bit line that may be formed simultaneously with the peripheral gate structure is widely known as a gate bit line (GBL).

The gap distance between the neighboring the GBLs has been gradually reduced due to the recent downsize and high integration degree of the BCAT memory devices. Thus, the aspect ratio of the pattern for the GBL significantly increases and the pattern is collapsed in the etching process for forming the GBL. In addition, the parasitic capacitance also increases between the neighboring GBLs due to the small gap distance between the neighboring the GBLs, to thereby considerably reduce the sensing margin ($V_{BL}$) of the GBL.

SUMMARY

Some example embodiments of the present inventive concepts provide a memory device having a bit line structure in which a buffer pattern interposed between an insulation pattern and a conductive line includes a thermal oxide pattern together with a sufficiently reduced overall height to thereby reduce the aspect ratio and the parasitic capacitance of a bit line and increase the sensing margin and the physical stability of the bit line.

Some example embodiments of the present inventive concepts provide a method of manufacturing the above memory device.

Other example embodiments of the present inventive concepts provide a bit line structure for a memory device having a thermal oxide pattern interposed between an insulation pattern and a conductive line to thereby reduce an overall height and parasitic capacitance thereof.

According to some example embodiments of the inventive concepts, a memory device may include a substrate including a plurality of active regions defined by a device isolation layer, a plurality of cell transistors on the plurality of active regions of the substrate, each cell transistor of the plurality of cell transistors including a buried cell gate in the substrate and a junction portion adjacent to the buried cell gate and at least partially distal to the substrate in relation to the buried cell gate, an insulation pattern on the substrate, the insulation pattern covering the plurality of cell transistors and the device isolation layer, and a bit line structure on the insulation pattern and connected to the junction portion. The bit line structure may include a buffer pattern extending on the insulation pattern and including a thermal oxide pattern, a conductive line on the buffer pattern, and a contact extending from the conductive line to the junction portion through the buffer pattern and the insulation pattern.

According to some example embodiments of the inventive concepts, a method of manufacturing a semiconductor device may include providing a substrate including a plurality of cell transistors on a plurality of active regions defined by a device isolation layer. Each cell transistor of the plurality of cell transistors may include a buried cell gate in the substrate and a junction portion adjacent to the buried cell gate and at least partially distal to the substrate in relation to the buried cell gate. The method may further include sequentially forming an insulation layer and a buffer layer on the substrate, the buffer layer including a thermal oxide layer, forming a preliminary contact penetrating through the buffer layer and the insulation layer such that the preliminary contact makes contact with the junction portion under a top surface of the device isolation layer and is enclosed by the device isolation layer, an insulation pattern and a preliminary buffer pattern, forming a conductive layer on the preliminary buffer pattern and the preliminary contact, and forming a bit line structure extending on the insulation pattern based on partially removing the conductive layer, the preliminary buffer pattern and the preliminary contact, the bit line structure having a buffer pattern on the insulation pattern, a conductive line on the buffer pattern and a contact connecting with the junction portion and the conductive line, the buffer pattern including a thermal oxide pattern.

According to some example embodiments of the inventive concepts, a bit line structure for a memory device may include a buffer pattern extending on an insulation pattern that covers a semiconductor substrate, the semiconductor substrate including a cell transistor, the buffer pattern including a thermal oxide pattern. The bit line structure may further include a conductive line on the buffer pattern, the conductive line having a common width as the buffer pattern, and a cylindrical contact extending from the conductive line into the semiconductor substrate through the buffer pattern and the insulation pattern.

According to some example embodiments of the present inventive concepts, the thermal oxide layer may be formed on the insulation layer by the thermal oxidation process to polysilicon simultaneously with the peripheral gate insulation layer. The thermal oxide layer may be formed into the thermal oxide pattern of the buffer pattern for preventing etching damages to the substrate and the BCAT underlying the insulation layer in the bit line etching process.

The thickness of the thermal oxide layer may be easily controlled just by changing the initial thickness of the polysilicon and the process conditions of the thermal oxidation process for forming the peripheral gate insulation layer, so the thermal oxide pattern may be controlled to have a sufficient thickness for protecting the substrate and the BCAT in the bit line etching process. Since the etching rate of the thermal oxide pattern may be much smaller than that of the conductive material of the first contact making contact with the first junction, a small thickness of the thermal oxide pattern may be sufficiently protect the substrate in the bit line etching process. Thus, when the thermal oxide pattern may be included in the buffer pattern, an overall thickness or height of the buffer pattern may be reduced and thus the aspect ratio of the line pattern may be reduced in the bit line etching process, thereby preventing the collapse of the line pattern in the bit line etching process and the bridge defect of the bit line structure.

In addition, the height of the buffer conductive in the buffer pattern may also be reduced since the thermal oxide pattern having a good etch resistivity in the bit line etching process may be included in the buffer pattern, so that the area of the opposite face between the buffer conductive pattern and the upper contact adjacent to each other may be sufficiently reduced. Thus, the parasitic capacitance between the neighboring bit line structures may be reduced and the sensing margin of the bit line structure may be improved, thereby improving the operation characteristics of the memory device.

BRIEF DESCRIPTION OF THE DRAWINGS

These and other features of the inventive concepts will become more apparent by describing in detail example embodiments thereof with reference to the accompanying drawings of which:

FIG. 1 is a cross-sectional view illustrating a bit line structure for a memory device in accordance with some example embodiments of the present inventive concepts;

DETAILED DESCRIPTION OF THE EMBODIMENTS

Figure 2A:
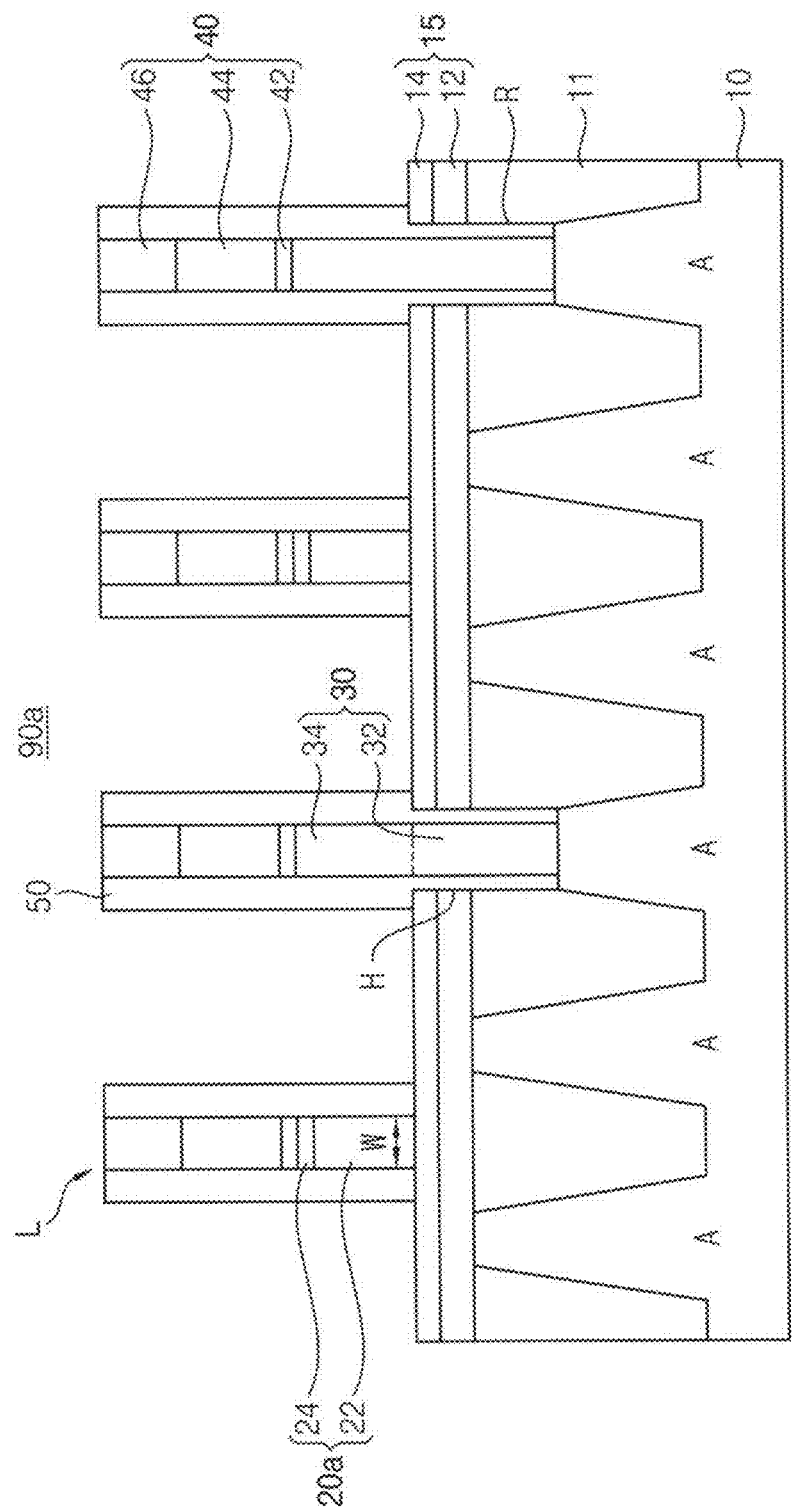
FIG. 2A is a cross-sectional view illustrating a first modification of the bit line structure shown in FIG. 1.

Reference will now be made to example embodiments, which are illustrated in the accompanying drawings, wherein like reference numerals may refer to like components throughout.

FIG. 1 is a cross-sectional view illustrating a bit line structure for a memory device in accordance with some example embodiments of the present inventive concepts.

Referring to FIG. 1, a bit line structure 90 for a memory device in accordance with some example embodiments of the present inventive concepts may include a semiconductor substrate 10 having an insulation pattern 15, a line-shaped buffer pattern 20 extending on the insulation pattern 15 in a particular (or, alternatively, predetermined) direction and having a thermal oxide pattern 22, a cylindrical contact 30 extending into the substrate through the insulation pattern 15 and having a top surface at the same level as a top surface of the buffer pattern 20 and a conductive line 40 on the buffer pattern 20 and the contact 30.

For example, the semiconductor substrate 10 may include a plurality of active regions A that may be defined by an device isolation layer 11 and a plurality of conductive structures (not shown) that may be arranged on the active regions A. The conductive structure may include channels and transistors. The bit line structure 90 may be connected to a drain electrode of the transistor and electric signals may be transferred via the bit line structure 90.

The insulation pattern 15 may be arranged on a whole surface of the substrate 10 such that the conductive structures may be covered by the insulation pattern 15 and at least a contact hole H may be provided with the insulation pattern 15. In some example embodiments, the insulation pattern 15 may include bi-layer structure having a deposition oxide pattern 12 on the substrate 10 and an etch stop pattern 14 on the deposition oxide pattern 12.

The conductive structures on the active region A may be protected from external surroundings by the deposition oxide pattern 12 and etch stop pattern 14 may stop a subsequent etching process for forming wirings.

For example, the deposition oxide pattern 12 may comprise silicon oxide and may be formed to a thickness of about 40 Å to about 60 Å by a chemical vapor deposition (CVD) process. In addition, the etch stop pattern 14 may comprise silicon nitride and may be formed to a thickness of about 30 Å to about 40 Å by a chemical vapor deposition (CVD) process. Particularly, the deposition oxide pattern 12 of the insulation pattern 15 may be formed by a deposition process, while the thermal oxide pattern 22 of the buffer pattern 20 may be formed by a thermal oxidation process. For that reason, the deposition oxide pattern 12 of the insulation pattern 15 is referred to as the deposition oxide pattern and the oxide pattern 22 of the buffer pattern 20 is referred to as the thermal oxide pattern.

While some example embodiments disclose that the insulation pattern 15 has the bi-layered structure having the silicon oxide pattern and the silicon nitride pattern, any other modifications may also be allowable to the insulation pattern 15 according to the requirements and characteristics of the bit line structure 90 and a semiconductor device having the bit line structure 90. For example, the insulation pattern 15 may have a single layer structure just having the deposition oxide pattern 12.

The buffer pattern 20 may prevent the insulation pattern 15 from an over etch in a subsequent etching process for forming the contact 30 and the conductive line 40, so the substrate 10 may be sufficiently prevented from the etching process for forming the contact 30 and the conductive line 40. Thus, the buffer pattern 20 may have a thickness and an etch rate that may be sufficient for protecting the substrate 10 in the subsequent etching process.

Since the contact 30 may comprise polysilicon and the conductive line 40 may comprise a conductive metal, the buffer pattern 20 may have a sufficiently small etch rate in a subsequent etching process for removing the polysilicon and the conductive metal. The buffer pattern 20 may have a single layer structure or a multilayer structure.

In some example embodiments, the buffer pattern 20 may have a multilayer structure in which a thermal oxide pattern 22, a nitride pattern 24 and a polysilicon pattern 26 may be stacked on the insulation pattern 15.

The polysilicon pattern 26 may be etched off by an over etch of a first etching process for removing the conductive metal. The conductive metal layer may be formed into the conductive line 40 by the first etching process and a polysilicon layer under the conductive metal layer may be partially removed by the over etch of the first etching process. That is, the polysilicon pattern 26 may function as a buffer for absorbing the over etch of the first etching process for forming the conductive line 40. Particularly, the contact 30 may also comprise polysilicon and an upper portion of the contact 30 may be formed by the over etch of the first etching process simultaneously with the polysilicon pattern 26.

The nitride pattern 24 and the thermal oxide pattern 22 may be sufficiently resistive to a second etching process for forming a lower portion of the contact 30. That is, the nitride pattern 24 and the thermal oxide pattern 22 may have a much smaller etch rate than the lower portion of the contact 30, so that the substrate 10 may be sufficiently protected from the second etching process by the nitride pattern 24 and the thermal oxide pattern 22.

That is, the polysilicon pattern 26 may be sufficiently absorb the over etch of the first etching process for forming the conductive line 40 and the nitride pattern 24 and the thermal oxide pattern 22 under the polysilicon pattern 26 as well as the insulation pattern 15 may be protected from the over etch in the formation of the conductive line 40. The nitride pattern 24 and the thermal oxide pattern 22 may be sufficiently resistive to the second etching process for forming the lower portion of the contact 30, so that the substrate 10 under the nitride pattern 24 and the thermal oxide pattern 22 may be sufficiently protected from the second etching process.

Therefore, the substrate 10 and the conductive structures on the active region A of the substrate 10 may be sufficiently protected from an etching process for forming the bit line structure 90 including the first and the second etching process by the buffer pattern 20 having the polysilicon pattern 26, the nitride pattern 24 and the thermal oxide pattern 22 and the insulation pattern 15.

The thermal oxide pattern 22 may be shaped into a line extending on the insulation pattern 15 along the particular (or, alternatively, predetermined) direction and having a width w, and the nitride pattern 24 and the polysilicon pattern 26 may be stacked on the thermal oxide pattern 22 and have the same width as the thermal oxide pattern 22.

In some example embodiments, the thermal oxide pattern 22 may be formed from polysilicon (e.g., a polysilicon pattern) by ("based on") a thermal oxidation process, and may have a greater thickness than the thermal oxide pattern may be formed from single crystalline silicon. Particularly, the thermal oxide pattern 22 may have a thickness of about 50 Å to about 100 Å and may be formed simultaneously with a peripheral gate insulation layer.

The nitride pattern 24 may be selectively provided with the buffer pattern 20. A nitride process may be selectively conducted to the thermal oxide pattern 22, and the nitride pattern 24 may be selectively formed on the thermal oxide pattern 22. Therefore, the nitride pattern 24 may include silicon oxynitride and have a thickness of about 20 Å to about 30 Å.

The polysilicon pattern 26 may have a sufficient thickness to absorb the over etch of the first etching process for forming the conductive line 40. The thickness of the polysilicon pattern 26 may be variable according to the thickness of the nitride pattern 24 and the thermal oxide pattern 22.

Accordingly, the polysilicon pattern 26 may not be provided with the buffer pattern 20 when the nitride pattern 24 and the thermal oxide pattern 22 may sufficiently absorb the over etch of the first etching process for forming the conductive line 40 and may be sufficiently resistive to the second etching process for forming the contact 30.

In some example embodiments, the thermal oxide pattern 22 may be formed from polysilicon by a thermal oxidation process for forming the peripheral gate insulation layer, so the thickness of the thermal oxide pattern 22 may be controlled according to the characteristics of the semiconductor devices having the bit line structure 90. Thus, when the nitride pattern 24 and the thermal oxide pattern 22 may have a sufficient thickness against the first etching process and the second etching process, the polysilicon pattern 26 may not be provided with the buffer pattern 20 and an overall height of the buffer pattern 20 may be reduced as height as the polysilicon pattern 26. The reduction of the overall height of the buffer pattern 20 may reduce an aspect ratio in the first and the second etching processes.

In addition, since the thickness variation of the polysilicon pattern 26 may be easily accessible by the control to the thickness and etch rate of the nitride pattern 24 and the thermal oxide pattern 22 and the polysilicon pattern 26 may be electrically conductive, the parasitic capacitance between the neighboring conductive lines 40 may be sufficiently reduced just by changing the thickness and etch rate of the nitride pattern 24 and the thermal oxide pattern 22, which may increase the sensing margin of the bit line structure 90.

In some example embodiments, the polysilicon pattern 26 may have a thickness of about 20 Å to about 200 Å. For example, when the thermal oxide pattern 22 may have a thickness of about 50 Å, the thickness of the polysilicon pattern 26 may be maximally reduced to about 40 Å for reducing the aspect ratio and the parasitic capacitance of the bit line structure 90.

The contact 30 may extend into the substrate 10 through the insulation pattern 15 from the conductive line 40 and a top surface of the contact 30 may be the same level as the buffer pattern 20. Thus, the contact 30 may include an upper contact 34 making contact with the conductive line 40 in parallel with the polysilicon pattern 26 and a lower contact 32 extending downwards from the upper contact 34 to the active region A and enclosed by the insulation pattern 15 and the device isolation layer 11.

The upper contact 34 may be formed by the over etch of the first etching process for forming the conductive line 40 and the lower contact 32 may be formed by the second etching process such that the lower contact 32 may be etched off at a greater etch rate than the nitride pattern 24 and the thermal oxide pattern 22.

Particularly, as the lower contact 32 may be positioned in a junction recess R, which will be described in detail hereinafter, through the insulation pattern 15, the second etching process need be performed to a bottom of the junction recess R. Thus, the nitride pattern 24 and the thermal oxide pattern 22 may have a sufficient etch rate and a sufficient thickness for minimizing damages to the underlying the insulation pattern 15 in the second etching process to the bottom of the junction recess R.

The contact 30 may comprise conductive materials such as polysilicon, so the electrical signals may be transferred between the conductive line 40 and the active region A via the contact 30. For example, the contact 30 may include a conductive plug interposed between the conductive line 40 and the active region A.

Some of the active regions A may be recessed from a top surface of the substrate 10 and the junction recess R may be provided around the recessed active region A in such a configuration that the junction recess R may be defined by the device isolation layer 11 and may be communicated with a contact hole H of the insulation pattern 15. Thus, the lower contact 32 may extend through the junction recess R and the contact hole H and the upper contact 34 may be interposed between the conductive line 40 and the lower contact 32. Since the top surface of the upper contact 34 may be the same level as the buffer pattern 20, the thickness or the height of the contact 30 may be varied according to the thickness or the height of the buffer pattern 20.

The reduction of the buffer pattern 20 and the contact 30 may reduce the aspect ratio of the first and the second etching processes for forming the bit line structure 90, thereby preventing the pattern collapse and the bridge defect between the neighboring patterns.

The conductive line 40 may be arranged on the buffer pattern 20 and may make contact with the contact 30 over the junction recess R. The conductive line 40 may have the same width as the buffer pattern 20.

For example, the conductive line 40 may include a barrier pattern 42 making contact with the buffer pattern 20 and the contact 30, a metal pattern 44 on the barrier pattern 42 and a capping pattern 46 on the metal pattern 44.

The barrier pattern 42 may include any one materials selected from titanium nitride (TiN), tantalum nitride (TaN) and tungsten nitride (WN) and the metal pattern 44 may include one of titanium (Ti), tantalum (Ta) and tungsten (W). The capping pattern 46 may include silicon nitride.

The conductive line 40, the buffer pattern 20 and the contact 30 may constitute the bit line structure 90 in a cell area of the substrate 10. In some example embodiments, the bit line structure 90 may be arranged at the same level as the peripheral gate structure as a gate bit line (GBL) and may be connected with a drain electrode of a buried channel array transistor (BCAT) that may be arranged under the surface of the substrate 10.

The conductive line 40, the buffer pattern 20 and the contact 30 may be consecutively formed into a single line pattern L by the first and the second etching processes as the bit line structure 90. The line pattern L may function as an individual bit line of the bit line structure 90. The buffer pattern 20 and the conductive line 40 may extend in the particular (or, alternatively, predetermined) direction and the contact 30 may extend downwards from the conductive line 40 to the active region A through the buffer pattern 20 and the insulation pattern 15 in the line pattern L.

Therefore, the height reduction of the buffer pattern 20 may cause the height reduction of the contact 30 and the aspect ratio of the line pattern L may be reduced in proportional to the height reduction of the buffer pattern 20. That is, the pattern collapse and the bridge defects between the neighboring line patterns L may be minimized by the height reduction of the buffer pattern 20.

Particularly, since the second etching process for forming the contact 30 may be conducted up to the bottom of the junction recess R, the aspect ratio of the line pattern L may rapidly increase in the second etching process when the gap distance between the neighboring line patterns may decrease in accordance with the downsize and high integration degree of the semiconductor devices.

However, since the thickness or the height of the buffer pattern 20 may be easily controlled just by the change of the conditions of the thermal oxidation process, the height of the buffer pattern 20 and the contact 30 may be properly reduced in proportional to the gap distance decrease between the neighboring line patterns L. Thus, the aspect ratio increase of the line pattern L may be sufficiently prevented or minimized although the gap distance between the neighboring line patterns L may decrease.

A spacer 50 may be arranged on a sidewall of the line pattern L, so the neighboring line patterns L may be electrically insulated from each other.

Particularly, the spacer 50 may enclose the sidewall of the lower contact 32 in the contact hole H and the junction recess R, so that the lower contact 32 may be electrically insulated from the neighboring active region A and another contact that may be connected with the neighboring active region A. Accordingly, the conductive line 40, the buffer pattern 20 and the contact 30 may be insulated from surroundings by the spacer 50, and the neighboring line patterns L may be sufficiently insulated from each other.

When the height of the buffer pattern 20 may be reduced, the height of the polysilicon pattern 26 may also be reduced and as a result, the area of the opposite faces may be reduced between the conductive polysilicon pattern 26 and the contact 30. Therefore, the parasitic capacitance between the neighboring line patterns L may be reduced due to the size reduction of the opposite faces, which significantly improve the sensing margin of the bit line structure 90.

According to the above-described bit line structure 90, the thermal oxide pattern 22 and/or the nitride pattern 24 of which the etch rate may be relatively small with respect to the conductive materials of the conductive line 40 and the contact 30 may be provided as the buffer pattern 20. Thus, the height of the buffer pattern 20 may be significantly reduced as compared with the conventional buffer pattern with which only the polysilicon pattern may be provided, thereby minimizing the aspect ratio increase of the line pattern when the gap distance between the neighboring line patterns may decrease. Accordingly, the pattern collapse and the bridge defect may be sufficiently prevented between bit lines in the etching process for forming the bit line structure 90.

In addition, the height of the polysilicon pattern 26 may also be reduced as height as the nitride pattern 24 and the thermal oxide pattern 22 and the area of the opposite face between the buffer pattern 20 and the contact 30 may significantly decrease between neighboring bit lines of the bit line structure 90. Accordingly, the parasitic capacitance between the neighboring bit lines may decrease and the sensing margin of the bit line structure 90 may be sufficiently improved due to the height control of the buffer pattern 20.

While some example embodiments disclose that the buffer pattern 20 may have a triple-layer structure in which the thermal oxide pattern 22, the nitride pattern 24 and the polysilicon pattern 26 may be stacked on the insulation pattern 15, the nitride pattern 24 and the polysilicon pattern 26 may be selectively provided with the buffer pattern 20.

Figure 2B:
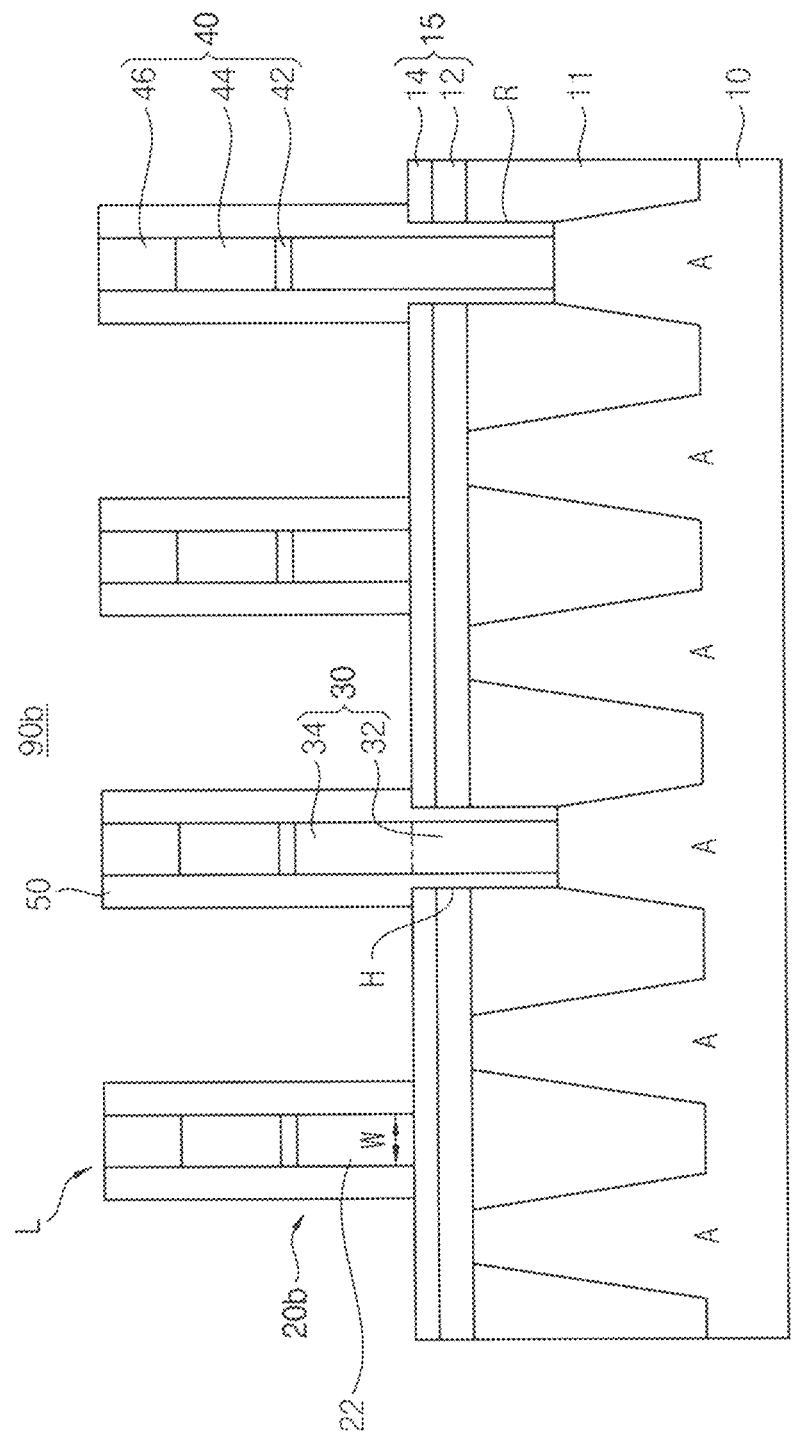
FIG. 2B is a cross-sectional view illustrating a second modification of the bit line structure shown in FIG. 1.

FIG. 2A is a cross-sectional view illustrating a first modification of the bit line structure shown in FIG. 1 and FIG. 2B is a cross-sectional view illustrating a second modification of the bit line structure shown in FIG. 1. In FIGS. 2A and 2B, the first and second modified bit line structures 90a and 90b have substantially the same configurations and structures as the bit line structure 90 shown in FIG. 1, except that the buffer pattern 20 of the bit line structure 90 may be replaced by a first modified buffer pattern 20a and by a second modified buffer pattern 20b, respectively. Thus, the same reference numerals in FIGS. 2A and 2B denote the same elements in FIG. 1 and any further detailed descriptions on the same elements will be omitted hereinafter.

Referring to FIGS. 2A and 2B, the first modified bit line structure 90a may include the first modified buffer pattern 20a in which the thermal oxide pattern 22 and the nitride pattern 24 may be stacked on the insulation pattern 15, and the second modified bit line structure 90b may include the second modified buffer pattern 20b in which only the thermal oxide pattern 22 may be arranged on the insulation pattern 15.

Thus, the first and the second buffer patterns 20a and 20b may include no polysilicon pattern and the conductive line 40 may be arranged on the nitride pattern 24 or the thermal oxide pattern 22.

Therefore, the parasitic capacitance of the first and the second bit line structures 90a and 90b may be reduced much more than that of the bit line structure 90 and the sensing margin of the first and the second bit line structures 90a and 90b may be more sufficiently improved as compared with the bit line structure 90.

The thermal oxide pattern 22 and the nitride pattern 24 may have a sufficient thickness or height for absorbing the over etch of the first etching process for forming the conductive line 40 in the first modified bit line structure 90a. In the same way, the thermal oxide pattern 22 may have a sufficient thickness or height for absorbing the over etch of the first etching process for forming the conductive line 40 in the second modified bit line structure 90b.

Therefore, the thermal oxide pattern 22 in the first and the second buffer pattern 20a and 20b may have a thickness greater than the thermal oxide pattern 22 in the bit line structure 90.

The above bit line structures 90 and the modified bit line structures 90a and 90b may be applied to the memory devices having a buried channel array transistor (hereinafter, referred to as BCAT memory device) as a gate bit line (GBL). The GBL may be provided with the BCAT memory device so as to reduce the height difference between cell and peripheral areas of the substrate. However, the above bit line structures 90, 90a and 90b may also be applied to any other memory devices as long as the parasitic capacitance and the aspect ratio of the bit line needs to be reduced in the memory device.

Figure 3:
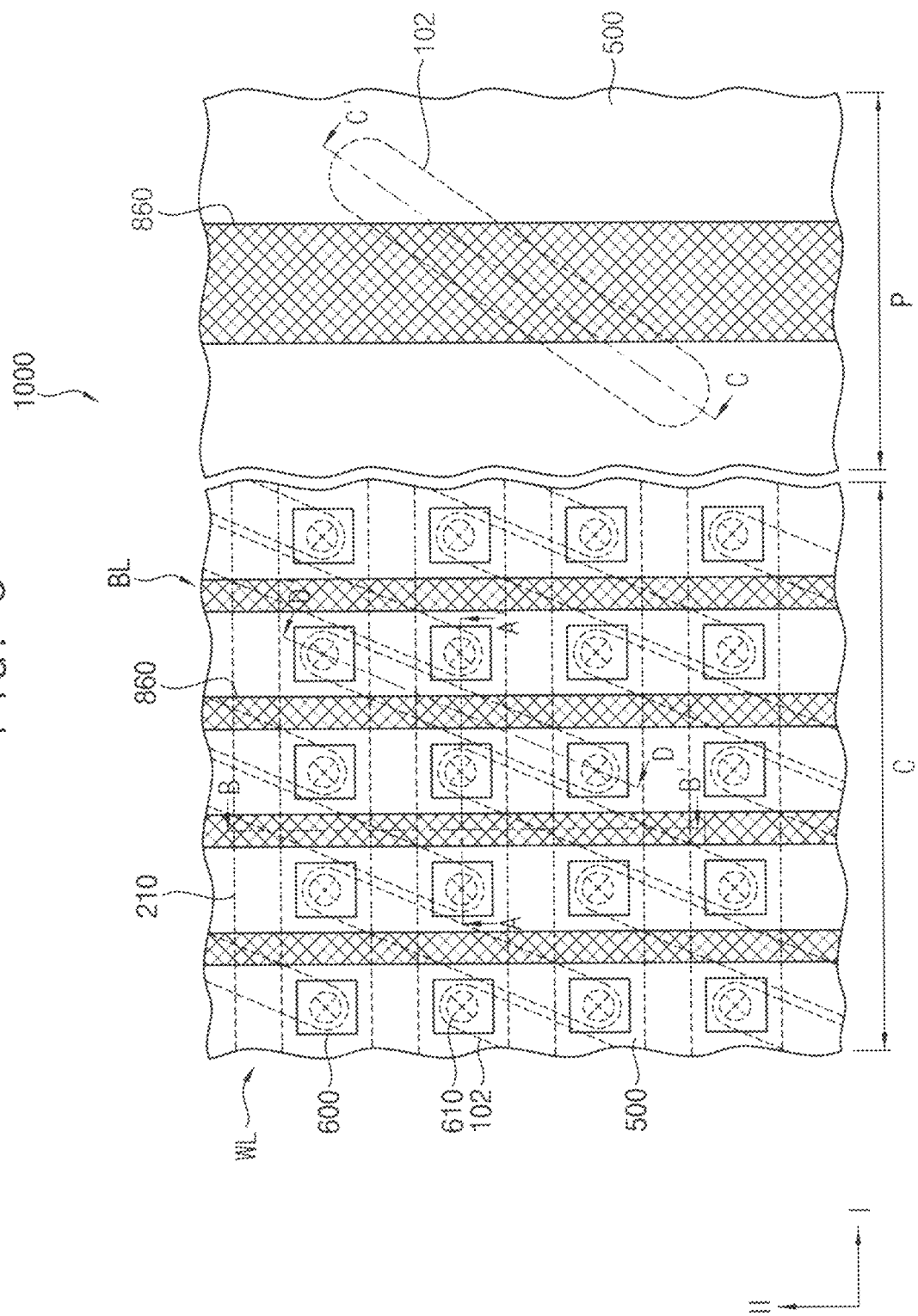
FIG. 3 is a plan view illustrating a memory device in accordance with some example embodiments of the present inventive concepts.

FIG. 3 is a plan view illustrating a memory device in accordance with some example embodiments of the present inventive concepts, and FIGS. 4A, 4B, 4C and 4D are cross sectional views cut along a line A-A', a line B-B', a line C-C' and a line D-D' of the memory device shown in FIG. 3, respectively.

Referring to FIGS. 3, 4A, 4B, 4C and 4D, a memory device 1000 in accordance with some example embodiments of the present inventive concepts may include a substrate 100 having a plurality of active regions 102 defined by a device isolation layer 110, a plurality of buried channel array transistors 200 each of which includes a buried cell gate CG on the active region 102 under a surface of the substrate 100 and a junction portion 220 on the active region 102 adjacent to and higher than (e.g., at least partially distal to the substrate in relation to) the buried cell gate CG, an insulation pattern 300 on the substrate 100 such that the device isolation layer 110, the junction portion 220 and the plurality of the buried channel array transistors 200 are covered by the insulation pattern 300, the bit line structure 400 on the insulation pattern 300, an insulation interlayer pattern 500 covering the bit line structure 400 and a charge storage structure 600 on the insulation interlayer pattern 500. A plurality of the buried cell gates may be arranged into a gate line WL in a first direction I, and the bit line structure 400 may extend on the insulation pattern 300 in a second direction II substantially perpendicular to the first direction I.

The substrate 100 may include a semiconductor substrate such as a silicon wafer having a cell area C in which a plurality of the cell transistors for storing data may be arranged and a peripheral area P in which a plurality of peripheral transistors may be arranged for controlling and driving the memory devices. In some example embodiments, the gate structure of the cell transistor may be arranged under the surface of the substrate 100 in the cell area C and the gate structure of the peripheral transistor may be arranged on the substrate 100 in the peripheral area P, so that the cell transistor may be provided as a buried type (referred to as a buried channel array transistor (BCAT)) and the peripheral transistor may be provided as a planar type.

The substrate 100 may be divided into the active region 102 on which conductive structures such as a gate electrode may be arranged and a field region 104 defining the active region 102. The device isolation layer 110 may be positioned on the field region 104 and thus the neighboring active regions 102 may be electrically isolated from each other by the device isolation layer 110.

For example, the substrate 100 may include Group IV-based semiconductor materials such as silicon (Si), germanium (Ge) and silicon-germanium (SiGe) and Group III-V compounds-based semiconductor materials such as GaP, GaAs and GaSb. In some example embodiments, the substrate 100 may include a silicon substrate, a germanium substrate, a silicon germanium (SiGe) substrate, a silicon-on-insulator (SOI) substrate and a germanium-on-insulator (GOI) substrate. The device isolation layer 110 may include one of silicon oxide, silicon nitride and silicon oxynitride.

The active region 102 may be slanted at an angle with respect to the first direction I or the second direction II and a number of the slanted active regions 102 may be arranged at the same intervals in a matrix type along the first and the second directions I and II. The array of the slanted active regions may increase the cell density of the substrate 100 together with a sufficient gap distance between the neighboring active regions 102.

In some example embodiments, a word line WL may extend in the first direction I and a bit line BL may extend in the second direction II in the memory device 1000. Since the active region 102 may be slanted at an angle with respect to the first direction I or the second direction II, the word line WL may extend across a plurality of the active regions 102 along the first direction I and the bit line BL may extend across a plurality of the active region 102 in the second direction II in such a configuration that a pair of the word lines WL and a single bit line BL may cross a single active region 102. The bit line BL may be arranged across a central portion of the active region 102 and a pair of the word line WL may be arranged across portions of the active region 102 between the central portion and both end portions. That is, a pair of the word lines WL and a single bit line BL may be across a single active region 102 in the cell area C of the substrate 100. Thus, a pair of unit cells may be arranged on a single active region 102.

A cell gate CG may be buried on the active region 102 under the top surface of the substrate 100 and a junction portion 220 may be arranged on the active region 102 adjacent to and higher than the buried cell gate CG. The cell gate CG and the junction portion 220 may constitute the unit transistor of the memory device 1000. Since the cell gate CG of the unit transistor may be arranged under the top surface of the substrate 100, the unit transistor may be provided as the buried channel array transistor (BCAT) 200.

A gate trench (not shown) may be provided alternately across the active region 102 and the device isolation layer 110 in the cell area C of the substrate 100 along the first direction I and the cell gate CG may be buried by a cell gate capping pattern 216 in the trench. Thus, the cell gate CG and the cell gate capping pattern 216 may be provided as a buried gate structure 210 extending in the first direction I as a gate line of the memory device 1000. The cell gate CG on the active region 102 under the top surface of the substrate 100 may function as a gate electrode of the BCAT 200, so the gate line extending in the first direction I may function as a word line WL of the memory device 1000.

For example, the cell gate CG may include a cell gate insulation layer 212 on a bottom and side surfaces of the gate trench and a cell gate conductive layer 214 arranged on the cell gate insulation layer 212 in such a way that a lower portion of the gate trench may be filled with the cell gate conductive layer 214.

The cell gate conductive layer 214 may include one of a semiconductor material doped with dopants, a conductive metal nitride and a conductive metal. Examples of the conductive metal nitride may include titanium nitride (TiN), tantalum nitride (TaN), tungsten nitride (WN), etc. Examples of the conductive metal may include ruthenium (Ru), iridium (Ir), titanium (Ti), tantalum (Ta), tungsten (W), etc.

The cell gate insulation layer 212 may include at least any one material selected from an oxide, a nitride, an oxynitride and a high-k dielectric material. In some example embodiments, the high-k dielectric material may include an insulation material having a dielectric constant higher than the nitride. For example, the high-k dielectric material may include an insulative metal oxide such as hafnium oxide and aluminum oxide. Particularly, the cell gate insulation layer may be shaped into a capital 'U' on the bottom and side surfaces of the gate trench.

The cell gate capping pattern 216 may cover the buried cell gate CG in the gate trench and thus the cell gate CG may be isolated from surroundings by the cell gate capping pattern 216. Particularly, the cell gate capping pattern 216 may be arranged in the gate trench in such a configuration that a top surface of the cell gate capping pattern 216 may be coplanar or substantially coplanar with a top surface of the device isolation layer 110, so that the gate trench may be filled up by the cell gate CG and the cell gate capping pattern 216. The cell gate CG and the cell gate capping pattern 216 may be provided as the buried gate structure 210 extending in the first direction I in the gate trench. The cell gate capping pattern 216 may include an insulation material such as an oxide, a nitride and an oxynitride.

The active region 102 may be separated into parts by the buried gate structure 210 and impurities may be implanted onto the parts of the active region 102, thereby providing the junction portion 220 on the active region 102 adjacent to the buried gate structure 210. Since a pair of the gate lines may be arranged across a single active region 102, the junction portion 220 may be classified into a first junction 222 that may be positioned at a central portion of the active region 102 and a pair of second junctions 224 that may be positioned at both end portions of the active region 102.

Particularly, an upper portion of the first junction 222 may be recessed under a top surface of the cell gate capping pattern 216 while top surfaces of the second junctions 224 may have the same level as that of the cell gate capping pattern 216. Thus, the first junction 222 may be provided as a lower junction of which the top surface may be lower than ("proximate to substrate 100 in relation to") the cell gate capping pattern 216 or the device isolation layer 110, and the second junction 224 may be provided as ("may be") a higher junction of which the top surface may be higher than ("distal from substrate 100 in relation to") the lower junction and may be coplanar or substantially coplanar with a top surface of the device isolation layer 110, for example as shown in at least FIG. 4D.

The junction portion 220 may function as a source electrode and a drain electrode of the BCAT 200. The impurities of the junction portion 220 may include boron (B) or phosphorus (P). In some example embodiments, a bottom surface of the junction portion 220 may be lower than a top surface of the cell gate insulation layer 212.

In some example embodiments, the first junction 222 may function as a common drain electrode and the second junctions 224 may function as source electrodes in the memory device 1000. However, the first junction 222 may function as a common source electrode and the second junctions 224 may function as drain electrodes according to the characteristics and requirements of the memory device 1000.

Accordingly, the buried cell gate CG under the top surface of the substrate 100 and the junction portion 220 adjacent to and higher than the buried cell gate CG may constitute the BCAT 200 and a pair of the BCATs 200 may be arranged on a single active region 102. Since a plurality of the active regions 102 may be arranged on the substrate 100 in the cell region C of the substrate 100, a plurality of the BCATs may be arranged on the substrate 100 as the cell transistors of the memory device 1000.

A peripheral transistor 800 may be arranged on the peripheral area P of the substrate 100 and may include a peripheral gate PG and a peripheral gate capping pattern 860.

The peripheral gate PG may include a peripheral gate insulation layer 810, a peripheral hardening layer 820, a first peripheral gate conductive layer 830, a barrier layer 840 and a second peripheral gate conductive layer 850.

The peripheral gate insulation layer 810, the peripheral hardening layer 820 and the first peripheral gate conductive layer 830 may have substantially the same compositions of the buffer pattern 410, which will be described in detail hereinafter, and the barrier layer 840 and the second peripheral gate conductive layer 850 may have substantially the same compositions of the conductive line 430, which will also be described in detail hereinafter.

For example, the peripheral gate insulation layer 810 may include a thermal oxide and the peripheral hardening layer 820 may include a nitride. In addition, the first peripheral gate conductive layer 830 may include polysilicon. Further, the barrier layer 840 and the second peripheral gate conductive layer 850 may include a metal nitride and a conductive metal, respectively.

The compositions of the peripheral transistor 800 may be varied according to the composition change of the bit line structure 400.

Although not shown in figures, impurities may be implanted onto the active region 102 of the peripheral area P adjacent to the peripheral gate PG and source and drain electrodes S and D for the peripheral transistor 800 may be provided on the peripheral area P of the substrate. That is, the peripheral gate PG and the peripheral source and drain electrodes S and D may constitute the peripheral transistor 800 in the peripheral area P of the substrate 100. The peripheral transistor 800 may be covered by a peripheral insulation pattern 900, so the peripheral transistor 800 may be isolated from surroundings by the peripheral insulation pattern 900.

The insulation pattern 300 may be arranged on the top surface of the substrate 100 including the BCAT 200, so the junction portion 220, the device isolation layer 110 and the cell gate capping pattern 216 may be covered by the insulation pattern 300. The BCAT transistor 200 in the cell area C may be protected from surroundings by the insulation pattern 300. Particularly, the insulation pattern 300 may have a sufficient thickness for preventing etching damages to the BCAT 200 in a subsequent etching process for forming the bit line structure 400.

The insulation pattern 300 may have a single layer structure or a multilayer structure. In some example embodiments, the insulation pattern 300 may have a bi-layer structure having a base oxide pattern 310 on the substrate 100 and an etch stop pattern 320 on the base oxide pattern 310. The base oxide pattern 310 may include silicon oxide that may be deposited onto the surface of the substrate 100 and the etch stop pattern 320 may include silicon nitride.

Various etching processes may be performed after the formation of the insulation pattern 300. In such a case, the insulation pattern 300 may protect the substrate 100 and the BCAT 200 against the subsequent etching processes. Particularly, when the buffer pattern 410 may not be sufficiently resistive to the etching process for forming the conductive line 430 and the first contact 420, the insulation pattern 300 may function as a supplementary buffer pattern against the etching process. Thus, the substrate 100 and the BCAT 200 underlying the insulation pattern 300 may be sufficiently protected from the subsequent etching processes.

The bit line structure 400 may be arranged on the insulation pattern 300 in such a configuration that the bit line structure 400 may extend in the second direction II.

For example, the bit line structure 400 may include a line-shaped buffer pattern 410 extending on the insulation pattern 300 in the second direction II and having a thermal oxide pattern 412, a conductive line 430 arranged on the buffer pattern 410 and a first contact 420 extending from the conductive line 430 to the junction portion 220 through the buffer pattern 410 and the insulation pattern 300. In some example embodiments, the first junction 222 may be recessed into the lower junction and the first contact 420 may extend to the lower junction from the conductive line 430. A bit line spacer 440 may be arranged on side surfaces of the line-shaped buffer pattern 410, the conductive line 430 and the first contact 420, so the bit line structure 400 may be electrically insulated from neighboring bit line structure and a second contact 610.

The buffer pattern 410 may be shaped into a line having a width along the first direction I and extending in the second direction II. The conductive line 430 may be arranged on the buffer pattern 410 and may be shaped into a line having the same width as the buffer pattern 410 and extending in the second direction II. As shown in at least FIG. 4D, for example, the first contact 420 may be shaped into a cylinder (e.g., "may have a cylindrical shape") and may extend downwards to the lower junction 222 from the conductive line 430.

The conductive line 430, the buffer pattern 410 and the first contact 420 may be sequentially formed through consecutive etching processes and the buffer pattern 410 may absorb the over etch of the first etching process for forming the conductive line 430 and may be sufficiently resistive to the second etching process for forming the first contact 420.

Therefore, the substrate 100 and the BCAT 200 may be sufficiently protected from the first and the second etching processes for forming the conductive line 430 and the first contact 420.

The bit line structure 400 may have substantially the same structures as the bit line structure 90 as described in detail with reference to FIG. 1.

Thus, the buffer pattern 410 may include a thermal oxide pattern 412, a hardening pattern 414 and a buffer conductive pattern 416. The thermal oxide pattern 412 may be formed simultaneously with the peripheral gate insulation layer 810 by a thermal oxidation process. For example, as described above with reference to thermal oxide pattern 22, the thermal oxide pattern 412 may include silicon oxide that is provided from a polysilicon pattern based on a thermal oxidation process.

While the peripheral gate insulation layer 810 may be formed from single crystalline silicon because the substrate 100 may include single crystalline silicon, the thermal oxide pattern 412 may be formed from polysilicon by the thermal oxidation process. Thus, the thermal oxide pattern 412 may have a thickness greater than the peripheral gate insulation layer 810.

For example, the peripheral gate insulation layer 810 may have the thickness of about 50 Å to about 70 Å and the thermal oxide pattern 412 may have the thickness of about 50 Å to about 100 Å.

Figure 4A:
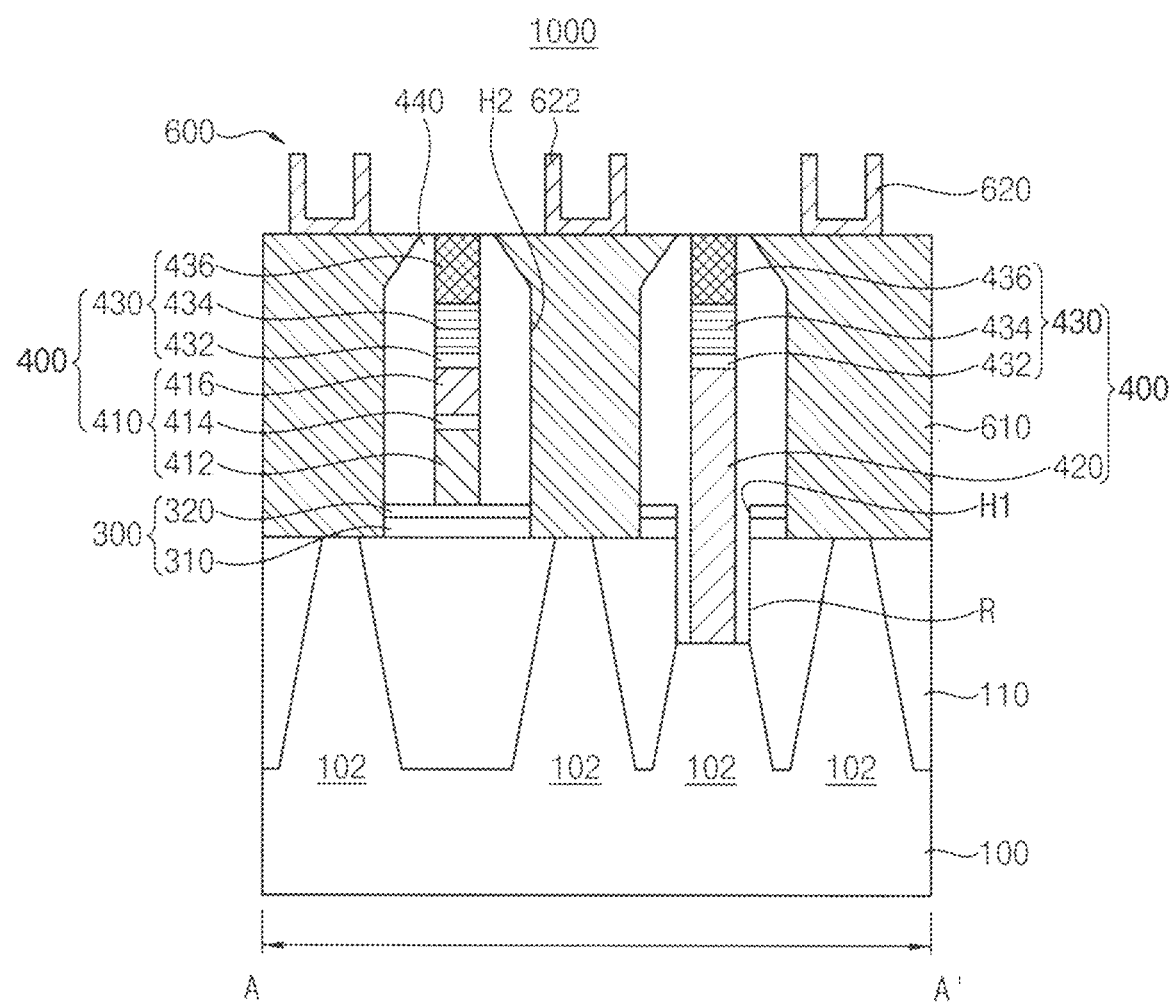
FIGS. 4A, 4B, 4C and 4D are cross sectional views cut along a line A-A', a line B-B', a line C-C' and a line D-D' of the memory device shown in FIG. 3, respectively.
Figure 4B:
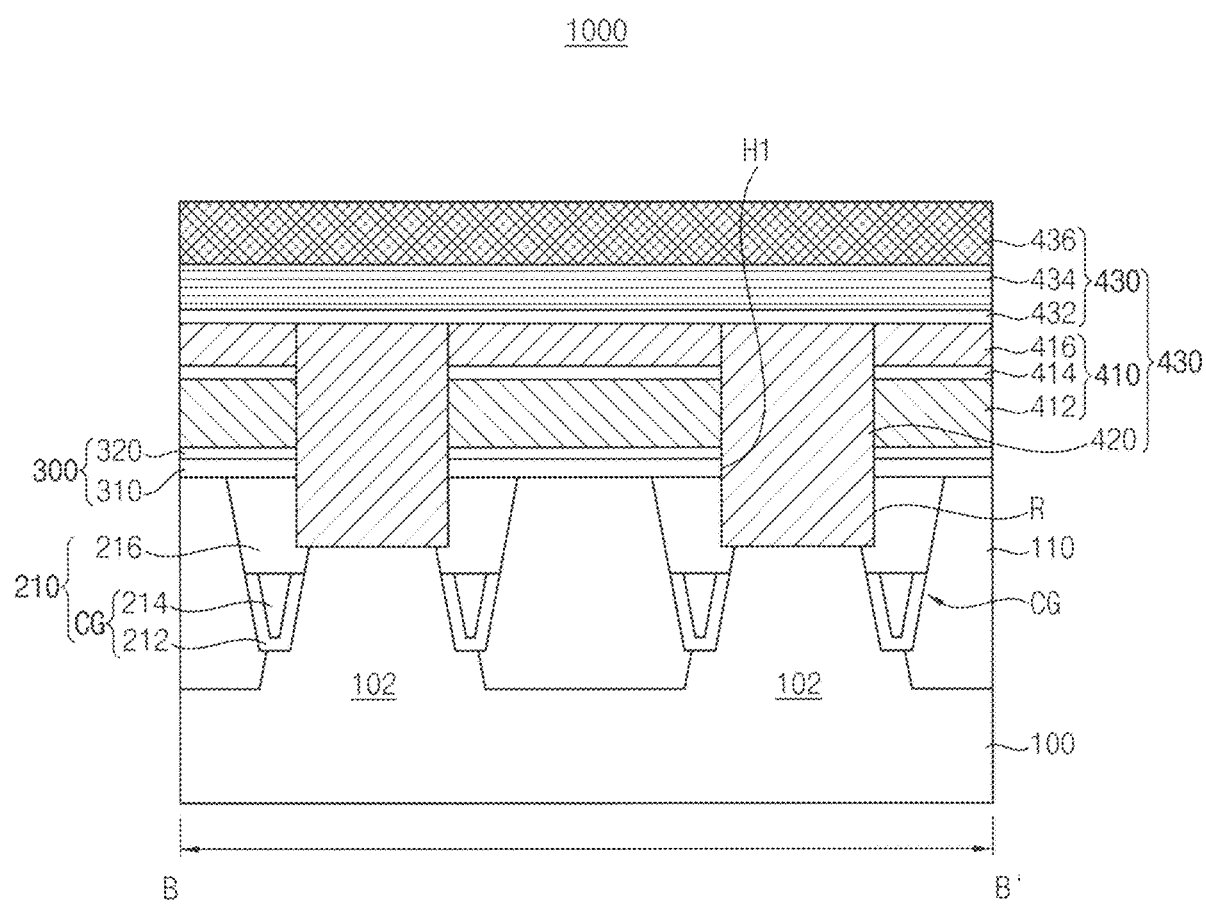
Figure 4C:
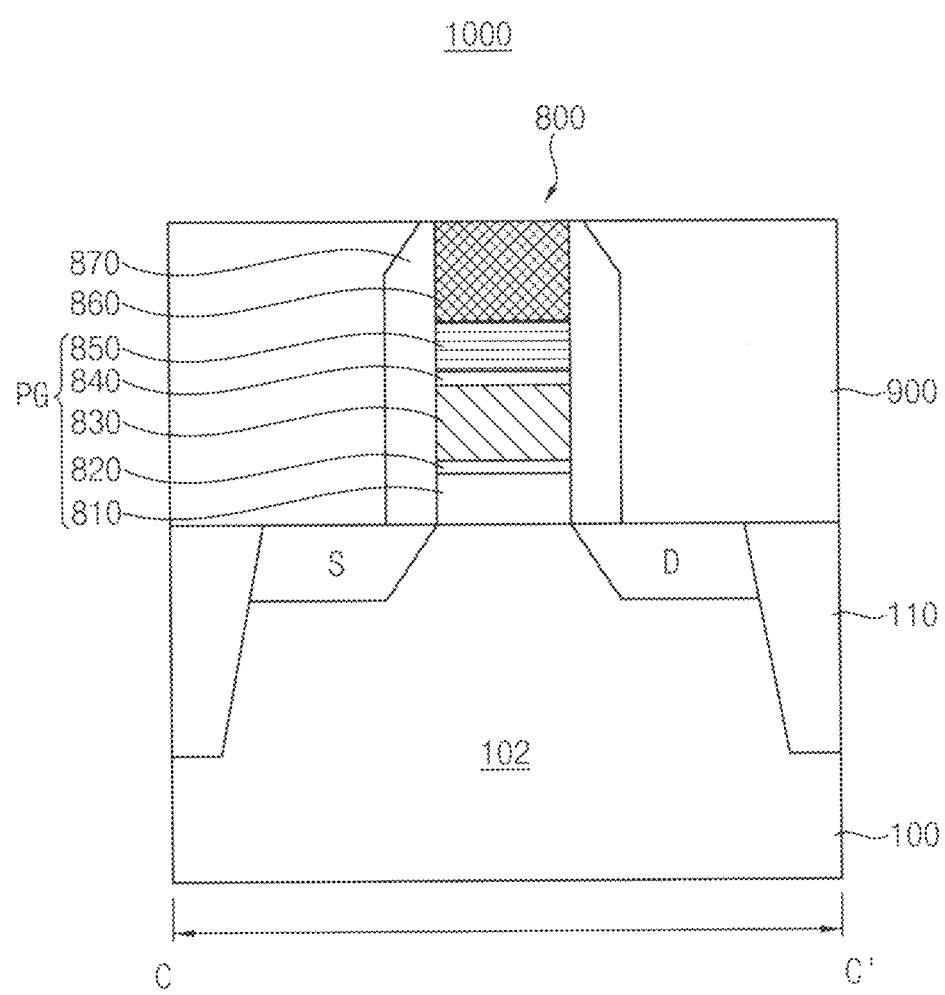
Figure 4D:
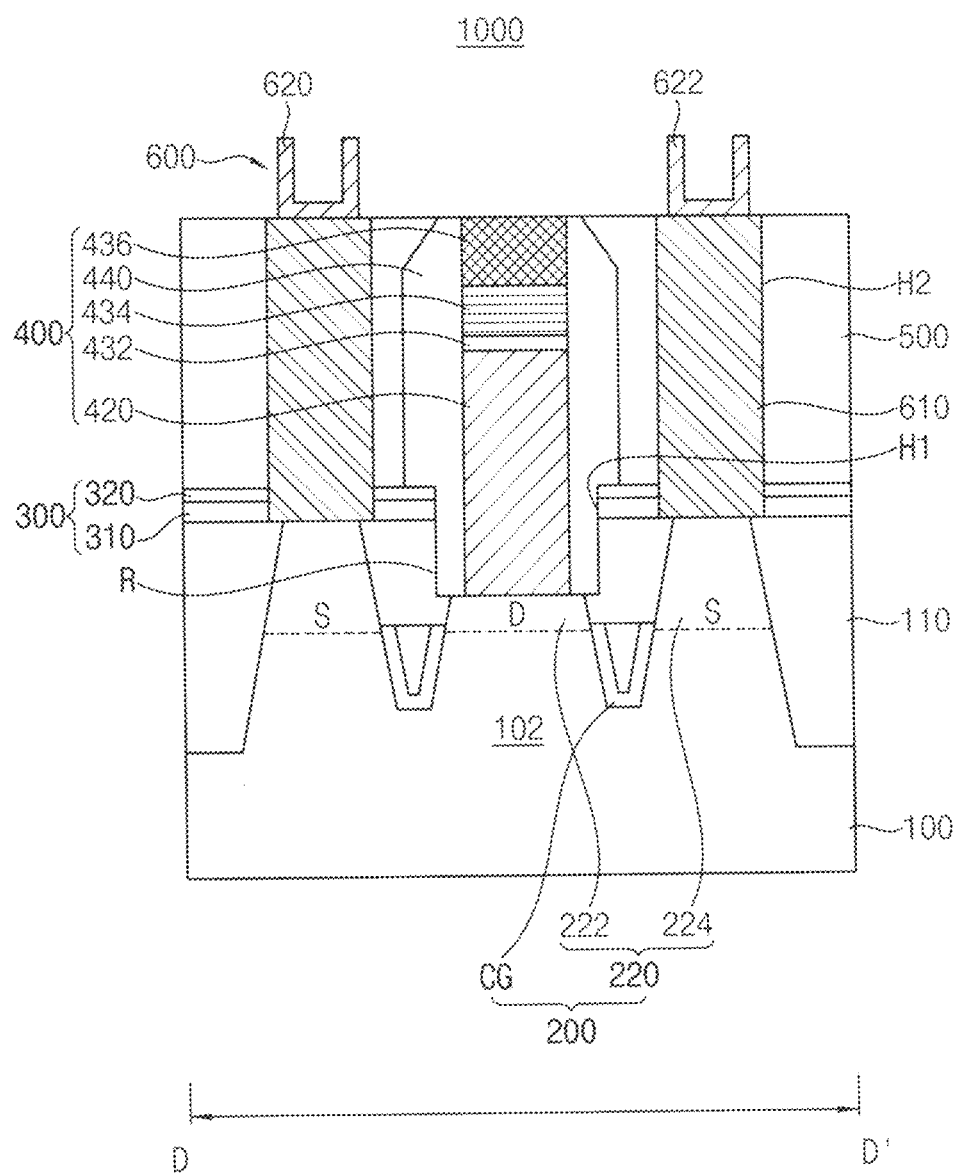
Figure 5A:
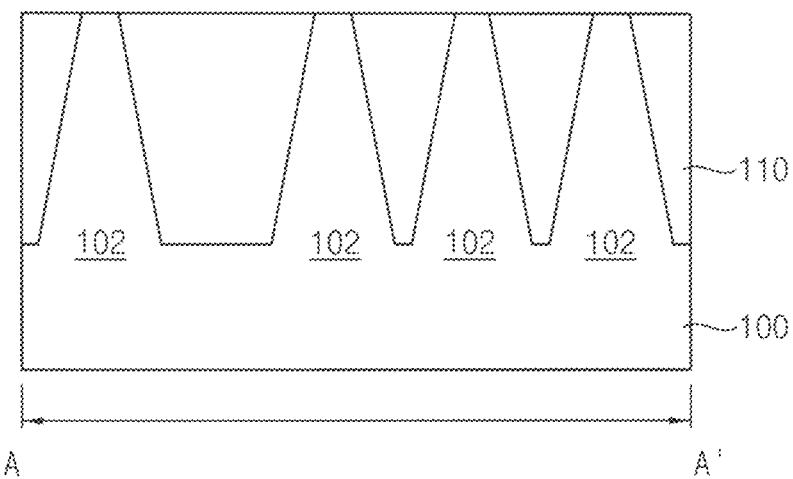
FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, and 20D are cross-sectional views illustrating process steps for a method of manufacturing the memory device shown in FIGS. 3 and 4A to 4D.
Figure 5B:
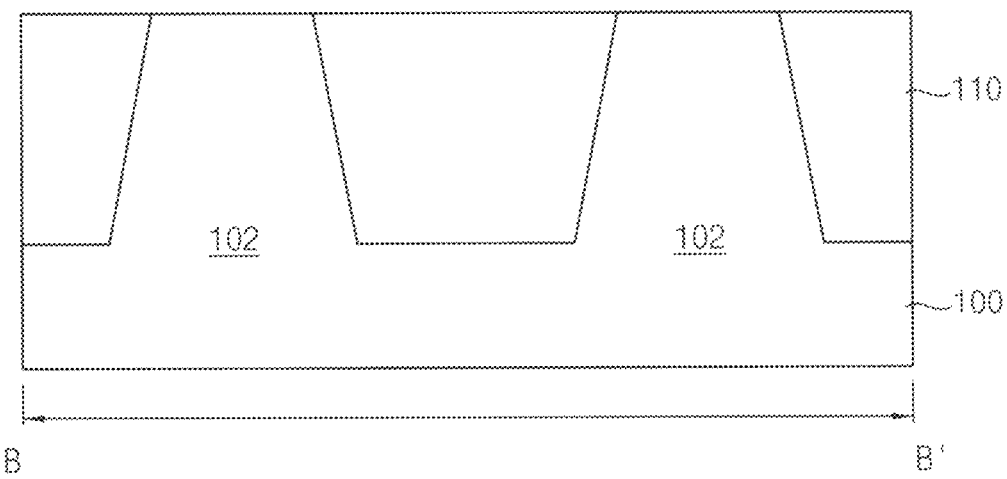
Figure 5C:
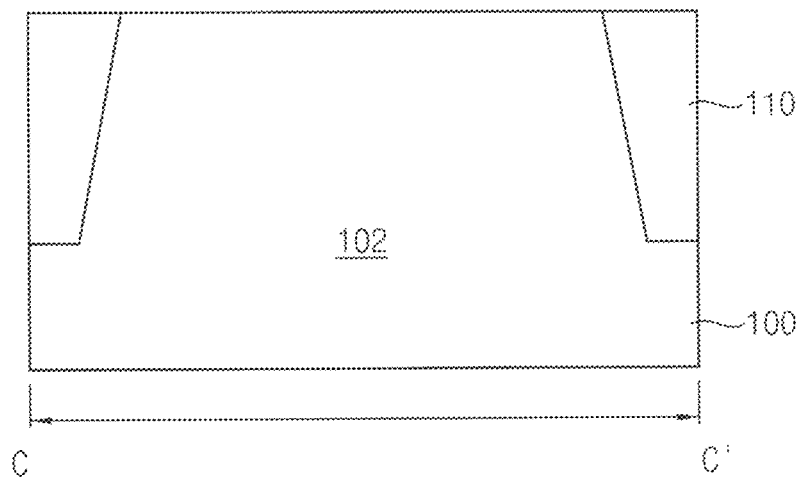
Figure 5D:
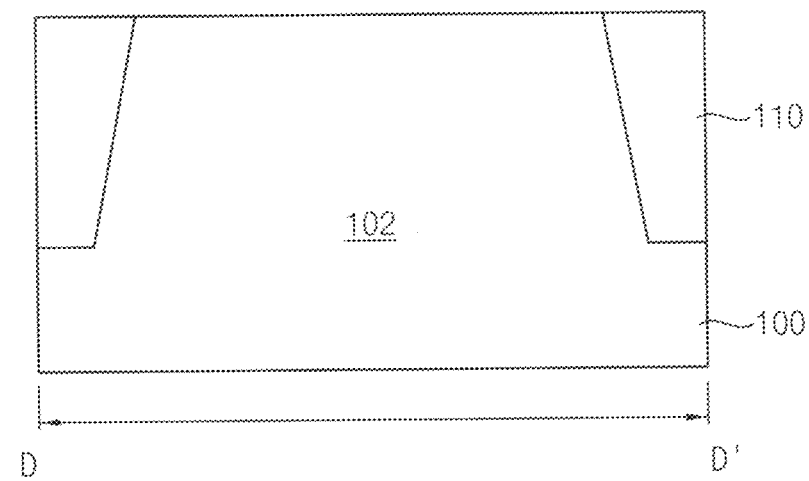
Figure 6A:
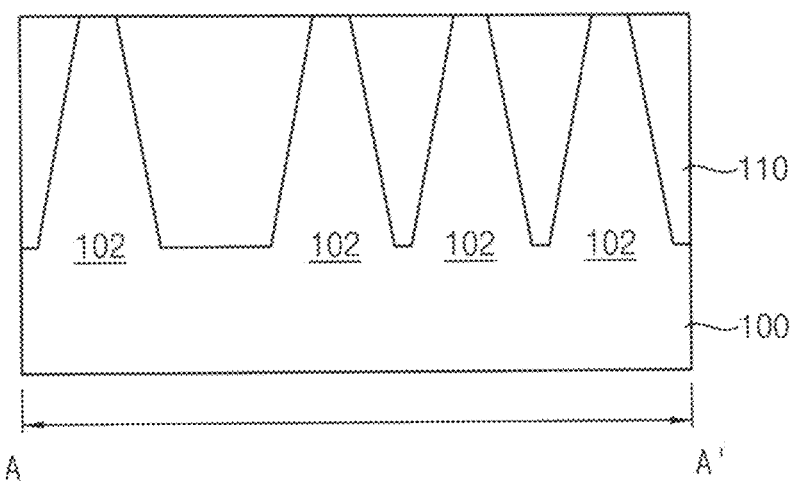
Figure 6B:
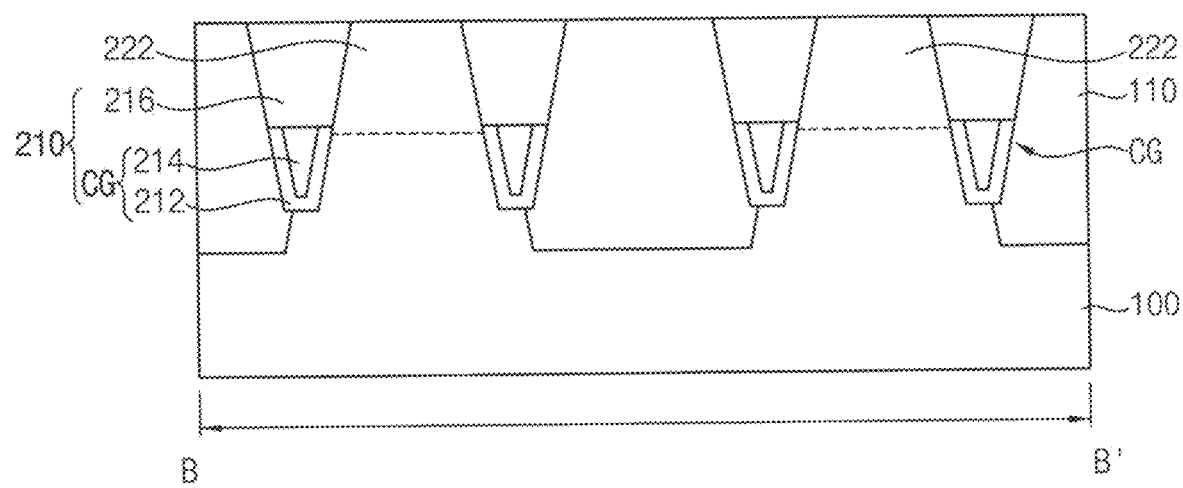
Figure 6C:
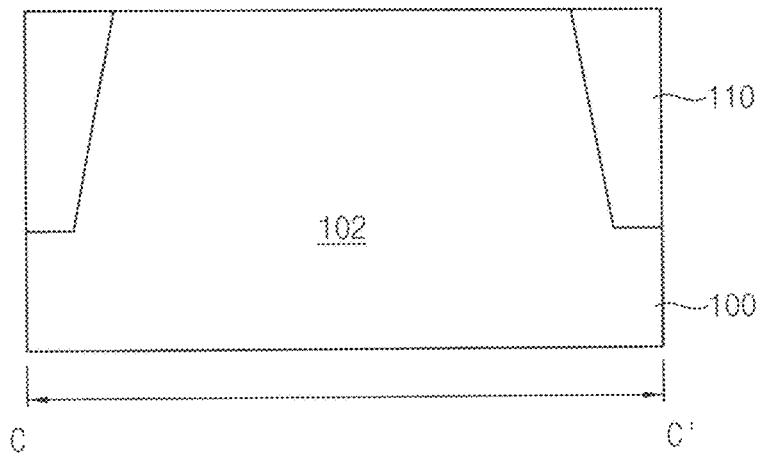
Figure 6D:
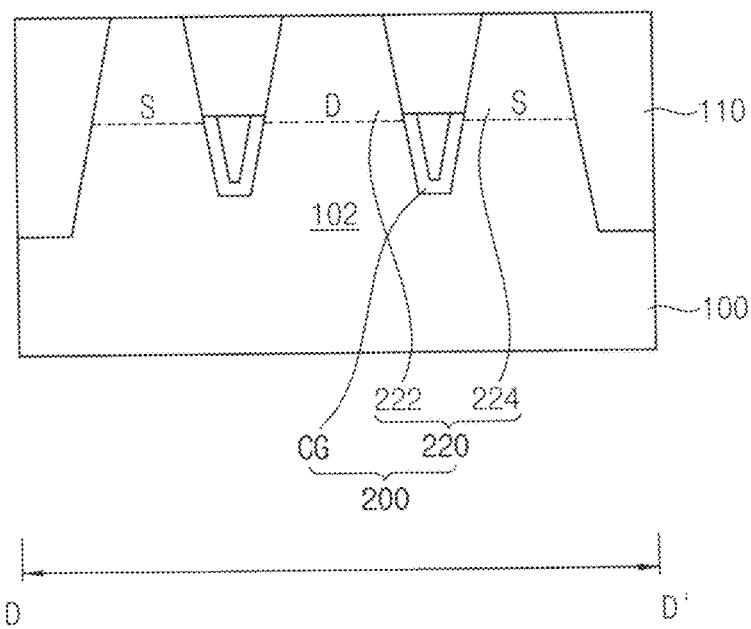
Figure 7A:
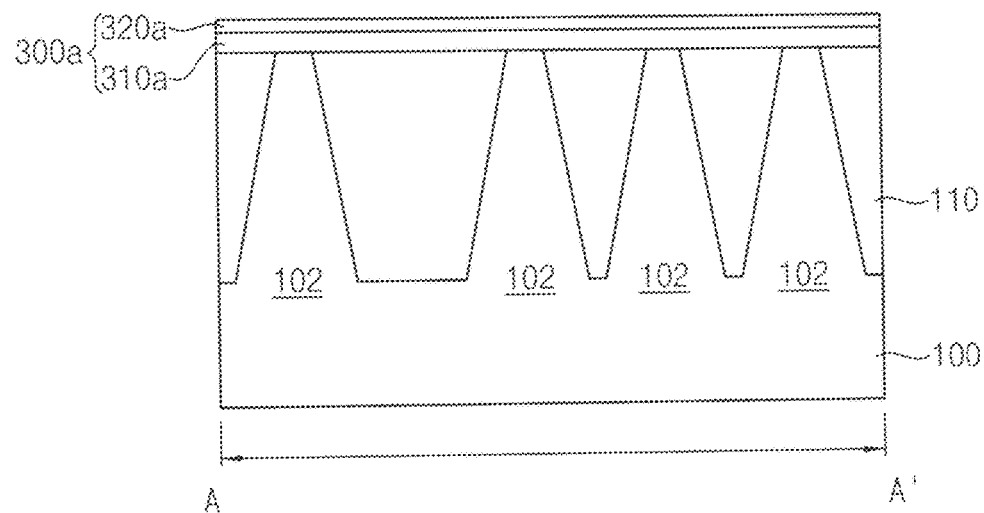
Figure 7B:
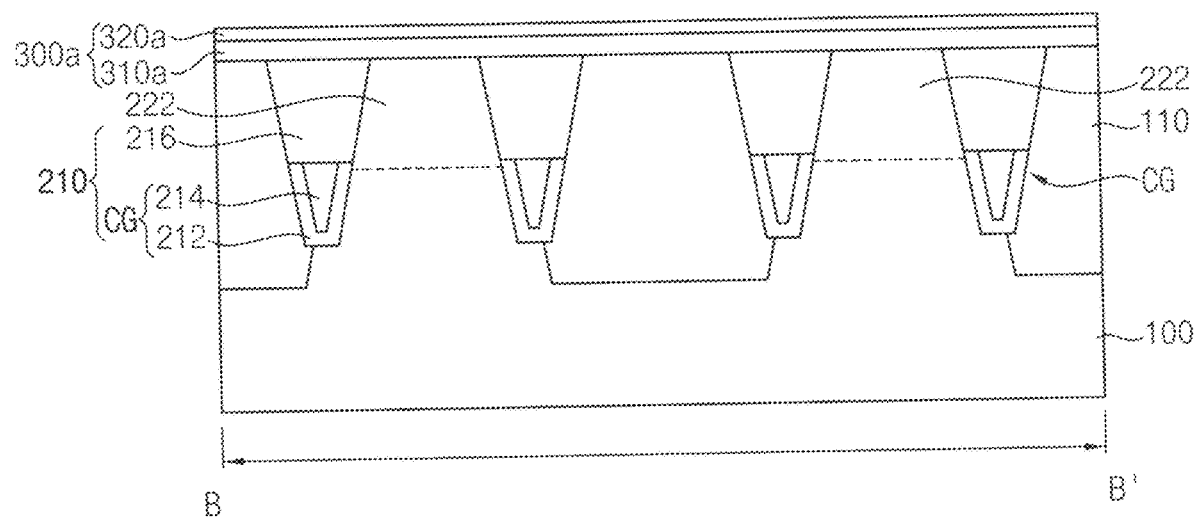
Figure 7C:
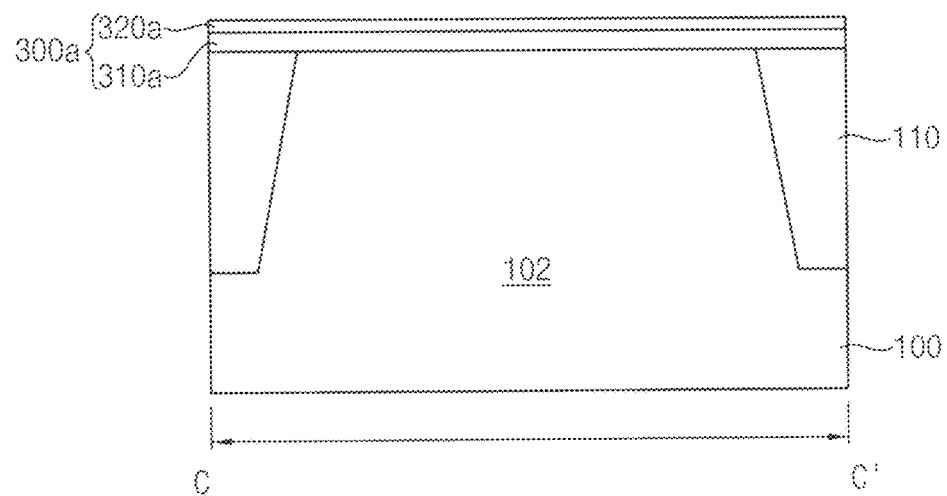
Figure 7D:
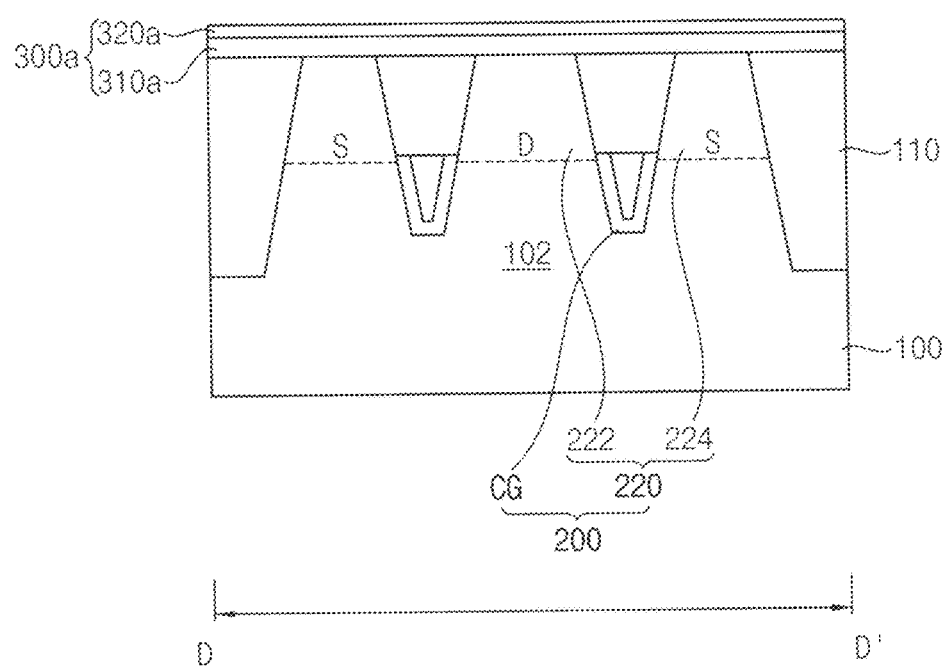
Figure 8A:
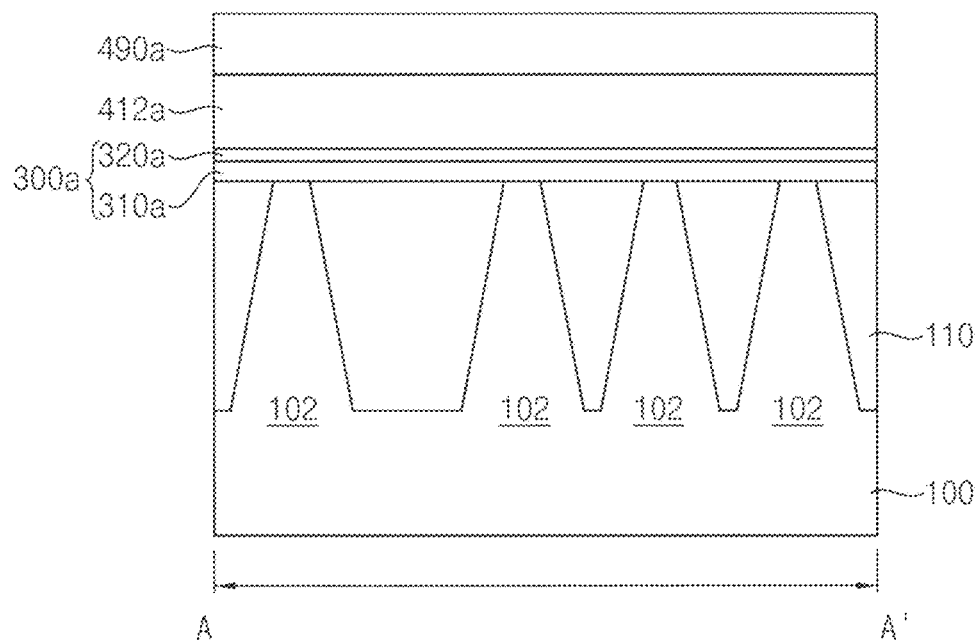
Figure 8B:
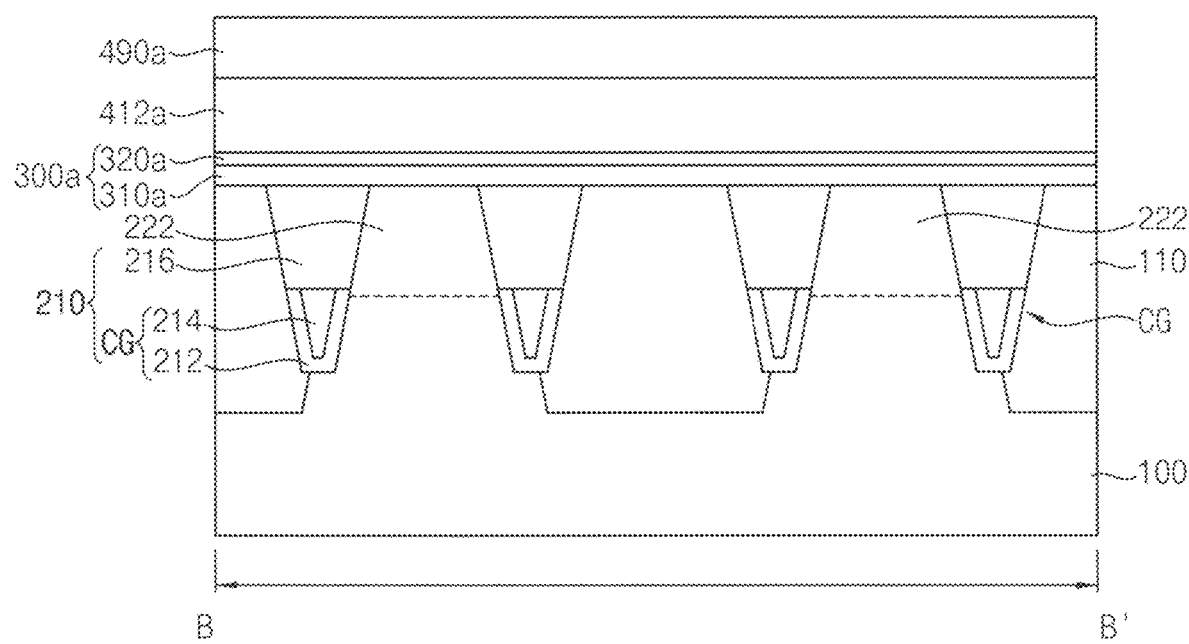
Figure 8C:
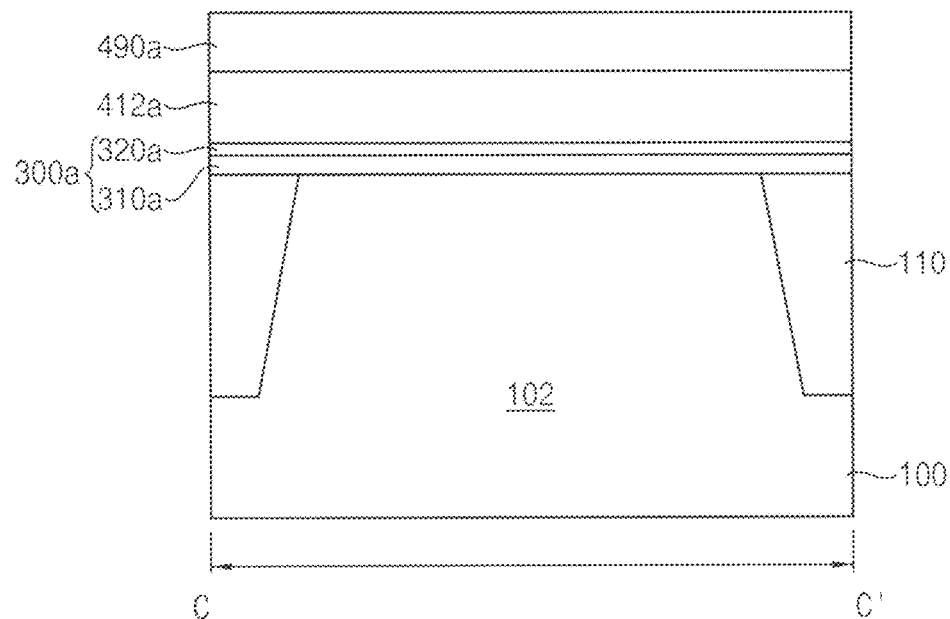
Figure 8D:
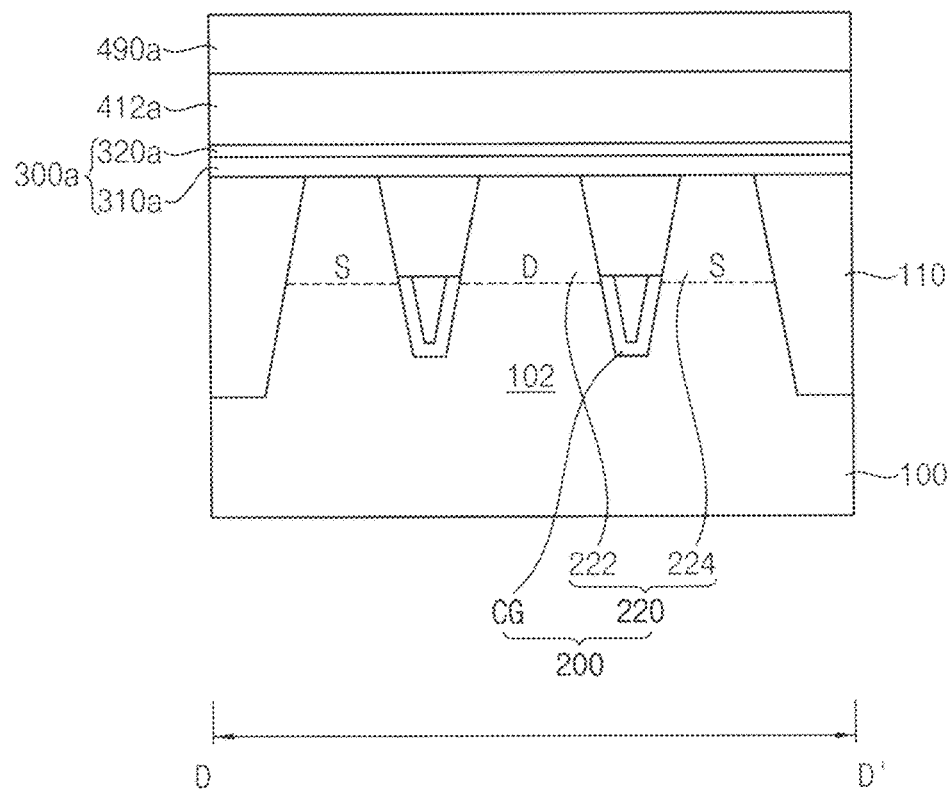
Figure 9A:
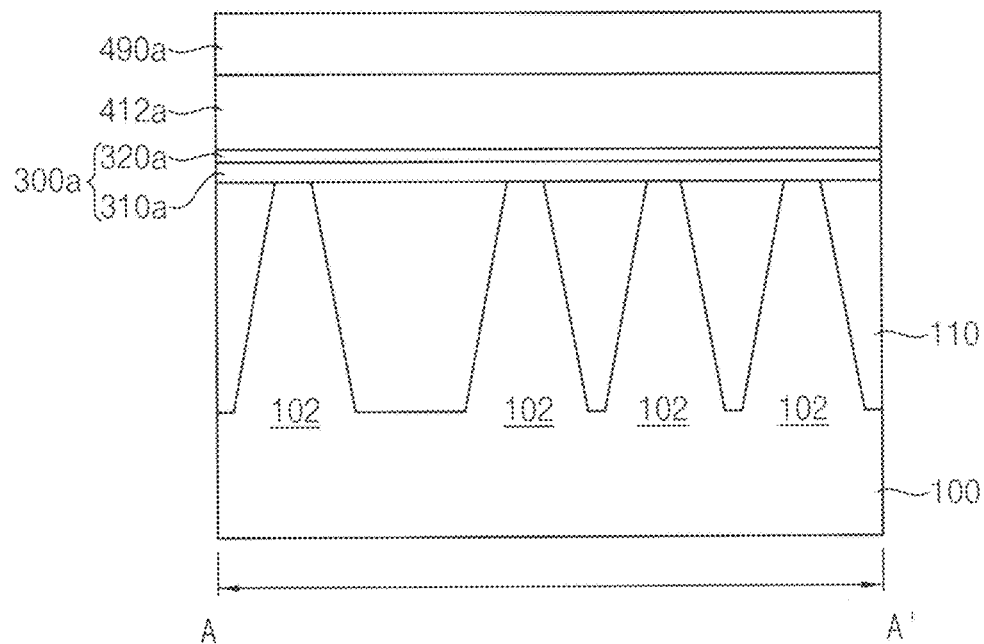
Figure 9B:
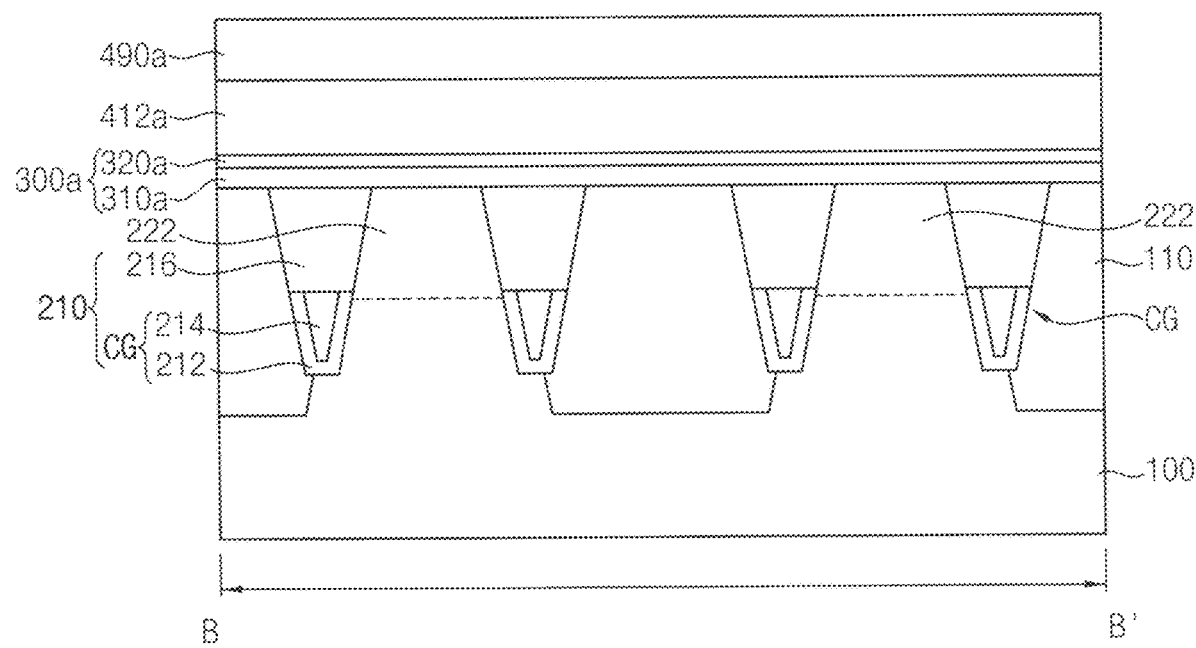
Figure 9C:
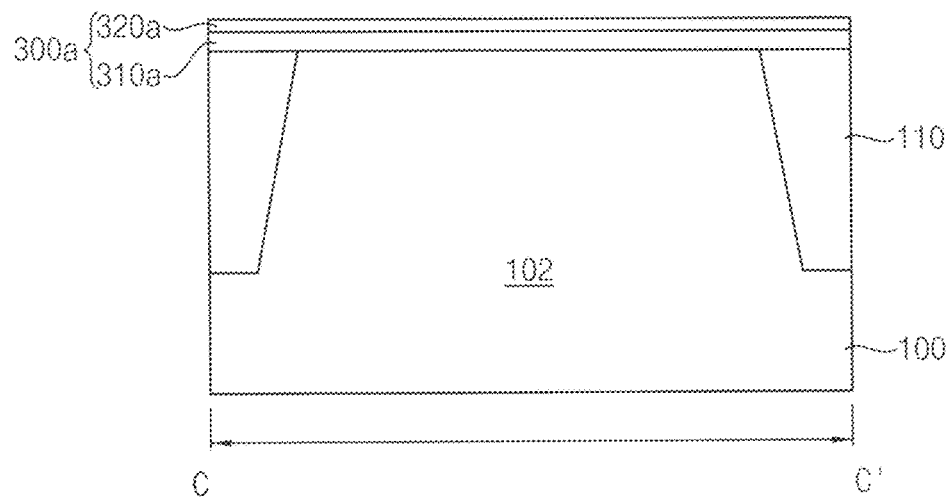
Figure 9D:
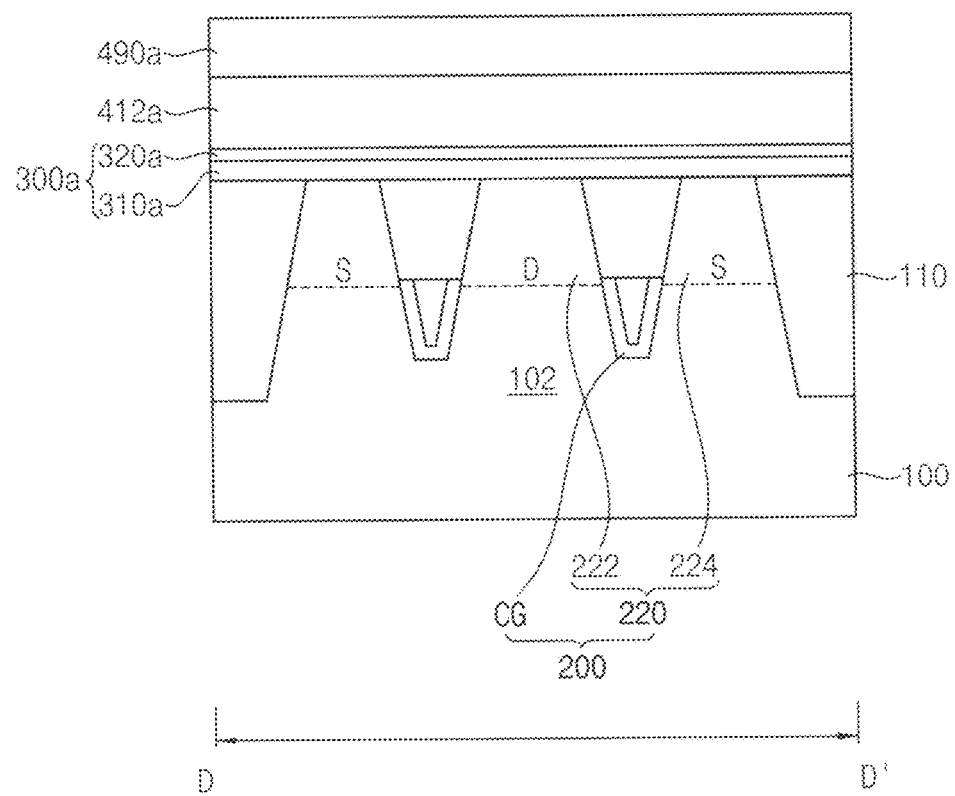
Figure 10A:
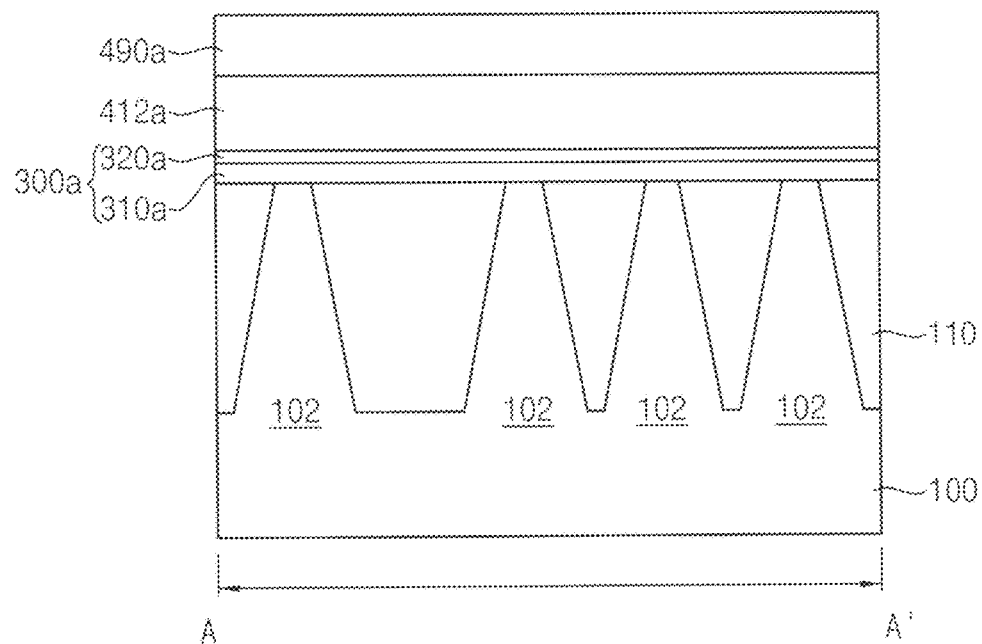
Figure 10B:
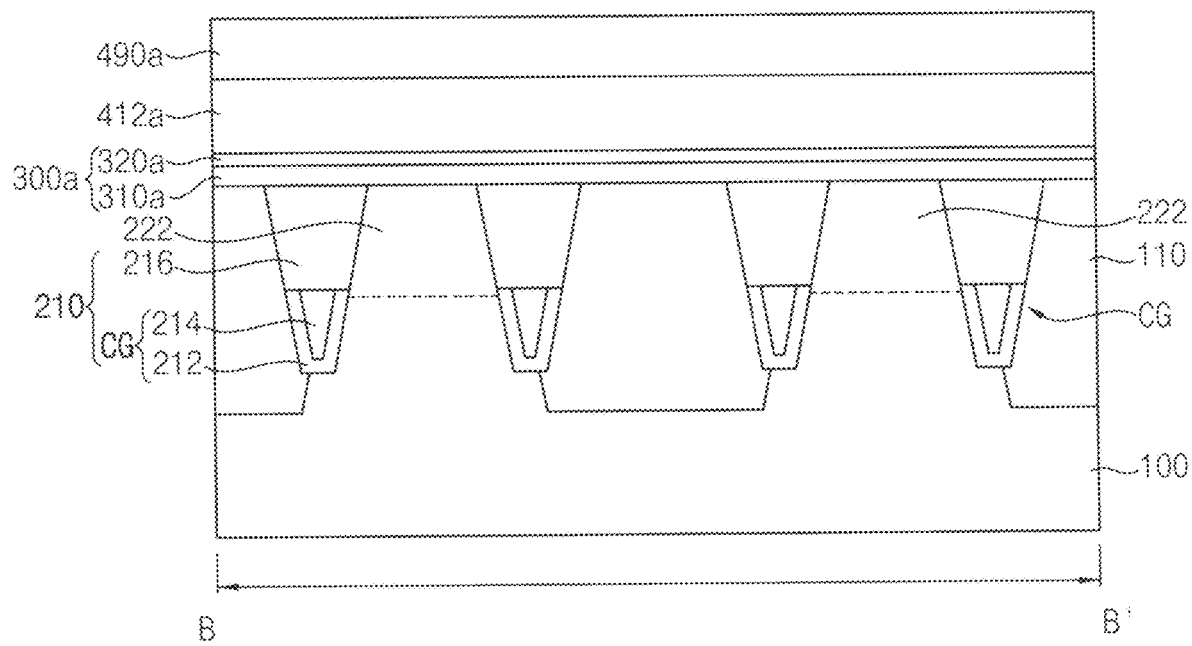
Figure 10C:
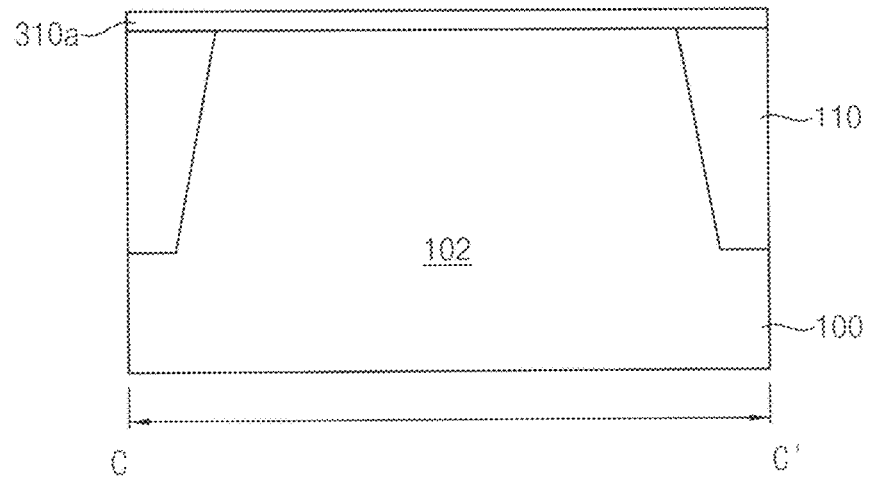
Figure 10D:
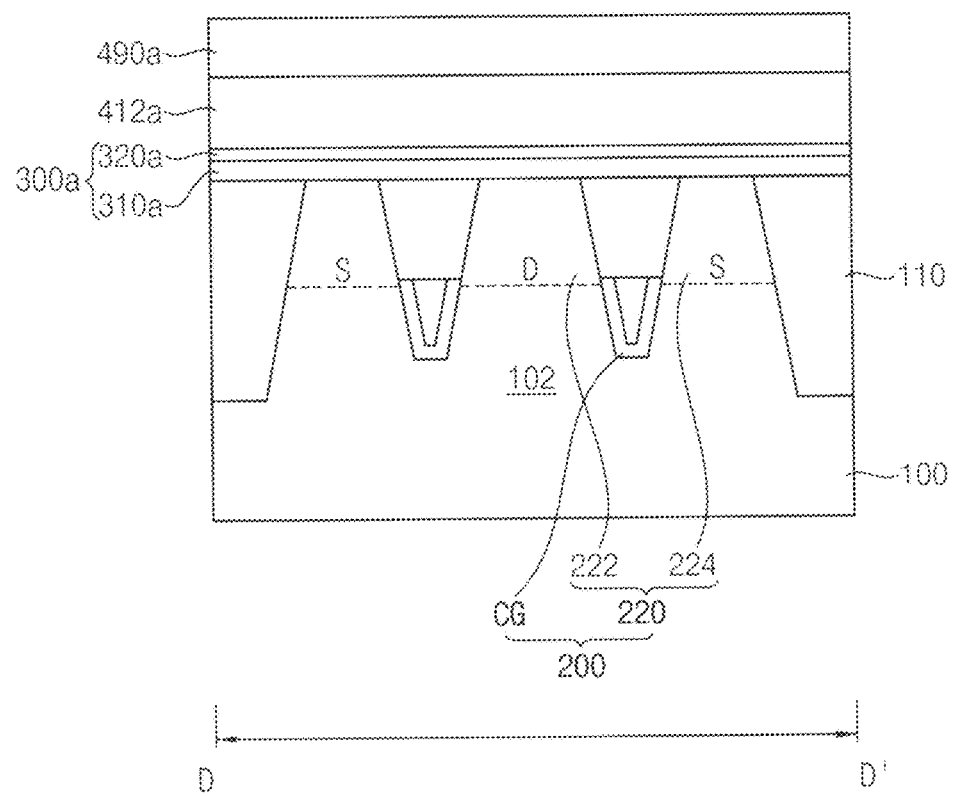
Figure 11A:
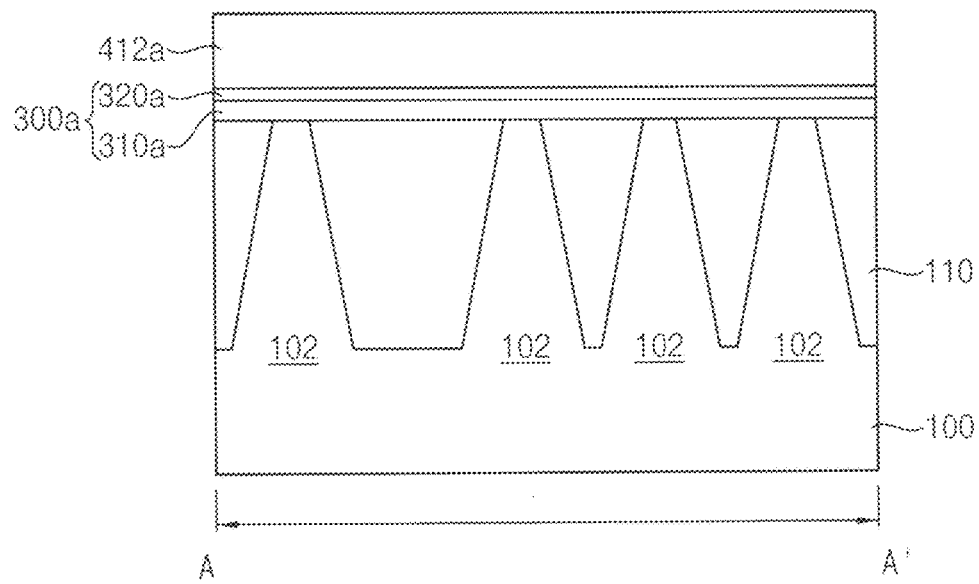
Figure 11B:
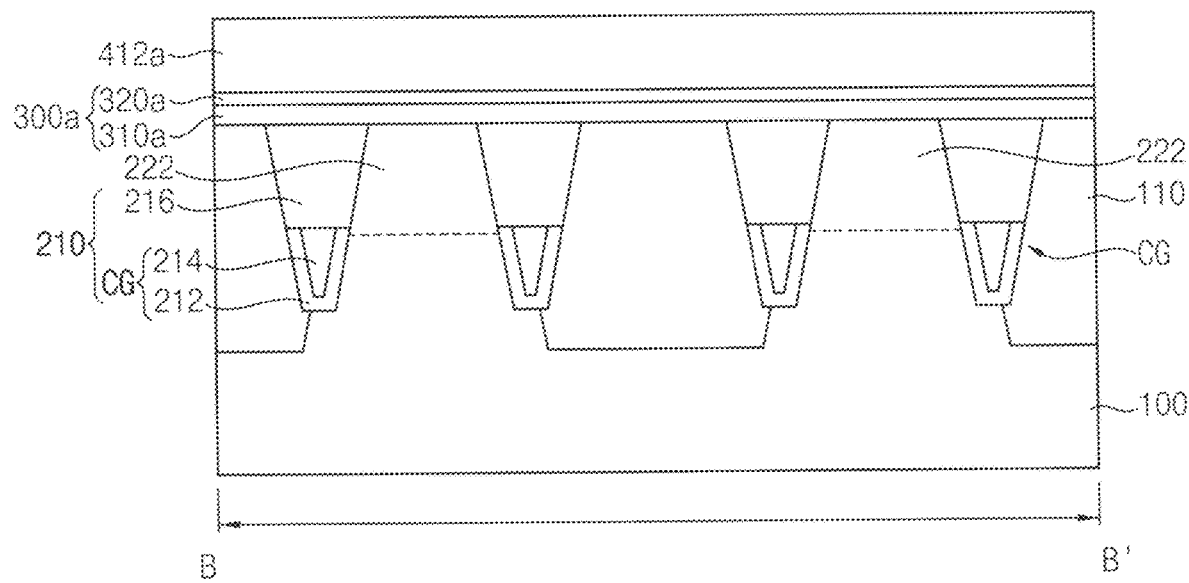
Figure 11C:
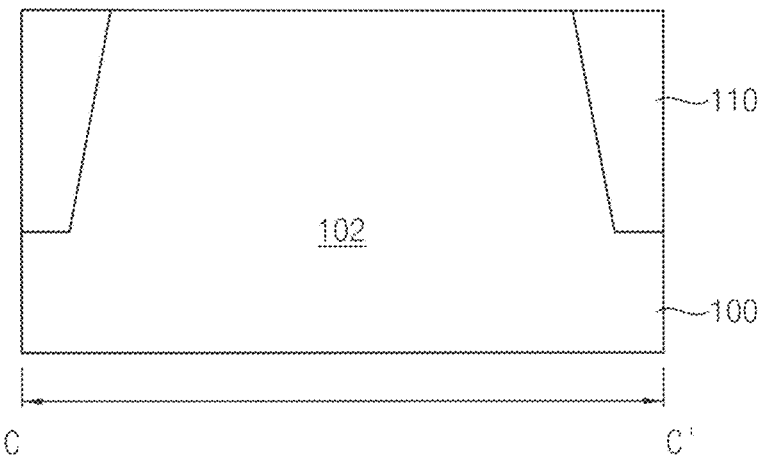
Figure 11D:
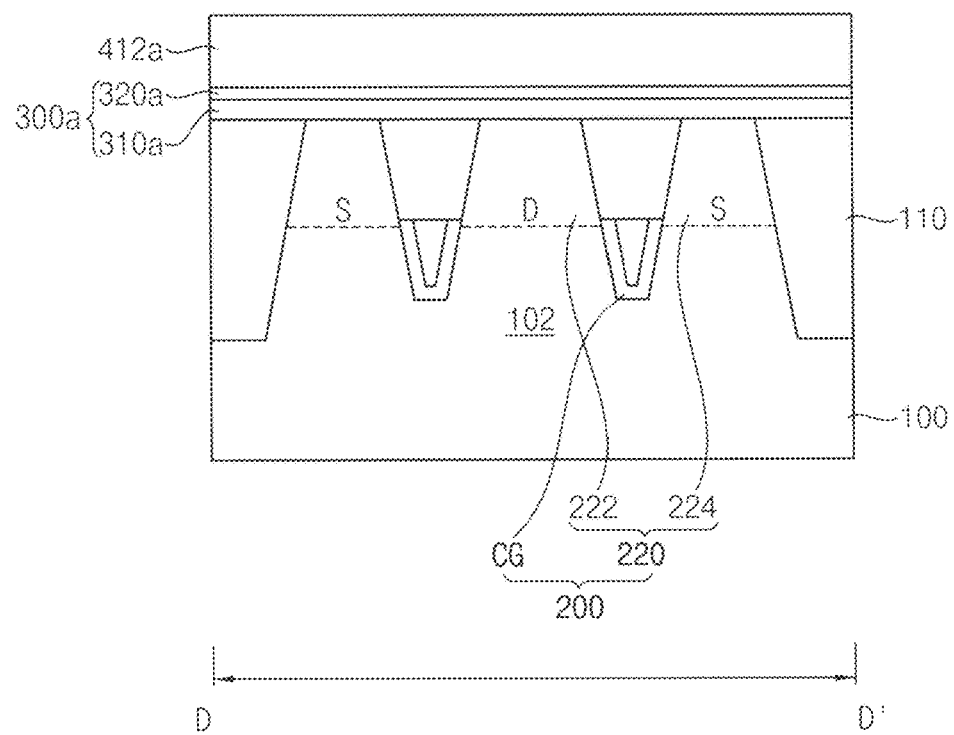
Figure 12A:
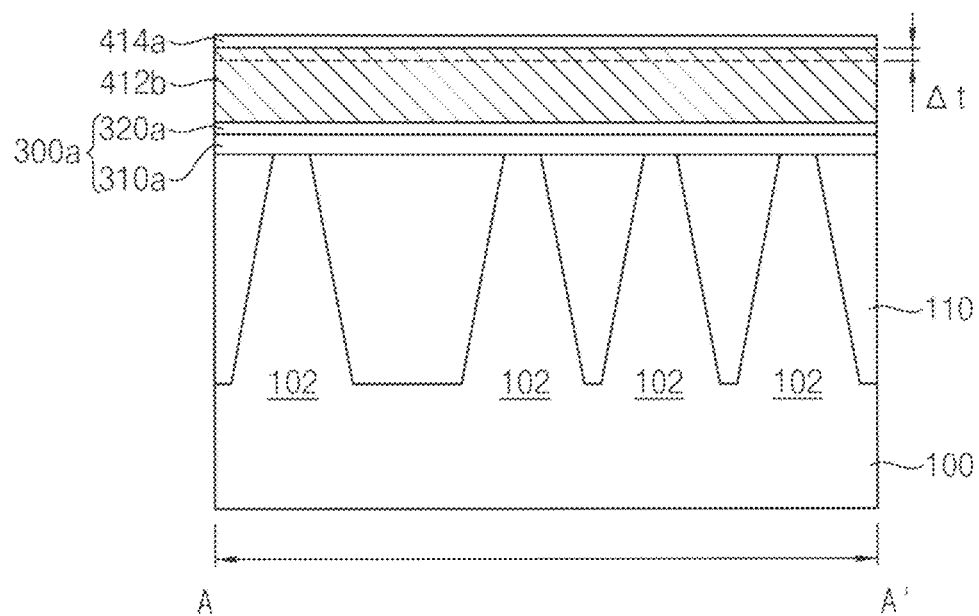
Figure 12B:
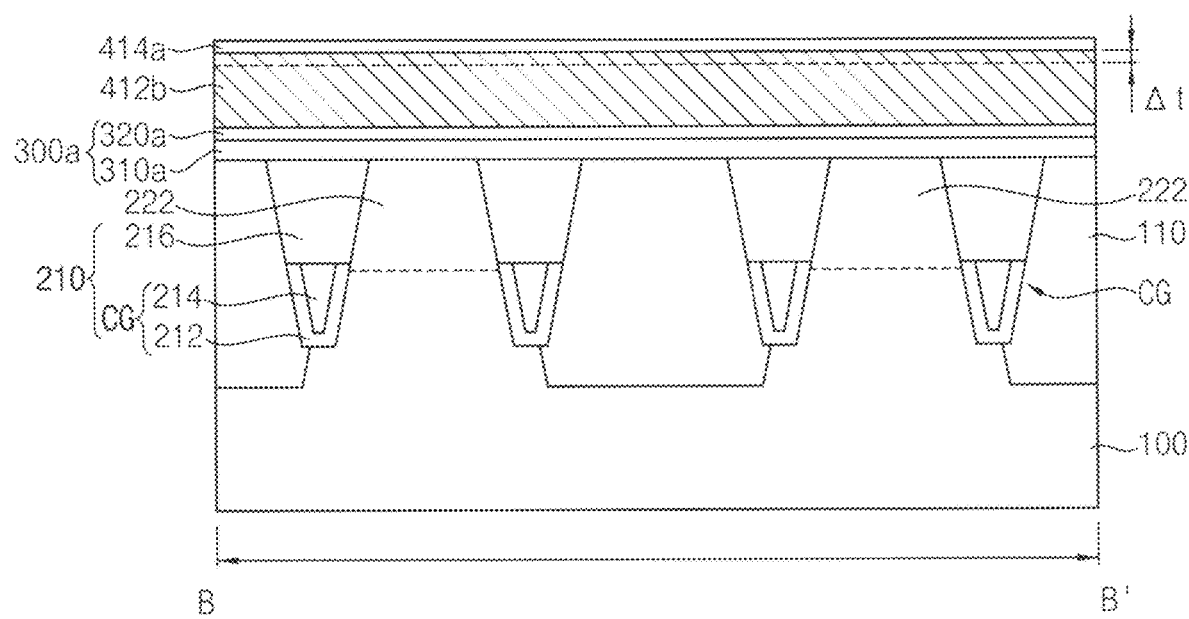
Figure 12C:
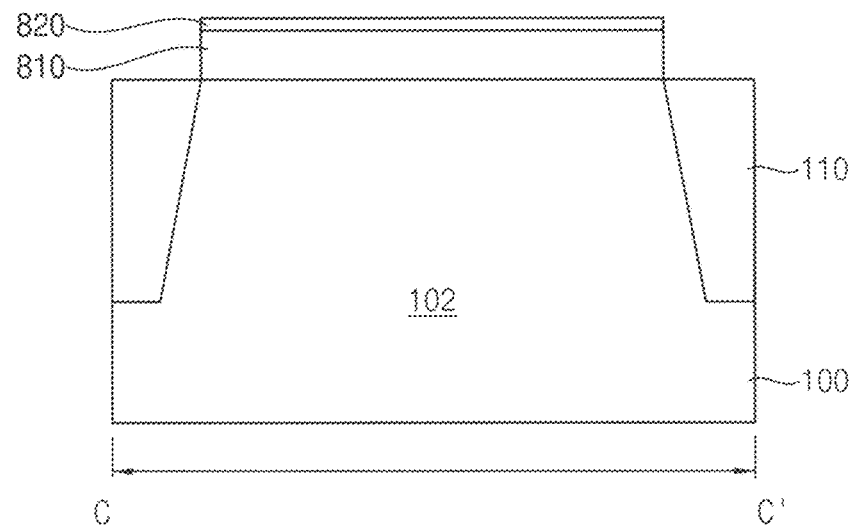
Figure 12D:
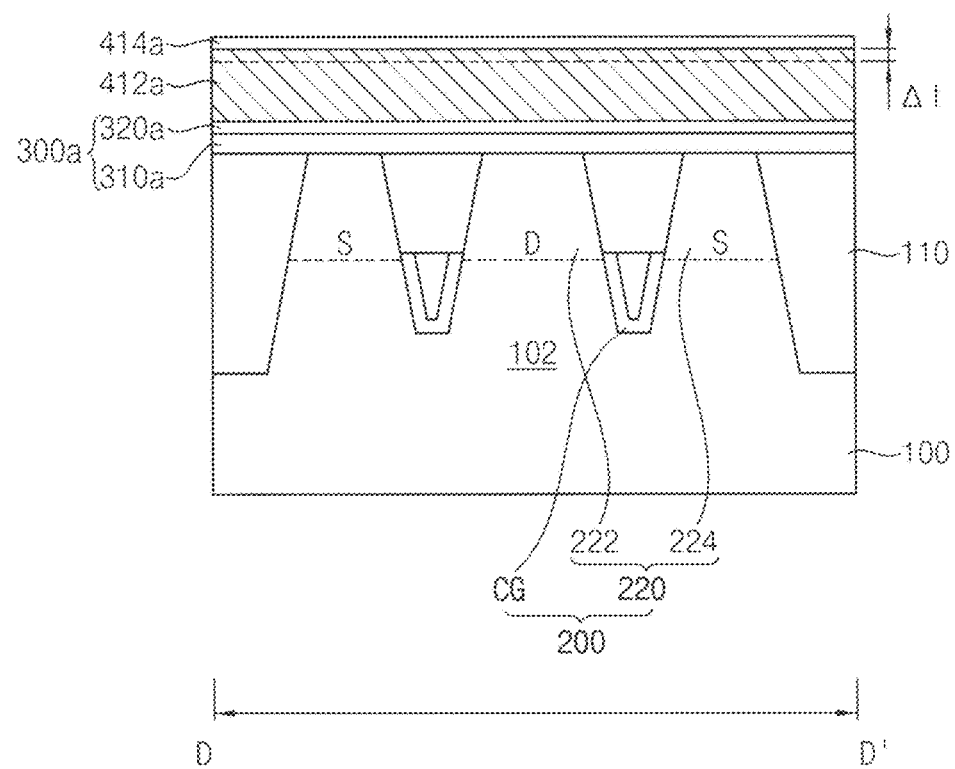
Figure 13A:
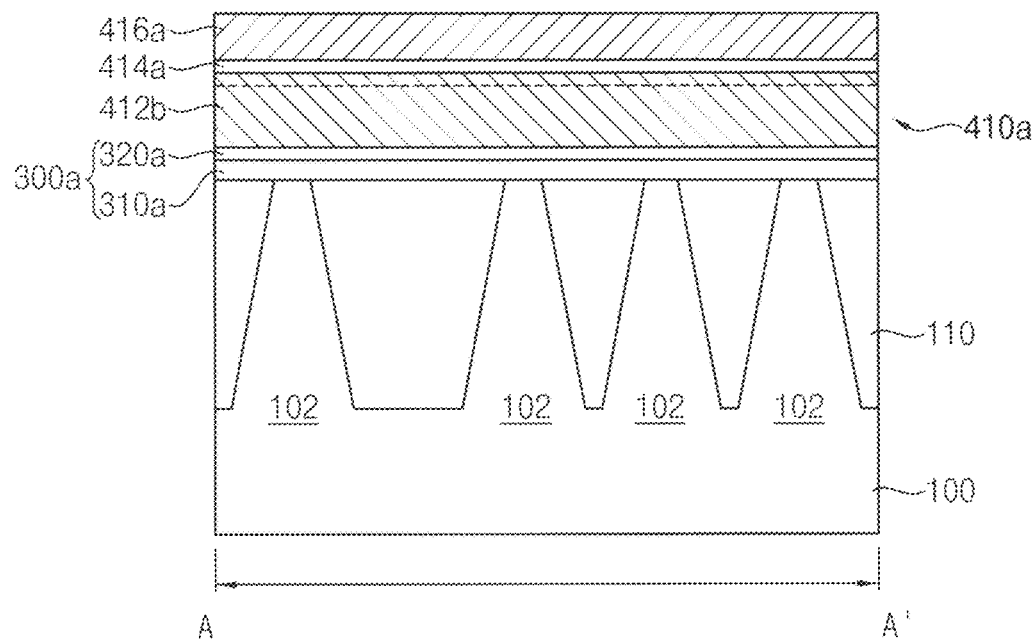
Figure 13B:
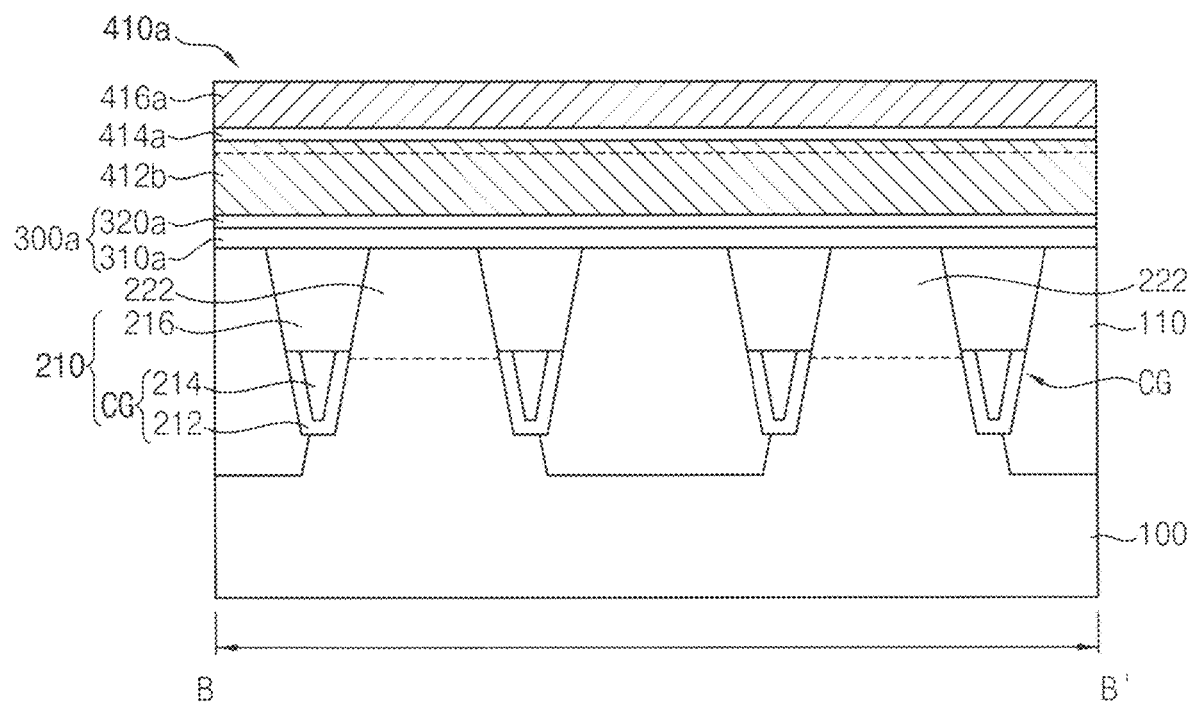
Figure 13C:
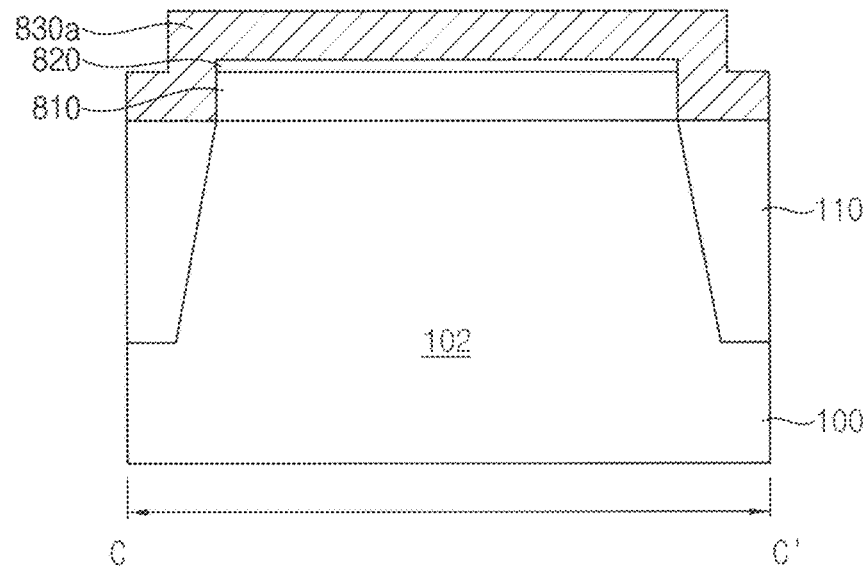
Figure 13D:
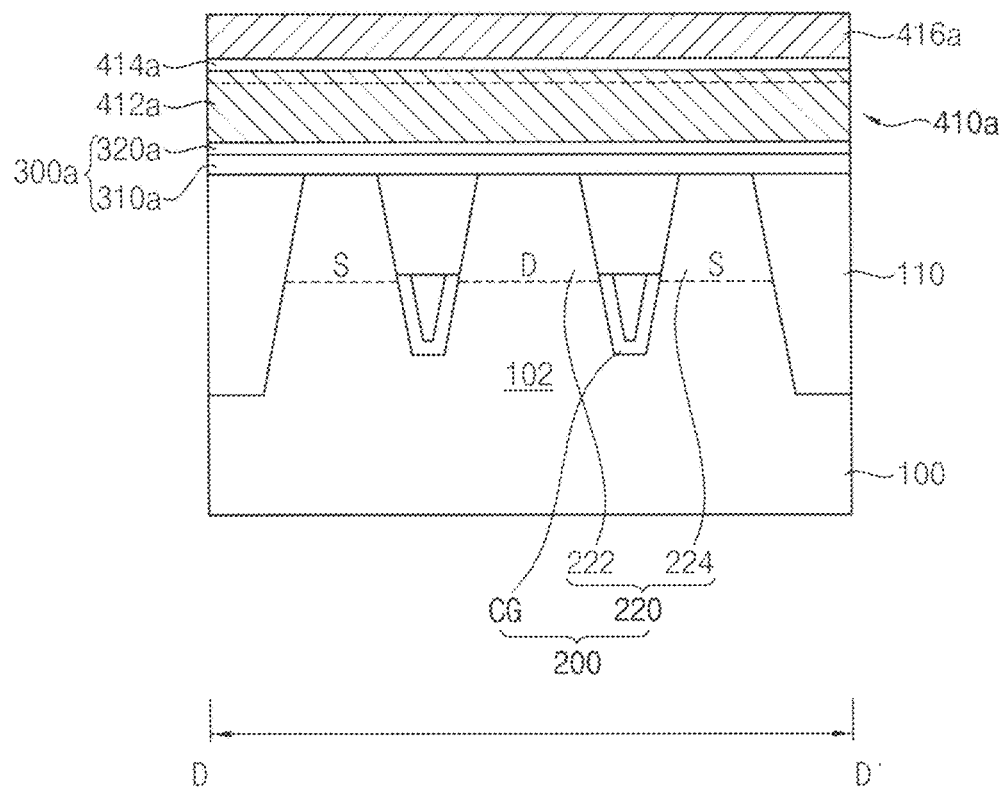
Figure 14A:
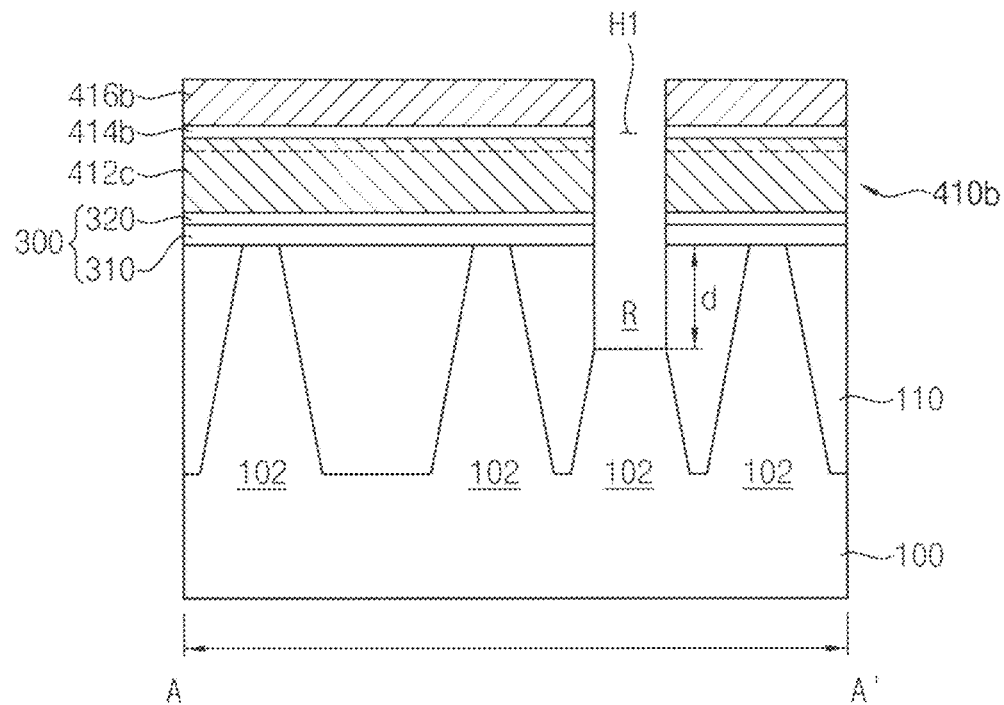
Figure 14B:
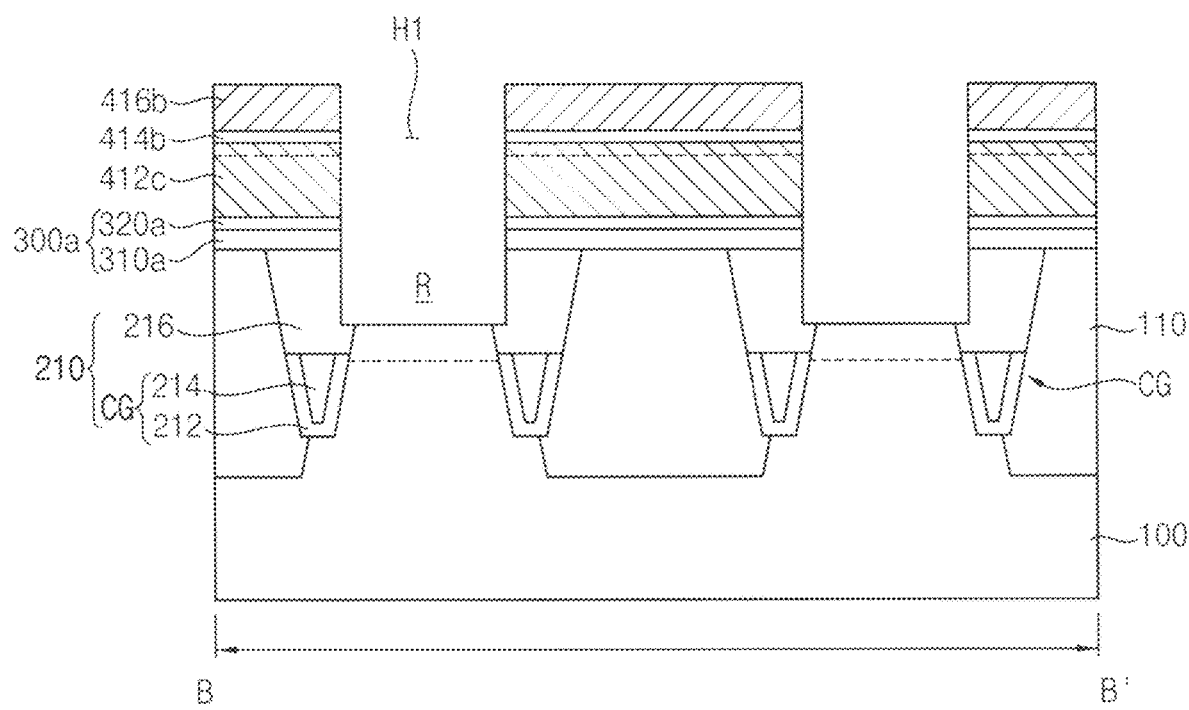
Figure 14C:
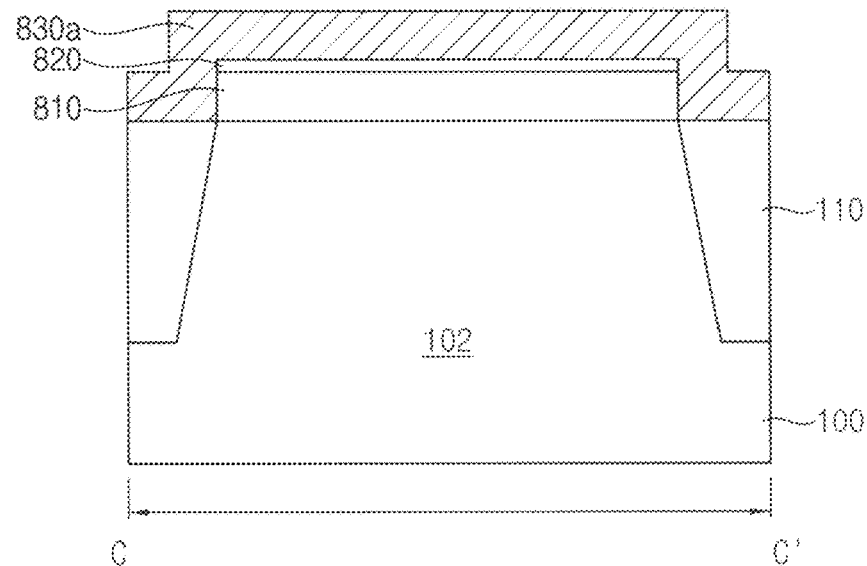
Figure 14D:
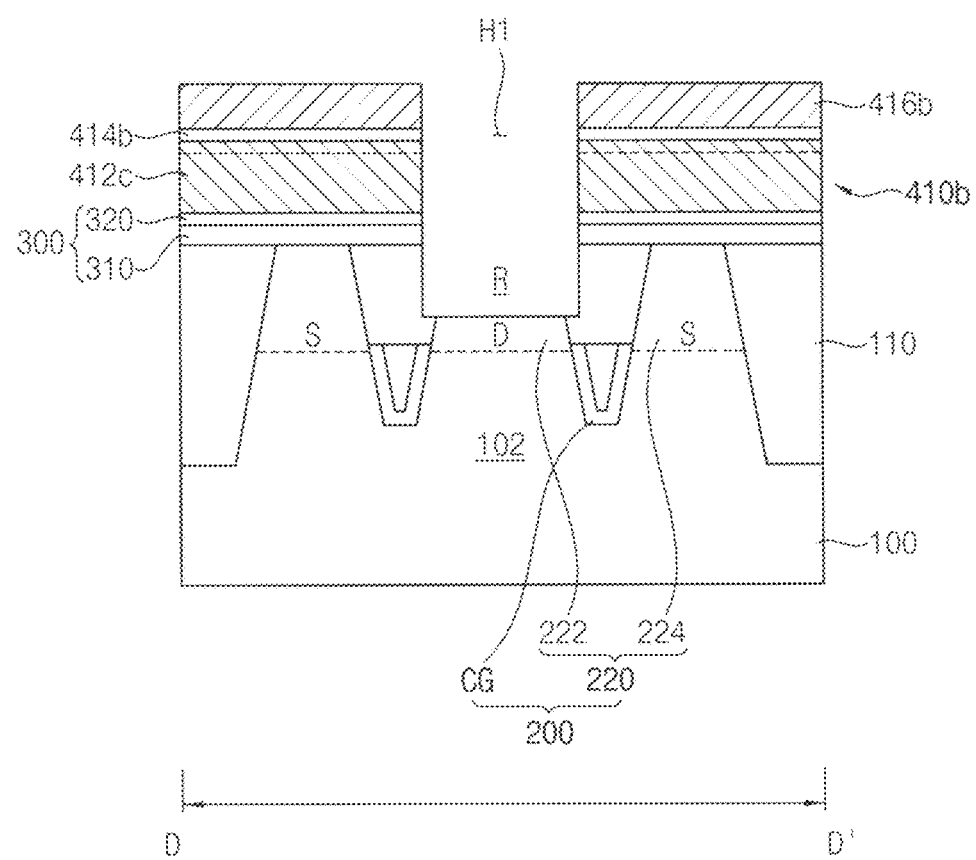
Figure 15A:
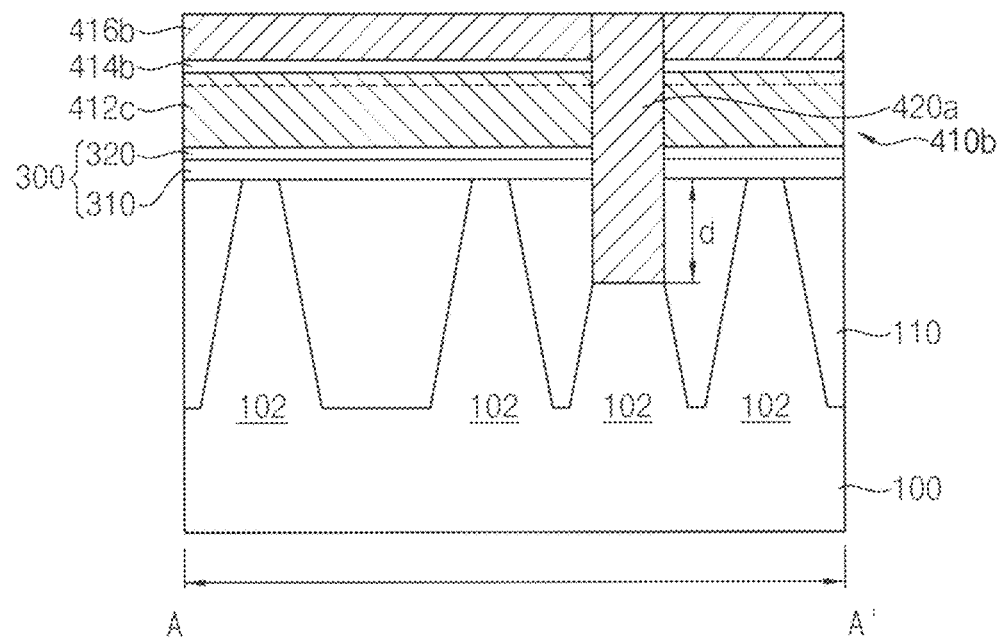
Figure 15B:
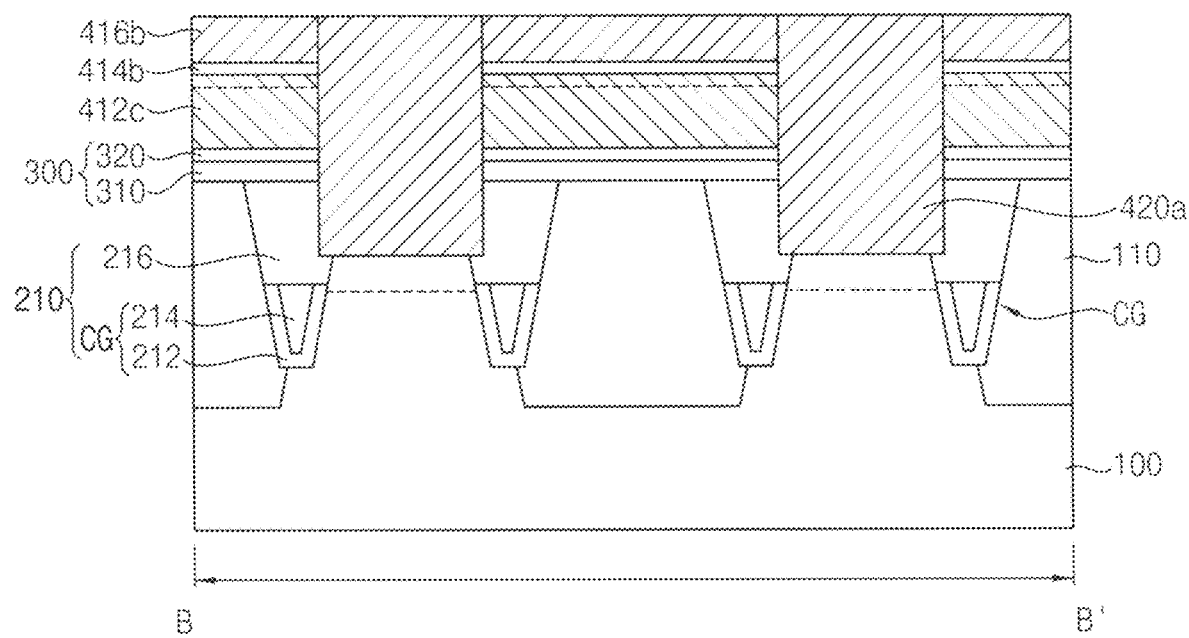
Figure 15C:
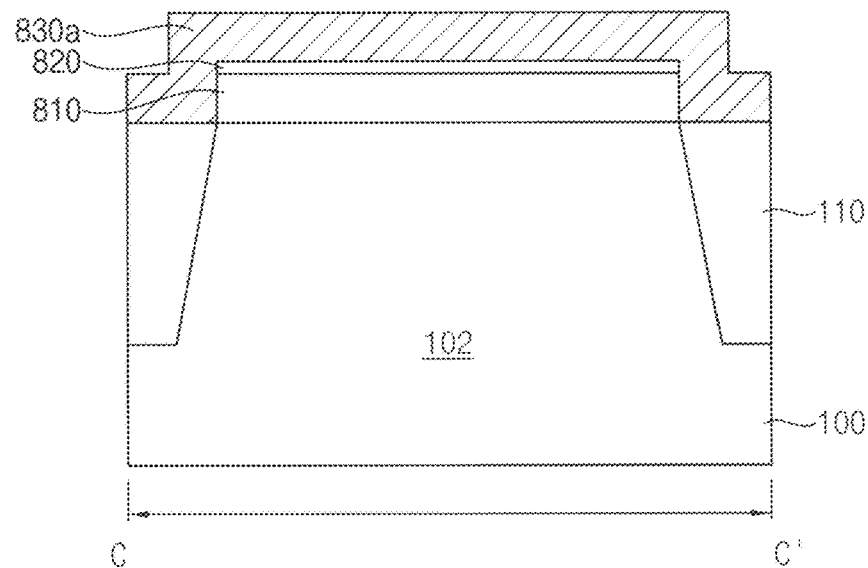
Figure 15D:
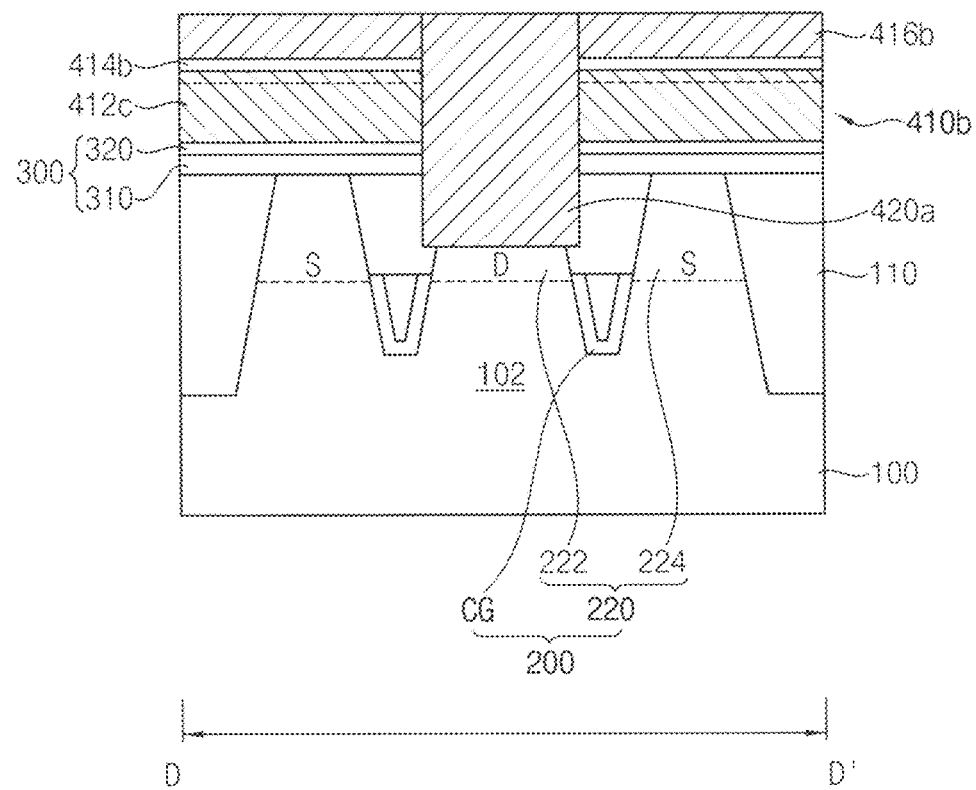

As shown in at least FIG. 4A, the hardening pattern 414 may be on the thermal oxide pattern 412. The hardening pattern 414 may be formed together with the peripheral hardening layer 820 by the same process. For example, the hardening pattern 414 may include silicon oxynitride (SiON) that may be formed to a thickness of about 20 Å to about 30 Å by a nitriding process to an oxide pattern.

When the nitriding process may be performed to the peripheral gate insulation layer 810 for hardening silicon oxide of the peripheral gate insulation layer 810 in the peripheral area P, the thermal oxide pattern 412 may also be nitrified by the same nitriding process in the cell area C. Thus, when no peripheral hardening pattern may be required for the peripheral gate PG in the peripheral area P, the hardening pattern 414 may also be omitted in the buffer pattern 410. For example, the hardening pattern 414 may include a silicon oxynitride pattern having a thickness of about 20 Å to about 30 Å.

Although at least FIG. 4A illustrates that a top surface of first contact 420 is above (e.g., is distal from substrate 100 in relation to) the top surface of hardening pattern 414, it will be understood that, in some example embodiments, the top surface of the hardening pattern 414 may be coplanar or substantially coplanar (e.g., coplanar within manufacturing tolerances and/or material tolerances) with the top surface of the first contact 420.

The buffer conductive pattern 416 may be formed by an over etch of the first etching process for forming the conductive line 430. That is, the over etch of the first etching process may be absorbed into a buffer conductive layer (not shown) and the buffer conductive layer may be formed into the buffer conductive pattern 416 by the over etch of the first etching process. In some example embodiments, the buffer conductive pattern 416 may include polysilicon and may have a variable thickness that may be changed by the thickness of the hardening pattern 414.

The buffer conductive pattern 416 may absorb the over etch of the first etching process for forming the conductive line 430, and the thermal oxide pattern 412 and the hardening pattern 414 may be sufficiently resistive to the second etching process for forming the first contact 420. Thus, when the thermal oxide pattern 412 and the hardening pattern 414 may sufficiently absorb the over etch of the first etching process and may be sufficiently resistive to the second etching process, the buffer conductive pattern 416 may not be provided with the buffer pattern 410 and thus only the thermal oxide pattern 412 and the hardening pattern 414 may constitute the buffer pattern 410. In such a case, an overall thickness or an overall height of the buffer pattern 410 may be reduced due to the height reduction the buffer conductive pattern 416, thereby reducing the aspect ratio in the first and the second etching processes.

In addition, the height reduction of the buffer conductive pattern 416 may sufficiently reduce the parasitic capacitance between neighboring bit line structures 400 and may improve the sensing margin of the bit line structure 400. Therefore, both of the aspect ratio and the parasitic capacitance of the bit line structure 400 may be reduced just by the thickness or the height reduction of the buffer conductive pattern 416.

In some example embodiments, the buffer conductive pattern 416 may have a thickness of about 20 Å to about 200 Å. For example, when the thermal oxide pattern 412 may have a thickness of about 50 Å, the thickness of the buffer conductive pattern 416 may be maximally reduced to about 40 Å.

When the terms "about," "approximately," or "substantially" are used in this specification in connection with a numerical value, it is intended that the associated numerical value include a tolerance of ±10% around the stated numerical value. When ranges are specified, the range includes all values therebetween such as increments of 0.1%.

The first contact 420 may extend from the first junction 222 to the conductive line 430 via a first contact hole H1 of the insulation pattern 300. Since the conductive line 430 may be arranged on the buffer pattern 410, and as shown in at least FIG. 4A, the top surface of the first contact 420 may have the same level as (e.g., may be coplanar or substantially coplanar with) the top surface of the buffer pattern 410 (e.g., the top surface of the buffer conductive pattern). The first contact 420 may include conductive materials and may function as a contact plug for electrically connecting the first junction 222 and the conductive line 430. The first contact 420 and at least the buffer conductive pattern 416 of the buffer pattern 410 may include a common conductive material.

Since the first junction 222 may be provided as the common drain electrode of the memory device 1000, the conductive line 430 may function as a bit line BL of the memory device 1000. Particularly, the bit line structure 400 may be formed on the cell area C together with the peripheral transistor 800 in the peripheral area P of the substrate 100, so that the bit line structure 400 may be provided as a gate bit line GBL.

The first contact 420 may include at least one material selected from a semiconductor material such as polysilicon, a compound of metal and semiconductor material such as tungsten silicide (WSi), a conductive metal nitride such as titanium nitride (TiN), tantalum nitride (TaN) and tungsten nitride (WN) and a conductive metal such as titanium (Ti), tantalum (Ta) and tungsten (W).

The buffer pattern 410, the first contact 420 and the conductive line 430 may be consecutively formed by a bit line etching process including the first etching process and the second etching process. Thus, when a lower portion of the first contact 420 may be formed in the first contact hole H1 and the junction recess R by the second etching process, the etch rate of the buffer pattern 410 may be much smaller than the materials of the first contact 420 in the second etching process and thus the substrate 100 and the BCAT 200 around the junction recess R may be sufficiently protected from the second etching process by the buffer pattern 410.

Thus, the first contact 420 may include a material of which the etch rate may be greater than the buffer pattern 410 in the second etching process. In some example embodiments, the first contact 420 may have two time or three times the etch rate of the buffer pattern 410 in the second etching process. For example, the first contact 420 may include polysilicon like the buffer conductive pattern 416 of the buffer pattern 410.

When the relative etch rate between the first contact 420 and the buffer pattern 410 may be uniform in the second etching process, the thickness of the buffer pattern 410 may be varied according to the depth of the first contact hole H1 and the depth of the junction recess R. That is, when the first contact hole H1 and the junction recess R may have a relatively small depth, a small height or thickness of the buffer pattern 410 may be sufficient for protecting underlying the substrate 100 and the BCAT 200 in the second etching process. However, when the first contact hole H1 and the junction recess R may have a relatively big depth, a big height or thickness of the buffer pattern 410 may be required for protecting underlying the substrate 100 and the BCAT 200 in the second etching process.

The thermal oxide pattern 412 may be formed from polysilicon by the thermal oxidation process when the peripheral gate insulation layer 810 may be formed on the peripheral area P of the substrate 100 by the same thermal oxidation process. Thus, the thickness of the thermal oxide pattern 412 may be easily controlled by changing the process conditions of the thermal oxidation process, which may facilitate the thickness or the height control of the buffer pattern 410. In addition, the hardening pattern 414 may be selectively formed on the thermal oxide pattern 412 by the nitriding process, and the thickness of the hardening pattern 414 may be controlled just by changing the process conditions of the nitriding process. Thus, when an overall height of the thermal oxide pattern 412 and the hardening pattern 414 may be sufficient for protecting the underlying substrate 100 and the BCAT 200 in second etching process, the buffer conductive pattern 416 may not be required for the buffer pattern 410.

In such a case, the buffer pattern 410 may have substantially the same structures and configurations of the first modified buffer pattern 20a shown in FIG. 2A and the second modified buffer pattern 20b shown in FIG. 2B. That is, the buffer pattern 410 may include the thermal oxide pattern 412 and the hardening pattern 414 without the buffer conductive pattern 416 or may only include the thermal oxide pattern 412 without the hardening pattern 414 and the buffer conductive pattern 416. Although not shown in figures, the buffer pattern 410 may include the thermal oxide pattern 412 and the buffer conductive pattern 416 without the hardening pattern 414.

Since the buffer conductive pattern 416 may include the same material as the first contact 420 and the etch rate of the thermal oxide pattern 412 may be much smaller than the first contact 420 in an etching process, the height of the buffer conductive pattern 416 may be reduced in the buffer pattern 410. In addition, since the top surface of the buffer pattern 410 may be the same level as the top surface of the first contact 420, the height reduction of the buffer pattern 410 may cause the height reduction of the first contact 420.

Accordingly, an overall height of the bit line structure 400 may be significantly reduced by the height reduction of the buffer pattern 410, thereby decreasing the aspect ratio in a bit line etching process. In addition, the parasitic capacitance between neighboring bit line structures 400 may also be reduced by the height reduction of the buffer conductive pattern 416, thereby increasing the sensing margin of the bit line structure 400.

The conductive line 430 may include a barrier pattern 432, a conductive metal pattern 434 and a bit line capping pattern 436 that may be sequentially stacked on the buffer pattern 410. The barrier pattern 432 may make contact with the buffer pattern 410 and the first contact 420 and the conductive metal pattern 434 may be arranged on the barrier pattern 432. The bit line capping pattern 436 may be arranged on the conductive metal pattern 434 in such a configuration that the conductive metal pattern 434 may be covered by the bit line capping pattern 436. Thus the conductive metal pattern 434 may be protected from surroundings by the bit line capping pattern 436.

The conductive line 430 may have the same width as the buffer pattern 410 and the first contact 420 and may be shaped into a line extending in the second direction II. A bit line spacer 440 may be arranged on the side surfaces of the buffer pattern 410, the first contact 420 and the conductive line 430 along the second direction II.

The conductive line 430 and the bit line spacer 440 may have substantially the same structures as the conductive line 40 and the spacer 50 of the bit line structure 90 shown in FIG. 1. Thus, any further detailed descriptions on the conductive line 430 and the bit line spacer 440 will be omitted.

The insulation interlayer pattern 500 may be arranged on a whole surface of the substrate 100 having the bit line structure 400 and the peripheral transistor 800 in such a configuration that the bit line structure 400 and the peripheral transistor 800 may be covered by the insulation interlayer pattern 500. Thus, the bit line structure 400 and the peripheral transistor 800 may be isolated from surroundings by the insulation interlayer pattern 500.

For example, the insulation interlayer pattern 500 may include one of an oxide, a nitride and an oxynitride and a top surface of the insulation interlayer pattern 500 may be planarized for forming the charge storage structure 600 in a subsequent process.

The charge storage structure 600 may be arranged on the insulation interlayer pattern 500. For example, the charge storage structure 600 may include a second contact 610 extending to the BCAT 200 through insulation interlayer pattern 500 and a charge holder 620 arranged on the insulation interlayer pattern 500 and making contact with the second contact 610.

The insulation interlayer pattern 500 may be partially removed between the neighboring bit line structures 400 by a self-aligned etching process using the bit line spacer 440 as an etching mask in such a way that the second junction 224 may be exposed between the neighboring bit line structures 400, thereby forming a second contact hole H2 through which the second junction 224 may be exposed. Then, conductive materials may be filled into the second contact hole H2, thereby forming the second contact 610 making contact with the second junction 224.

In some example embodiments, the second contact 610 may be provided as a buried contact that may be connected to the source electrode of the BCAT 200 and the charge holder 620 on the insulation interlayer pattern 500.

Since the second contact hole H2 may be formed by the self-aligned etching process using the bit line spacer 440 as an etching mask, the aligning margin for the second contact 610 may sufficiently increase to a whole area between the neighboring bit line spacers 440. In such a case, the second contact 610 may make contact with the bit line spacer 440 and the contact accuracy between the second contact 610 and the second junction 224 may increase in the second contact hole H2.

The second contact 610 may include at least one material selected from a semiconductor material such as polysilicon, a compound of metal and semiconductor material such as tungsten silicide (WSi), a conductive metal nitride such as titanium nitride (TiN), tantalum nitride (TaN) and tungsten nitride (WN) and a conductive metal such as titanium (Ti), tantalum (Ta) and tungsten (W). The second contact 610 may have the same materials as the first contact 420.

The charge holder 620 may be arranged on the insulation interlayer pattern 500 and may make contact with the second contact 610.

Various charge holders 620 may be provided with the memory device 1000 according to the characteristics and requirements of the memory device 1000.

For example, the charge holder 620 may include a capacitor having cylindrical lower electrode 622 making contact with the second contact 610, a dielectric layer (not shown) covering a surface of the lower electrode 622 along a surface profile of the lower electrode 622 and an upper electrode (not shown) covering the dielectric layer.

The lower electrode 622 and the upper electrode may include one of a semiconductor material doped with dopants, a conductive metal nitride and a conductive metal. Examples of the conductive metal nitride may include titanium nitride (TiN), tantalum nitride (TaN), tungsten nitride (WN), etc. Examples of the conductive metal may include ruthenium (Ru), iridium (Ir), titanium (Ti), tantalum (Ta), tungsten (W), etc. The dielectric layer may include at least one of an oxide, a nitride, an oxynitride and a high-k material.

Although not shown in figures, the charge holder 620 may include a variable resistor structure having a lower electrode (not shown), a variable resistor (not shown) and an upper electrode (not shown).

The variable resistor may include a phase changeable material such as a chalcogenide and the lower and upper electrodes may include a conductive material. Otherwise, one of the lower and the upper electrodes may include a heat electrode. The heat electrode may selectively transfer heat to the phase changeable material and the phase of the variable resistor may be alternately changed between an amorphous state and a crystalline state. Thus, the resistance difference between the amorphous state and the crystalline state may be used for storing electric data in the charge holder 620.

According to example embodiments of the present inventive memory device, the buffer pattern 410 of the bit line structure 400 may be modified to include the thermal oxide pattern 412 having a good etch resistance to a bit line etching process, so an overall height (thickness) of the buffer pattern 410 may decrease as compared with the conventional buffer pattern of the bit line structure 400. Thus, the aspect ratio a line pattern may be sufficiently reduced in the bit line structure to increase the physical stability of the line pattern in the bit line etching process.

In addition, as the height of the buffer conductive pattern 416 may decrease, the area of the opposite face between the buffer conductive pattern 416 and the first contact 420 may be minimized in the bit line structure 400. Thus, the parasitic capacitance between the neighboring bit line structures 400 may be minimized, and as a result, the sensing margin of the bit line structure 400 may increase in the memory device. The increase sensing margin of the bit line structure 400 may improve the signal characteristics of the memory device 1000.

FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, and 20D are cross-sectional views illustrating process steps for a method of manufacturing the memory device shown in FIGS. 3 and 4A to 4D. In FIGS. 5A to 15D, each figure designated by the subscript 'A' in the drawing number is a cross-sectional view cut along a line A-A' of the memory device shown in FIG. 3, and each figure designated by the subscript 'B' in the drawing number is a cross-sectional view cut along a line B-B' of the memory device shown in FIG. 3. In addition, each figure designated by the subscript 'A' in the drawing number is a cross-sectional view cut along a line A-A' of the memory device shown in FIG. 3, and each figure designated by the subscript 'B' in the drawing number is a cross-sectional view cut along a line B-B' of the memory device shown in FIG. 3 in FIGS. 5A to 15D.

Referring to FIGS. 3 and 5A to 5D, a substrate 100 may be provided in such a configuration that a plurality of active regions 102 and a device isolation layer 110 may be formed on the substrate 100. The substrate 100 may be divided into a cell area C in which a plurality of memory cells may be arranged and a peripheral area P in which a plurality of peripheral devices such as a driver for operating the memory cells may be arranged.

The substrate 100 may be divided into the active region 102 on which conductive structures such as a gate electrode may be arranged and a field region (not shown) defining the active region 102. The device isolation layer 110 may be positioned on the field region and the neighboring active regions 102 may be electrically isolated from each other by the device isolation layer 110.

The memory cell may include a charge storage structure and a cell transistor for charge or discharge the charge storage structure. The cell transistor may be arranged on the active region 102 of the cell area C and the peripheral transistor for driving the cell transistor may be arranged on the active region 102 of the peripheral area P.

For example, the substrate 100 may include Group IV-based semiconductor materials such as silicon (Si), germanium (Ge) and silicon-germanium (SiGe) and Group III-V compounds-based semiconductor materials such as GaP, GaAs and GaSb. In some example embodiments, the substrate 100 may include a silicon substrate, a germanium substrate, a silicon germanium (SiGe) substrate, a silicon-on-insulator (SOI) substrate and a germanium-on-insulator (GOI) substrate.

In some example embodiments, the active region 102 and the device isolation layer 110 may be formed by a shallow-trench isolation (STI) process. A hard mask (not shown) may be formed on the substrate 100 and a device isolation trench may be formed at an upper portion of the substrate 100 by an isotropic etching process using the hard mask as an etching mask. The device isolation trench may be filled up with insulation materials to thereby form the device isolation layer 110. For example, the device isolation layer 110 may include one of silicon oxide, silicon nitride and silicon oxynitride.

Thus, a plurality of the active regions 102 may be defined by the device isolation layer 110 and the neighboring active regions 102 may be electrically isolated from each other by the device isolation layer 110. In some example embodiments, the active region may be slanted at an angle with respect to the first direction I or the second direction II and a number of the active regions may be repeated at the same intervals.

Referring to FIGS. 3 and 6A to 6D, a plurality of buried channel array transistors (BCAT) may be formed on the substrate 100 in such a way that at least a gate line having a plurality of buried cell gates CG on the active regions 102 under a surface of the substrate 100 may extend in the first direction I and a plurality of junction portions 220 may be arranged on the active regions 102 adjacent to and higher than the buried cell gate CG in the cell region C.

In some example embodiments, a plurality of gate trench (not shown) may be formed on the substrate 100 in such a way that the gate trench may be across the device isolation layer 110 and the active region 102. The gate trench may extend in the first direction I and the neighboring gate trenches may be spaced apart by the same gap distance in the second direction II. Particularly, a single active region 102 may be across a pair of the gate trenches on the substrate 100.

A preliminary cell gate insulation layer (not shown) may be formed on a top surface of the substrate 100 and bottom and side surfaces of the gate trench along a surface profile of the gate trench and a preliminary cell gate conductive layer may be formed on the preliminary cell gate insulation layer to a sufficient thickness for filling up the gate trench.

The preliminary cell gate insulation layer may be formed by a thermal oxidation process or a deposition process. When the thermal oxidation process may be conducted to the substrate 100 having the gate trench, a thermal oxide layer may be formed on a surface of the active region as the preliminary cell gate insulation layer. Otherwise, high dielectric constant materials such as silicon oxide and metal oxide may be deposited onto the substrate 100 by a deposition process such as a chemical vapor deposition (CVD) process and an atomic layer deposition (ALD) process.

Conductive materials may be deposited onto the preliminary cell gate insulation layer by a deposition process such as a physical vapor deposition (PVD) process, a CVD process and an ALD process, thereby forming the preliminary cell gate conductive layer on the preliminary cell gate insulation layer. Particularly, the deposition process may be conducted in such a way that the preliminary cell gate conductive layer may be formed to a sufficient thickness to fill up the gate trench.

Then, the preliminary cell gate conductive layer and the preliminary cell gate insulation layer may be partially removed from the substrate 100 by a planarization process such as a chemical mechanical polishing (CMP) process until a top surface of the substrate 100 may be exposed. Thus, the preliminary cell gate conductive layer and the preliminary cell gate insulation layer may only remain in the gate trench.

Then, upper portions of the preliminary cell gate conductive layer and the preliminary cell gate insulation layer may be removed from the gate trench by an etch-back process, thereby forming a cell gate insulation layer 212 and a cell gate conductive layer 214 at a lower portion of the gate trench. Particularly, the cell gate insulation layer 212 and the cell gate conductive layer 214 on the active region 102 in the gate trench may be formed into a cell gate CG.

A cell gate capping layer (not shown) may be formed on the substrate 100 to a sufficient thickness to fill up the upper portion of the gate trench and may be planarized in such a way that the top surface of the substrate 100 may be exposed, thereby forming a cell gate capping pattern 216 in the upper portion of the gate trench. Thus, the cell gate CG may be covered or buried by the cell gate capping pattern 216 and may be isolated from surroundings. For that reason, the cell gate CG may also be referred to as buried cell gate CG. For example, the cell gate capping layer may include silicon nitride or silicon oxide that may be deposited onto the substrate 100 by a deposition process.

Therefore, the cell gate insulation layer 212, the cell gate conductive layer 214 and the cell gate capping pattern 216 may be sequentially stacked in the gate trench, thereby forming a buried gate structure 210 extending along the first direction I in the cell area C of the substrate 100. The line-shaped buried gate structure 210 may be provided as a gate line of the memory device 1000.

That is, the buried cell gate CG may be arranged under a top surface of the device isolation layer 110 and may be covered by the line-shaped cell gate capping pattern 216 in the cell area C. Since the cell gate CG may function as a gate electrode of the cell transistor, the gate line may function as a word line WL of the memory device 1000.

The device isolation layer 110 and the active region 102 around the cell gate capping pattern 216 may be exposed to surroundings in such a configuration that the active region 102 and the device isolation layer 110 may be alternately arranged in the first direction I and the active region 102 may be isolated like an island by the device isolation layer 110 and the cell gate capping pattern 216.

Since a pair of the gate line may be across a single active region 102, each active region 102 may include a pair of cell gates CG in such a way that a central portion adjacent to the pair of the cell gates CG and both end portions adjacent to one of the cell gates CG may be exposed to surroundings. The exposed portions of the active region 102 adjacent to the cell gate CG may be provided as the junction portion 220.

Since no gate trench may be provided with the peripheral area P of the substrate 100, the active region 102 defined by the device isolation layer 110 may be fully exposed to surroundings.

Thereafter, an ion implantation process may be performed only to the cell area C of the substrate 100 and the impurities may be implanted onto surface portions of the exposed portion of the active region 102, thereby forming the junction portion 220 adjacent to the buried gate structure 210.

Particularly, a first junction 222 may be formed on the central portion of the active region 102 and a pair of second junctions 224 may be formed on both end portions of the active region 102. The impurities may include boron (B) or phosphorus (P). The ion implantation process may be conducted in such a way that the bottom portion of the junction portion 220 may be below a bottom portion of the cell gate CG.

The peripheral area P of the substrate 100 may be covered by a mask layer (not shown) in the ion implantation process and thus the junction portion 220 may be only formed in the cell area C. When the ion implantation process may be completed, the mask layer may be removed from the substrate 100 and the peripheral area P may be again exposed to surroundings.

Accordingly, a pair of the cell gates and the junction portion 220 may be formed on the active region 102 of the cell area C and thus a buried channel array transistor (BCAT) 200 may be arranged on the active region 102 of the cell area C as the cell transistor of the memory device 1000.

Referring to FIGS. 3 and 7A to 7D, an insulation layer 300a may be formed on a whole surface of the substrate 100 in which a plurality of the BCATs 200 may be arranged.

In some example embodiments, a base oxide layer 310a may be formed on a whole surface of the substrate 100 by a deposition process or a spin coating process and an etch stop layer 320a may be formed on the base oxide layer 310a by a deposition process. The base oxide layer 310a may include at least one of polyethylene oxide (PEOX), tetraethyl orthosilicate (TEOS), silicate glass, siloxane, silsequioxane and the etch stop layer 320a may include one of silicon nitride and silicon oxynitride. Thus, the substrate 100 may be covered by the insulation layer 300a having the base oxide layer 310a and the etch stop layer 320a.

The base oxide layer 310a may be formed to a thickness of about 40 Å to about 60 Å and the etch stop layer 320a may be formed to a thickness of about 30 Å to about 40 Å.

Restating the above, and as shown in at least FIGS. 7A-7D, the insulation layer 300a may be formed on the whole ("an entirety of the") substrate 100 based on depositing insulation materials onto the substrate 100 along a cell area C on which the BCAT transistors 200 (e.g., cell transistors) are arranged and a peripheral area P on which at least a peripheral transistor 800 is to be arranged as described further below.

Referring to FIGS. 3 and 8A to 8D, a semiconductor layer 412a and a sacrificial layer 490a may be formed on the insulation layer 300a along a whole substrate 100 (e.g., across the cell area C and the peripheral area P).

For example, polysilicon may be deposited onto the etch stop layer 320a by a CVD process and the semiconductor layer 412a may be formed on the etch stop layer 320a.

Various semiconductor materials may be used for the semiconductor layer 412a as long as the semiconductor material may be formed into an oxide layer together with the peripheral gate insulation layer and the thickness of the oxide layer (e.g., the resulting thermal oxide layer 412b to be formed based on the semiconductor layer 412a) may be greater than that of the peripheral gate insulation layer. For example, when the substrate may include a single crystalline silicon, a polysilicon layer may be used as the semiconductor layer 412a, because a polysilicon oxide layer may be formed thicker than a single silicon layer under the same thermal oxidation process. For that reason, a polysilicon layer may be formed on the surface of the substrate 100 which comprises single crystalline silicon as the semiconductor layer 412a. For example, the semiconductor layer 412a may be formed to a thickness of about 30 Å to about 70 Å.

Then, the sacrificial layer 490a may be formed on a whole surface of the semiconductor layer 412a. For example, an oxide such as tetraethyl orthosilicate (TEOS), silicate glass may be deposited onto the semiconductor layer 412a and the sacrificial layer 490a comprising oxide may be formed on the semiconductor layer 412a. Thus, the semiconductor layer 412a and the sacrificial layer 490a may be formed on the insulation layer 300a along a whole substrate 100 across the cell area C and the peripheral area P. The semiconductor layer 412a may include polysilicon and the sacrificial layer 490a may include an oxide.

Referring to FIGS. 3 and 9A to 9D, the sacrificial layer 490a and the semiconductor layer 412a may be removed from the peripheral area P and the etch stop layer 320a may be exposed in the peripheral area P of the substrate 100. Restated, the sacrificial layer 490a and the semiconductor layer 412a may be partially removed from the substrate 100 such that the insulation layer 300a is exposed in the peripheral area P and the sacrificial layer and the semiconductor layer 412a are restricted to the cell area C.

In some example embodiments, a mask pattern (not shown) may be formed on the substrate 100 in such a way that the cell area C may be covered by the mask pattern and the peripheral area P may be exposed. Then, a dry etch process may be performed to the substrate 100 using the mask pattern as an etching mask, so the sacrificial layer 490a and the semiconductor layer 412a may be removed just from the peripheral area P of the substrate 100. Thereafter, the mask pattern may be removed by an ashing process and a strip process.

Therefore, the sacrificial layer 490a may be exposed in the cell area C of the substrate 100 and the etch stop layer 320a may be exposed in the peripheral area P of the substrate 100.

Referring to FIGS. 3 and 10A to 10D, the etch stop layer 320a may be removed from the peripheral area P of the substrate 100 by an etching process having an etching selectivity with respect to the sacrificial layer 490a. Restated, an upper portion (e.g., etch stop layer 320a) of the insulation layer 300a may be removed from the peripheral area P based on an etching process having an etching selectivity with respect to the sacrificial layer 490a of the cell area C.

In some example embodiments, the etch stop layer 320a may include silicon nitride and a wet etching process may be performed to the substrate using a phosphoric aqueous solution as an etchant. Thus, the etch stop layer 320a in the peripheral area P may be removed by the wet etching process and the base oxide layer 310a may be exposed in the peripheral area P.

Particularly, since the sacrificial layer 490a may have strong etch resistivity to the phosphoric aqueous solution, the semiconductor layer 412a in the cell area C may be protected from the wet etching process by the sacrificial layer 490a and only the etch stop layer 320a in the peripheral area P may be removed by the wet etching process. Therefore, the sacrificial layer 490a may be still exposed in the cell area C and the base oxide layer 310a may be exposed in the peripheral area P.

Referring to FIGS. 3 and 11A to 11D, the sacrificial layer 490a in the cell areas C and the base oxide layer 310a in the peripheral area P may be simultaneously removed from the substrate 100. Restated, a lower portion (e.g., base oxide layer 310a) of the insulation layer 300a and the sacrificial layer 490a may be simultaneously removed from the peripheral area P and the cell area C, respectively, such that the cell area C is covered by the semiconductor layer 412a and a top surface of the peripheral area P of the substrate 100 is exposed. Thus, referring to FIGS. 8A-11D, a semiconductor layer 412a may be formed on the insulation layer 300a in the cell area C such that the substrate 100 is exposed in the peripheral area P.

In some example embodiments, the sacrificial layer 490a may include an oxide such as TEOS and the base oxide layer 310a may include silicon oxide, so that the sacrificial layer 490a and the base oxide layer 310a may be removed from the substrate 100 by the same wet etching process.

Accordingly, the top surface of the peripheral area P of substrate 100 may be exposed and thus the active region 102 and the device isolation layer 110 may be exposed again to surroundings in the peripheral area P, while the top surface of the cell area C may be covered by a stack layer structure of the base oxide layer 310a, the etch stop layer 320a and the semiconductor layer 412a. That is, the active region 102 and the device isolation layer 110 may be covered by the stack layer structure and the semiconductor layer 412a may be exposed to surroundings in the cell area C.

Referring to FIGS. 3 and 12A to 12D, a heat treatment may be conducted to the substrate 100, thereby transforming the semiconductor layer 412a to a thermal oxide layer 412b in the cell area C and forming a peripheral gate insulation layer 810 on the active region 102 in the peripheral area P.

For example, a rapid thermal oxidation (RTO) process may be conducted to the substrate 100 (e.g., at least partially thermally oxidizing the substrate 100) for a particular (or, alternatively, predetermined) time. As a result of said thermal oxidizing, the semiconductor layer 412a may be formed into the thermal oxide layer 412b in the cell area C and a surface portion of the active region 102 may be formed into the peripheral gate insulation layer 810 in the peripheral area P together with ("simultaneously with") the thermal oxide layer 412b being formed in the cell area C.

Since the semiconductor layer 412a may comprise polysilicon and the active region 102, and thus the substrate 100, may comprise single crystalline silicon and the oxidation quotient of the polysilicon may be much greater than that of the single crystalline silicon under the same thermal oxidation process, the thermal oxide layer 412b may have a thickness greater than that of the peripheral gate insulation layer 810. Particularly, the thickness of the thermal oxide layer 412b may be greater than that of the semiconductor layer 412a by a thickness deviation $\Delta t$.

The thickness of the thermal oxide layer 412b may be determined by the thickness of the semiconductor layer 412a and the process conditions of the thermal oxidation process. Thus, the thickness of the thermal oxide layer 412b may be controlled in view of the thermal oxide pattern 412 just by modifying the thickness of the semiconductor layer 412a and changing the process conditions of the thermal oxidation process. Therefore, the overall thickness or height of the buffer pattern 410 may be changed or modified by changing the thickness or height of the thermal oxide layer 412b in accordance with the characteristics and requirements of the memory device.

In some example embodiments, when the peripheral gate insulation layer 810 may be formed into a silicon oxide layer having a thickness of about 40 Å to about 70 Å, the thermal oxide layer 412b may be formed into a silicon oxide layer having a thickness of about 50 Å to about 100 Å.

The silicon oxide of the thermal oxide layer 412b may have a sufficiently good etch resistivity with respect to a bit line etching process, so the substrate 100 and/or the BCAT 200 may be sufficiently protected from the bit line etching process. Thus, since a small thickness of the thermal oxide layer 412b may be sufficiently resistive to the bit line etching process, an overall height of the buffer pattern 410, described in detail hereinafter, having the thermal oxide pattern 412 may be reduced.

Particularly, since the thickness of the thermal oxide layer 412b may be easily changed by the thickness of the semiconductor layer 412a and the process conditions of the thermal oxidation process, the thermal oxide layer 412b may function as a thickness variable layer in the formation process of the bit line structure 400. Thus, the thickness of the thermal oxide layer 412b may be determined in view of the structures and configurations of the bit line structure 400 and the characteristics of the substrate 100.

A cell hardening layer 414a and a peripheral hardening layer 820 may be selectively formed on the thermal oxide layer 412b and the peripheral gate insulation layer 810, respectively.

For example, a nitriding process may be further performed to the substrate 100 after completing the thermal oxidation process, so a nitride layer may be further formed on the thermal oxide layer 412b and the peripheral gate insulation layer 810. Since both of the thermal oxide layer 412b and the peripheral gate insulation layer 810 may include silicon oxide, silicon oxynitride layer may be formed on the thermal oxide layer 412b and the peripheral gate insulation layer 810, thereby forming the cell hardening layer 414a and the peripheral hardening layer 820 simultaneously with each other. Restated, a hardening layer may be formed simultaneously on the oxide layer in the cell area and on the peripheral gate insulation layer in the peripheral area according to a nitriding process. The cell hardening layer 414a and the peripheral hardening layer 820 may have the same thickness of about 20 Å to about 30 Å.

No nitriding process may be performed according to the requirements of the memory device 1000. In such a case, the cell hardening layer 414a may not be provided with the buffer pattern 410 and the peripheral hardening layer 820 may not be provided with the peripheral transistor 800.

Referring to FIGS. 3 and 13A to 13D, a buffer conductive layer 416a and a first peripheral gate conductive layer 830a may be formed on the cell hardening layer 414a and the peripheral hardening layer 820, respectively.

For example, semiconductor materials may be deposited onto the cell hardening layer 414a and the peripheral hardening layer 820 along a whole substrate 100 by a CVD process, thereby forming the buffer conductive layer 416a on the cell hardening layer 414a and the first peripheral gate conductive layer 830a on the peripheral hardening layer 820. Thus, the buffer conductive layer 416a and the first peripheral gate conductive layer 830a may be simultaneously formed by the same deposition process.

When the cell hardening layer 414a and the peripheral hardening layer 820 may not be provided with the memory device 1000, the buffer conductive layer 416a may be formed on the thermal oxide layer 412b and the first peripheral gate conductive layer 830a may be formed on the peripheral gate insulation layer 810.

Figure 16A:
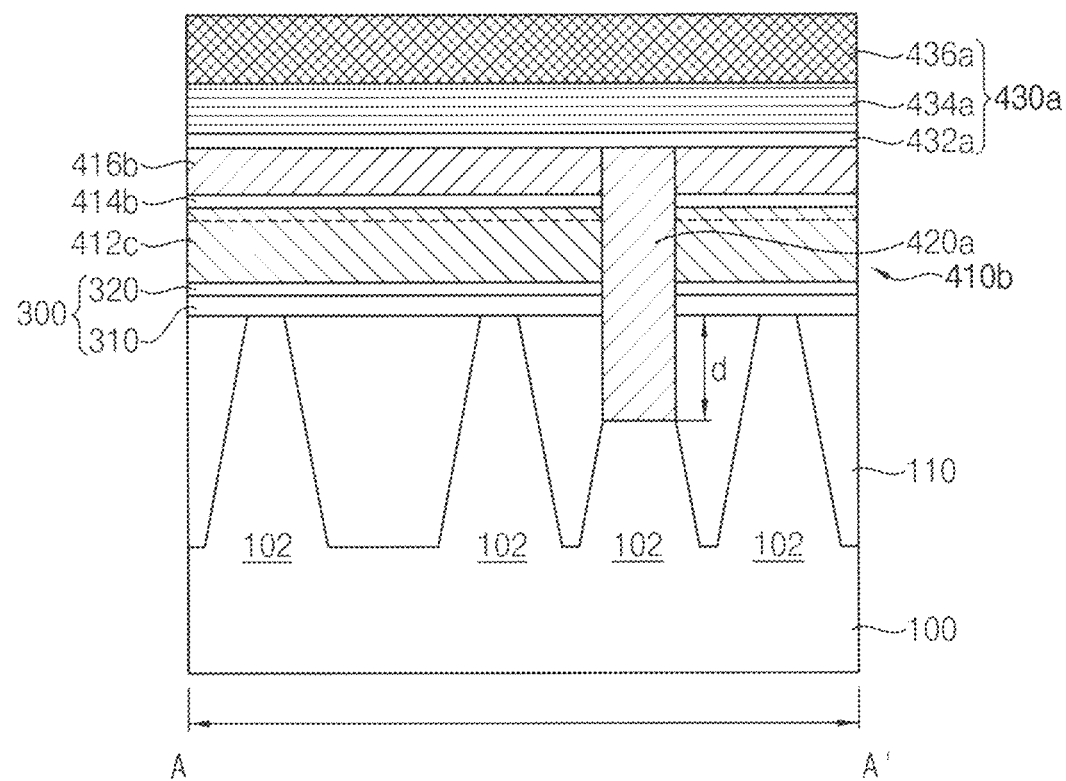
Figure 16B:
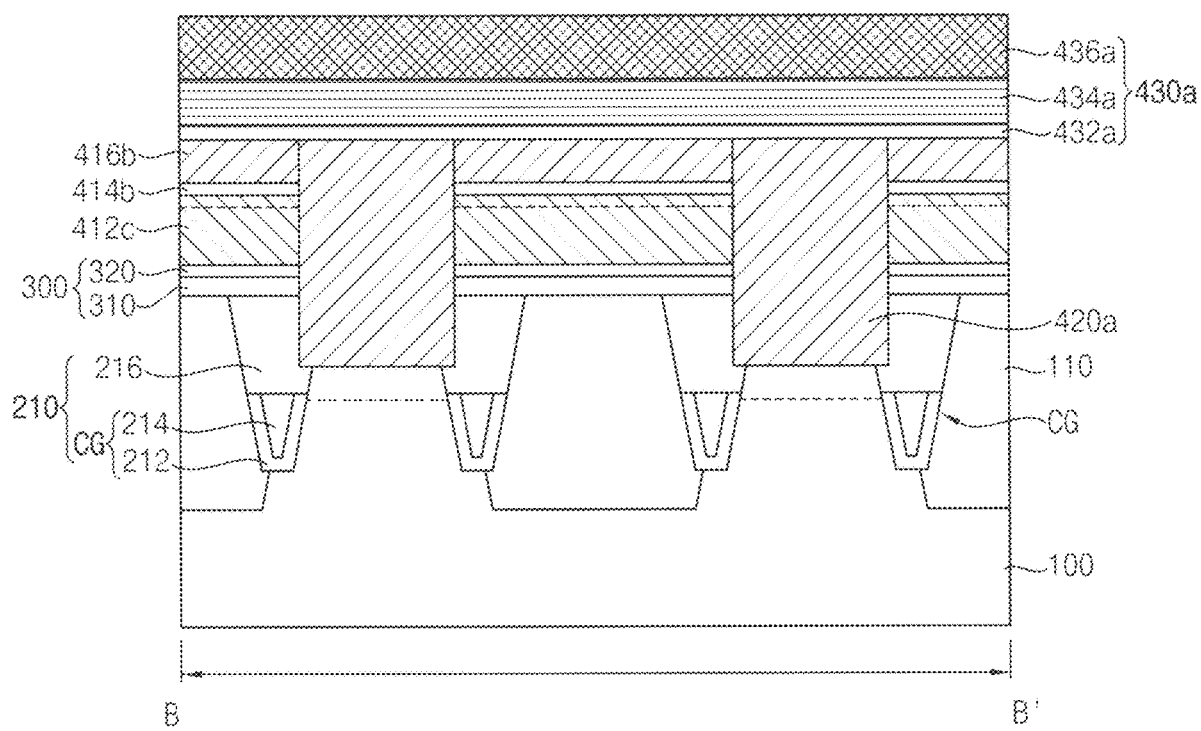
Figure 16C:
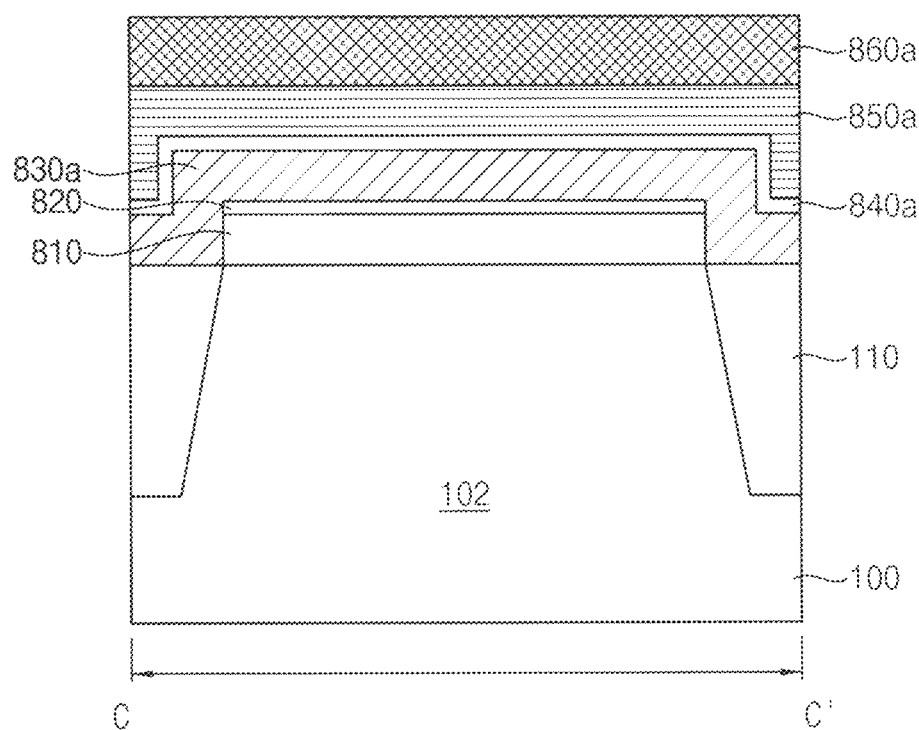
Figure 16D:
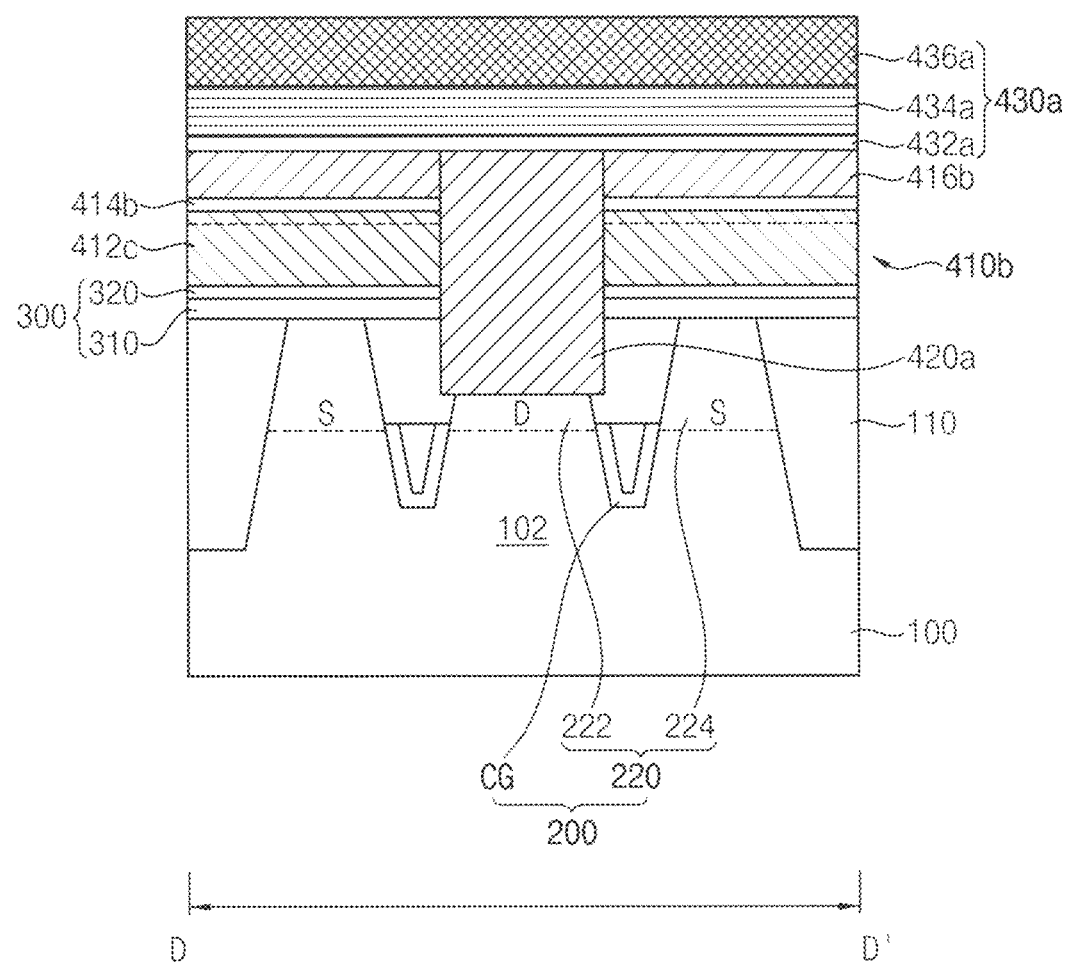

The buffer conductive layer 416a may include polysilicon and may absorb an over etch of an etching process for etching a conductive layer 430a in FIG. 16A that may be arranged on the buffer conductive layer 416a.

Particularly, the thickness of the buffer conductive layer 416a may be varied according to the thickness of the thermal oxide layer 412b and the cell hardening layer 414a, thereby reducing an overall height of the buffer pattern 410. In some example embodiments, the buffer conductive layer 416a may be formed to a thickness below about 40 Å. When the thermal oxide layer 412b and the cell hardening layer 414a may be sufficient for absorbing the over etch of the etching process for etching the conductive layer 430a, the buffer conductive layer 416a may not be formed on the cell hardening layer 414a.

Thus, the thermal oxide layer 412b, the cell hardening layer 414a and the buffer conductive layer 416a may be sequentially stacked on the insulation layer 300a, thereby forming a buffer layer 410a in the cell area C of the substrate 100. In contrast, the first peripheral gate conductive layer 830a may be formed on the whole peripheral area P of the substrate 100 and the peripheral hardening layer 820a may be covered by the first peripheral gate conductive layer 830a.

Thereafter, a preliminary contact 420b making contact with the first junction 222 may be formed through the buffer layer 410a and the insulation layer 300a.

Referring to FIGS. 3 and 14A to 14D, the buffer layer 410a, the insulation layer 300a may be partially removed from the substrate 100, thereby forming a first contact hole H1 through which the first junction 222 may be exposed. Then, an upper portion of the first junction 222 may be recessed to form a lower junction of which the top surface may be lower than the top surface of the device isolation layer 110.

For example, a mask pattern (not shown) for exposing the first junction 222 may be formed on the buffer layer 410a and the buffer layer 410a and the insulation layer 300a may be sequentially and partially removed from the substrate 100 by an etching process using the mask pattern as an etching mask, thereby forming a preliminary buffer pattern 410b having the first contact hole H1 through which the first junction 222 underlying the insulation layer 300a may be exposed. Then, the mask pattern may be removed from the preliminary buffer pattern 410b by an ashing process and a strip process.

In some example embodiments, the first contact hole H1 may be formed in such a way that the first junction 222 may be exposed through the first contact hole H1. However, the first contact hole H1 may also be formed in such a way that the second junctions 224 may be exposed through the first contact hole H1 in accordance with characteristics of the memory device 1000.

The base oxide layer 310a may be formed into a base oxide pattern 310 and the etch stop layer 320a may be formed into an etch stop pattern 320 by the etching process, thereby forming an insulation pattern 300 on the substrate 100. In the same way, the thermal oxide layer 412b, the cell hardening layer 414a and the buffer conductive layer 416a may be formed into a preliminary thermal oxide pattern 412c, a preliminary hardening pattern 414b and a preliminary buffer conductive pattern 416b, respectively, thereby forming the preliminary buffer pattern 410b on the insulation pattern 300. The first contact hole H1 may be consecutively formed through the preliminary buffer pattern 410b and the insulation pattern 300. Therefore, the first contact hole H1 may be defined by both of the insulation pattern 300 and the preliminary buffer pattern 410b.

Then, the etching process for forming the first contact hole H1 may be continuously conducted to the first junction 222 in such a way that an upper portion of the second junction 224 may be removed from the substrate 100. Thus, the first junction 222 may be recessed to a particular (or, alternatively, predetermined) depth to thereby form a junction recess R defined by the device isolation layer 110 and communicating with the first contact hole H1. The first junction 222 may be formed into a lower junction having a top surface lower than the top surface of the device isolation layer 110. Accordingly, the lower junction may be exposed to surroundings through the junction recess R and the first contact hole H1.

Referring to FIGS. 3 and 15A to 15D, conductive materials may be filled up in the first contact hole H1 and the junction recess R, thereby forming a preliminary contact 420a that extends ("penetrates") through the buffer layer 416a and the insulation layer 810 such that the preliminary contact 420a makes contact with ("contacts") the junction portion 220 under a top surface of the device isolation layer 110 and is enclosed by the device isolation layer 110, insulation pattern 300, and a preliminary buffer pattern 410b.

Restated, the buffer layer 410a, the insulation layer 300a and the junction portion 220 underlying the insulation layer 300a may be at least partially removed to form a first contact hole H1 and a junction recess R, where the first contact hole H1 is defined by a preliminary buffer pattern 410b and the insulation pattern 300, and the junction recess R is defined by the device isolation layer 110 such that a lower junction having a top surface lower than the top surface of the device isolation layer 110 is exposed through the junction recess R and the contact hole H1, and the preliminary buffer pattern 410b includes a preliminary thermal oxide pattern 412c and a preliminary buffer conductive pattern 416b. The first contact hole H1 and junction recess R can be filled with conductive materials to form the preliminary contact 420a in the first contact hole H1 and the junction recess R such that a top surface of the preliminary contact 420a is coplanar or substantially coplanar with a top surface of the preliminary buffer conductive pattern 416b.

For example, conductive materials may be deposited onto the preliminary buffer pattern 410b and the first peripheral gate conductive layer 830a by a CVD process, thereby forming a conductive contact layer (not shown) to a sufficient thickness to fill up the first contact hole H1 and the junction recess R. Then, the conductive contact layer may be planarized by a CMP process until a top surface of the preliminary buffer pattern 410b may be exposed in the cell area C and a top surface of the first peripheral gate conductive layer 830a may be exposed in the peripheral area P. Therefore, the conductive contact layer may just remain in the first contact hole H1 and the junction recess R, thereby forming the preliminary contact 420a in the first contact hole H1 and the junction recess R.

In some example embodiments, the conductive contact layer may include polysilicon, so the preliminary contact 420a may include the same conductive material as the preliminary buffer conductive pattern 416b. Therefore, the conductive contact layer and the preliminary buffer conductive pattern 416b may be removed substantially at the same rate in the CMP process, so that a top surface of the preliminary contact 420a may be substantially coplanar (e.g., coplanar within manufacturing tolerances and/or material tolerances) with the top surface of the preliminary buffer conductive pattern 416b.

Particularly, the preliminary buffer conductive pattern 416b may be further removed in the CMP process for forming the preliminary contact 420a for obtaining an optimal thickness of the buffer conductive pattern 416 for the buffer pattern 410. In such a case, the first peripheral gate conductive layer 830a may also be removed from the peripheral area P of the substrate 100 as much as the further removal of the preliminary buffer conductive pattern 416b.

Referring to FIGS. 3 and 16A to 16D, a conductive layer 430a may be formed on a whole surface of substrate 100 having the preliminary contact 420a, so that the preliminary buffer pattern 410b and the preliminary contact 420a may be covered by the conductive layer 430a in the cell area C and the first peripheral gate conductive layer 830a may be covered by the conductive layer 430a in the peripheral area P.

A barrier layer 432a may be formed on the preliminary buffer pattern 410b and the preliminary contact 420a in the cell area C and on the first peripheral gate conductive layer 830a in the peripheral area P. For example, the barrier layer may be formed by a CVD process and may include a conductive metal nitride such as titanium nitride (TiN), tantalum nitride (TaN) and tungsten nitride (WN). Particularly, the barrier layer in the peripheral area P will be designated by a reference numeral 840a for convenience's sake. In addition, the barrier layer 840a in the peripheral area P may be referred to as a peripheral barrier layer hereinafter.

A conductive metal layer 434a may be formed on the barrier layer 432a and a capping layer 436a may be formed on the conductive metal layer 434a. Similar to the barrier layer, the conductive metal layer in the peripheral area P and the capping layer 436a will be designated by reference numerals 850a and 860a, respectively, for convenience's sake.

The conductive metal layer 434a may be formed by one of a PVD process, a CVD process and a sputtering process and may include a low resistive metal such as ruthenium (Ru), iridium (Ir), titanium (Ti), tantalum (Ta) and tungsten (W). The capping layer 436a may include one of an oxide, a nitride and an oxynitride.

Figure 17A:
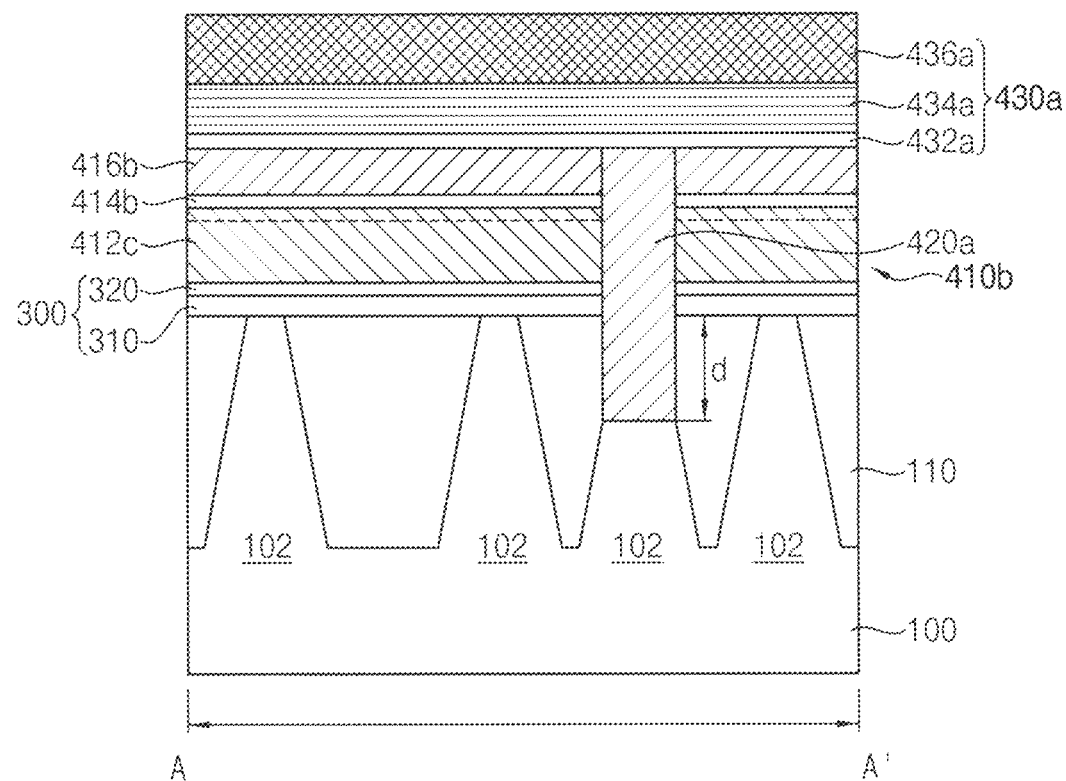
Figure 17B:
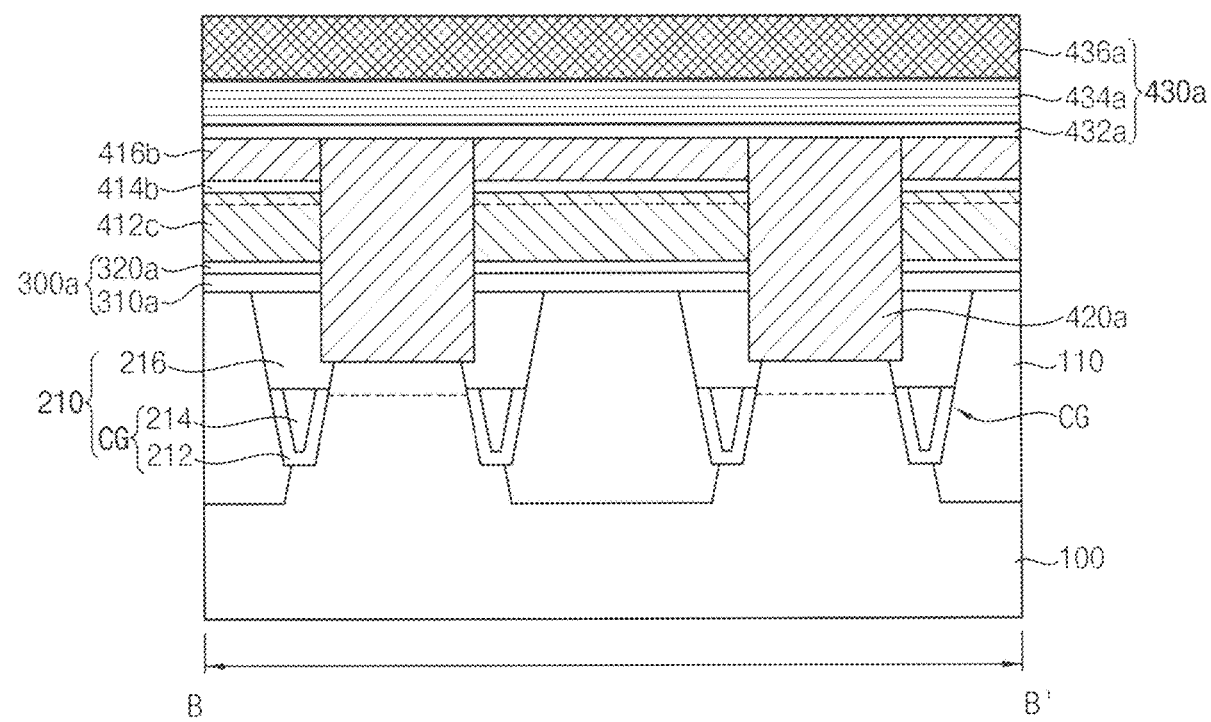
Figure 17C:
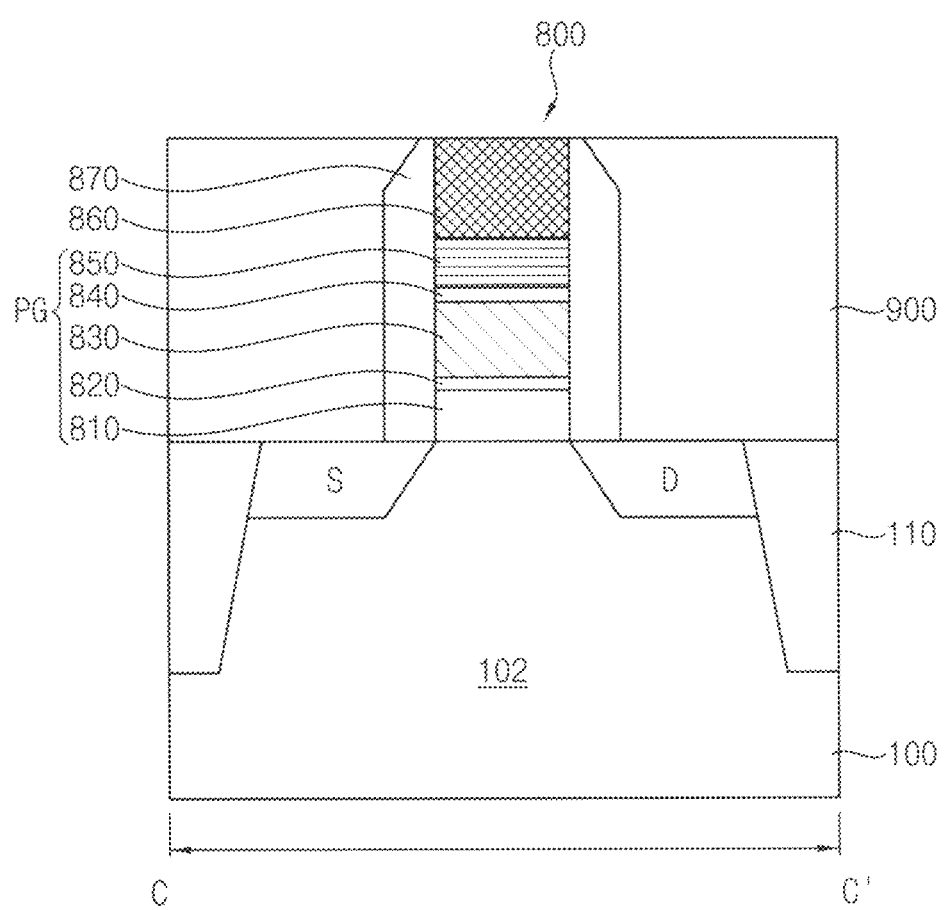
Figure 17D:
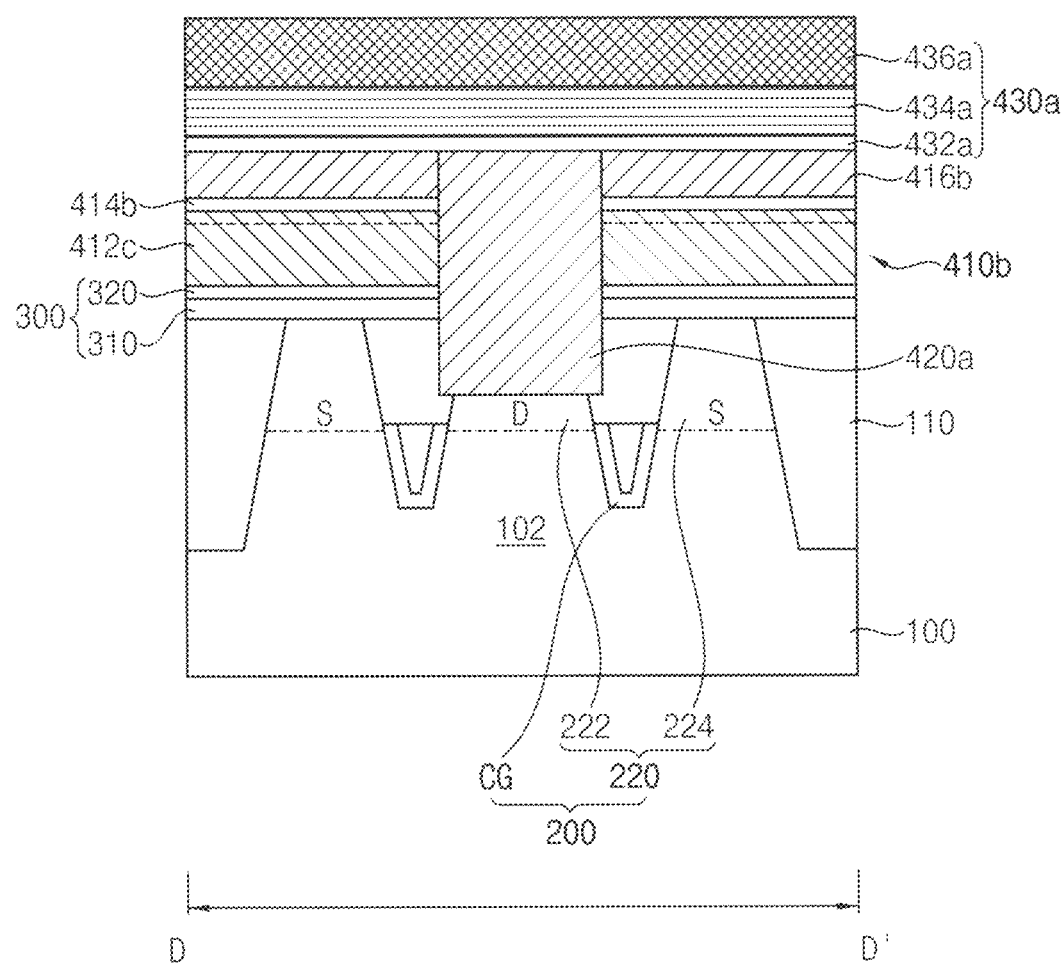
Figure 18A:
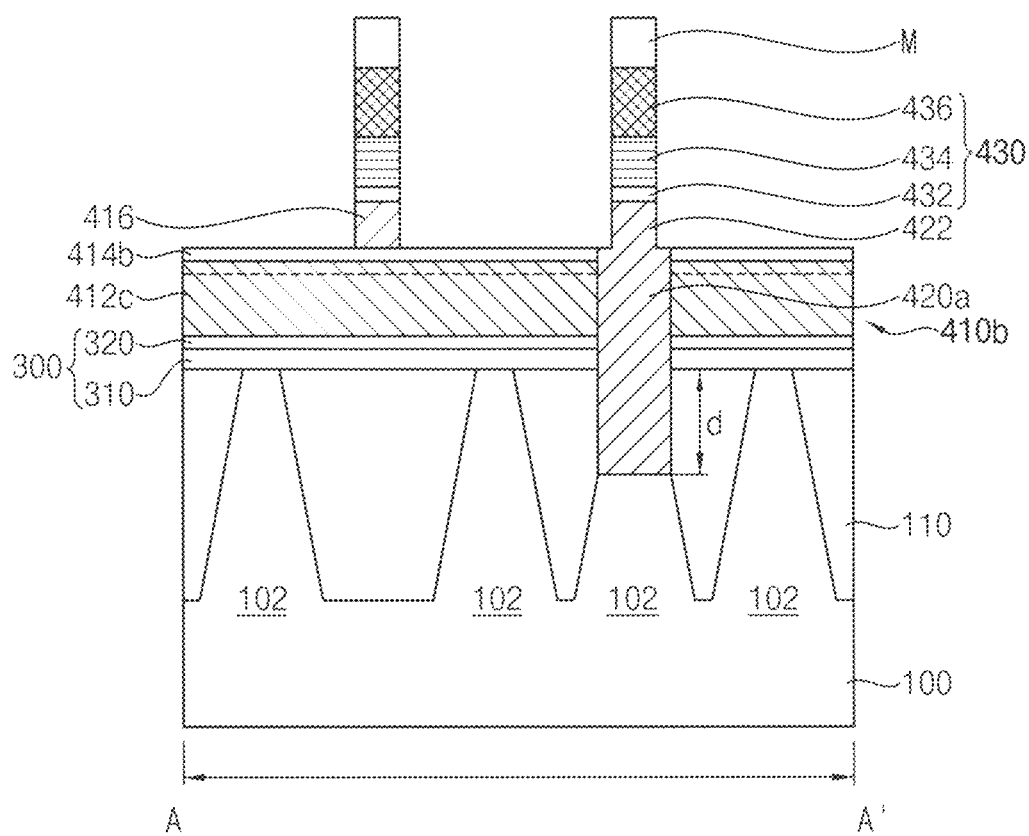
Figure 18B:
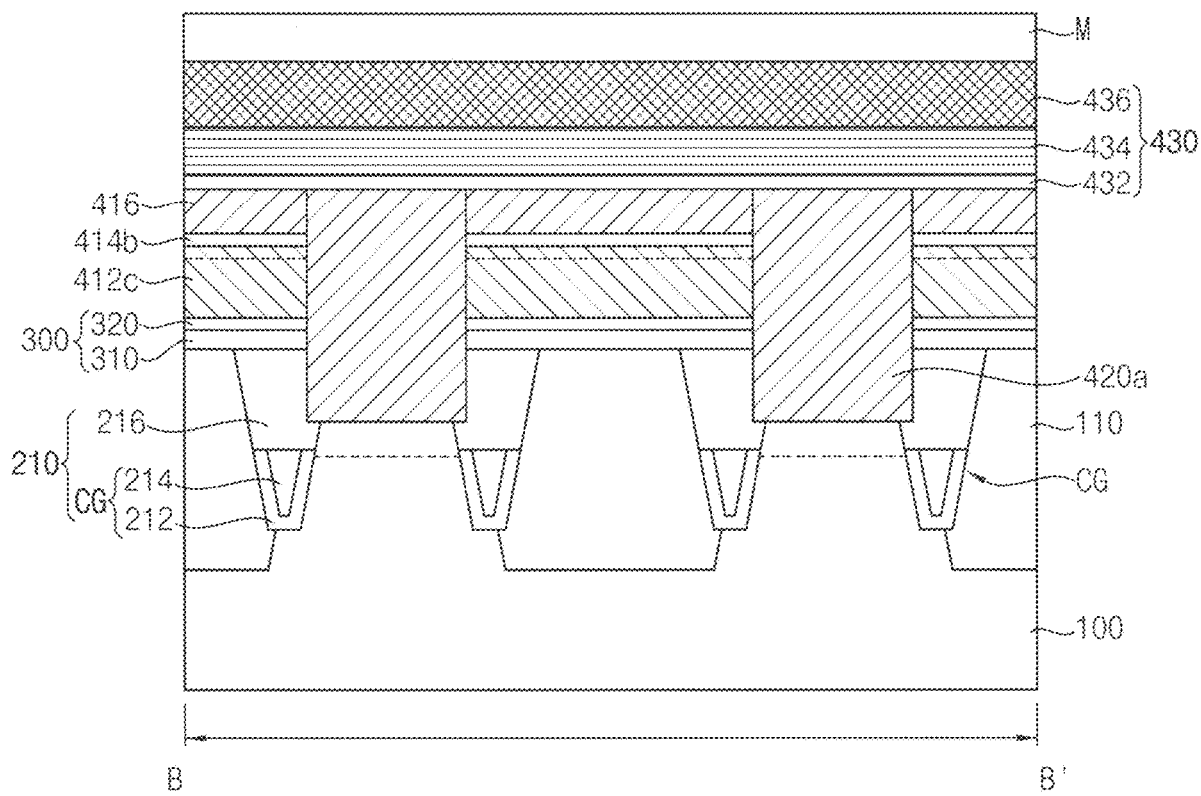
Figure 18C:
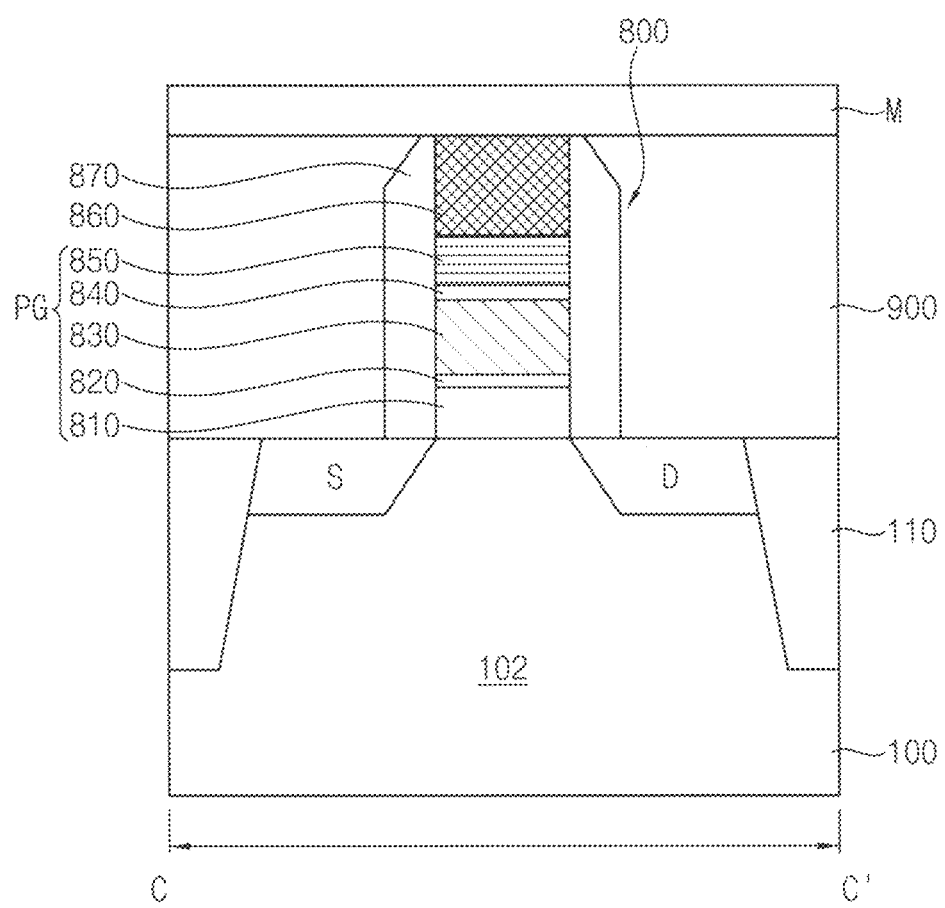
Figure 18D:
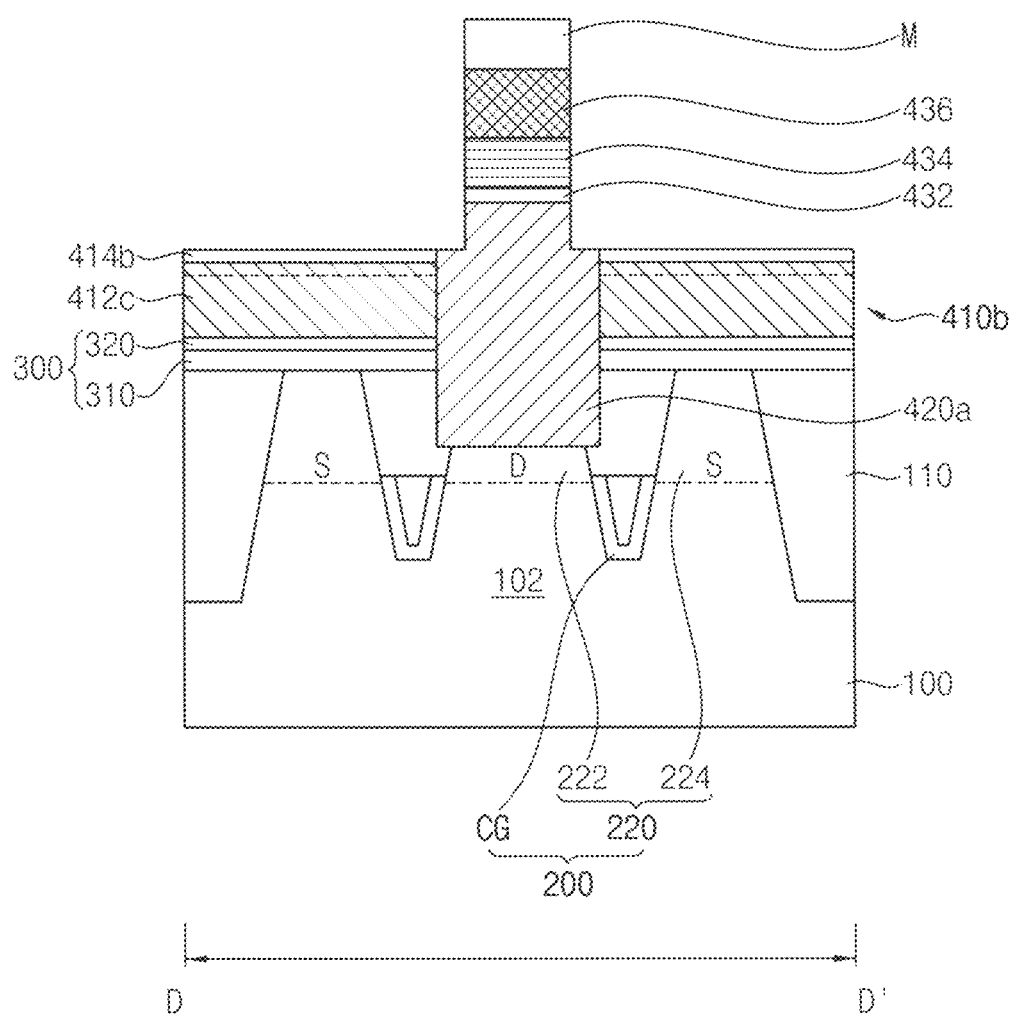
Figure 19A:
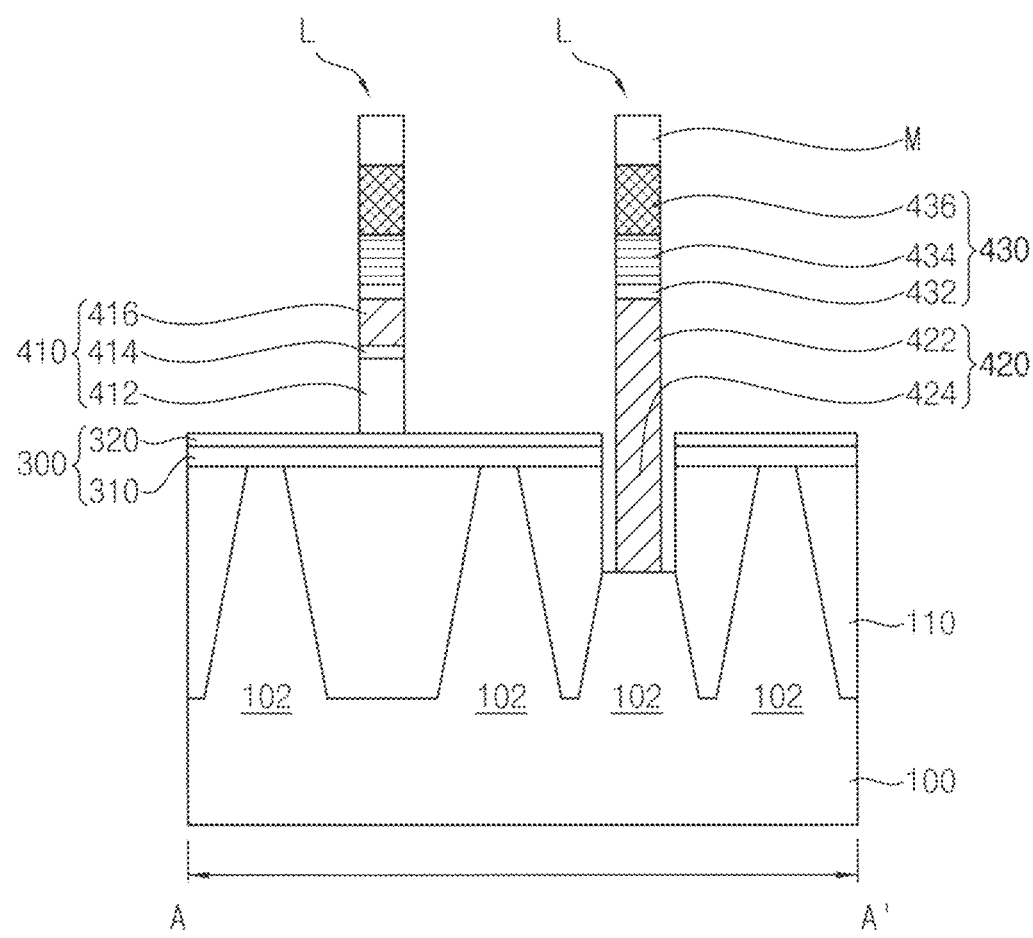
Figure 19B:
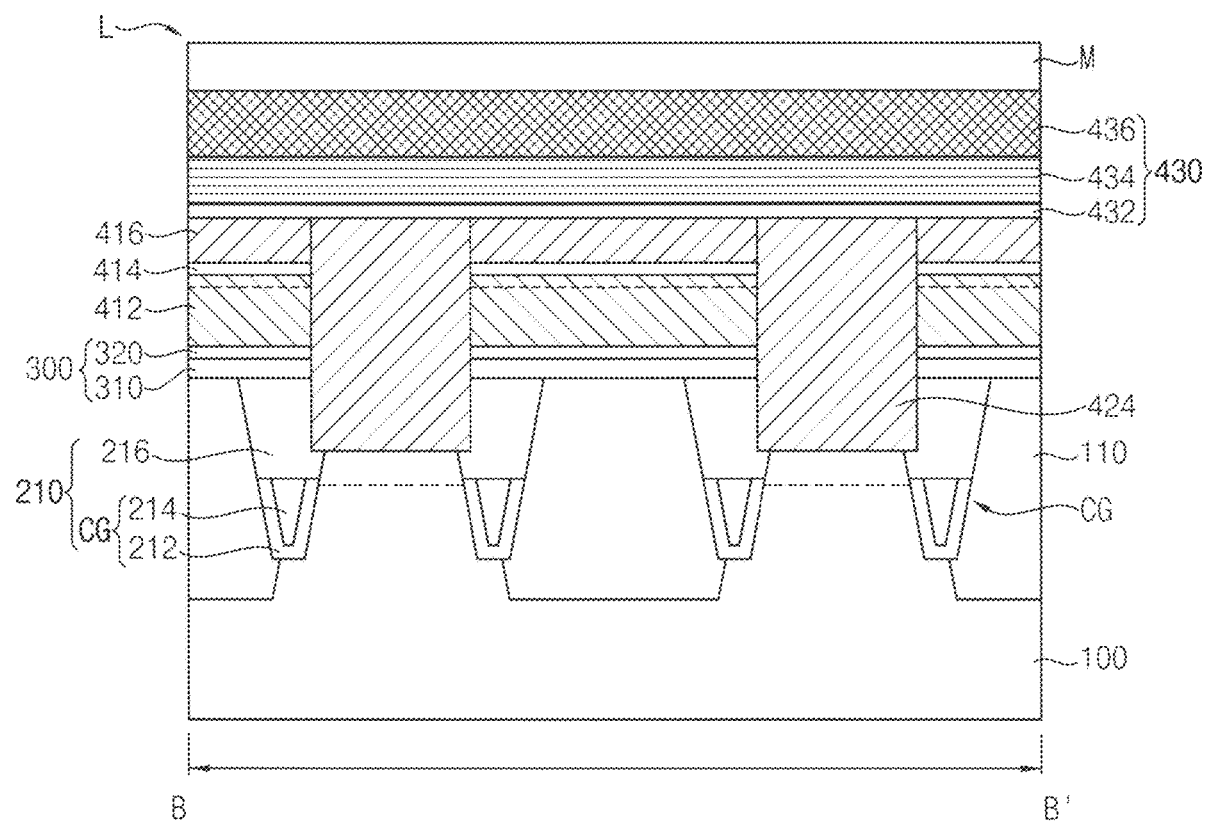
Figure 19C:
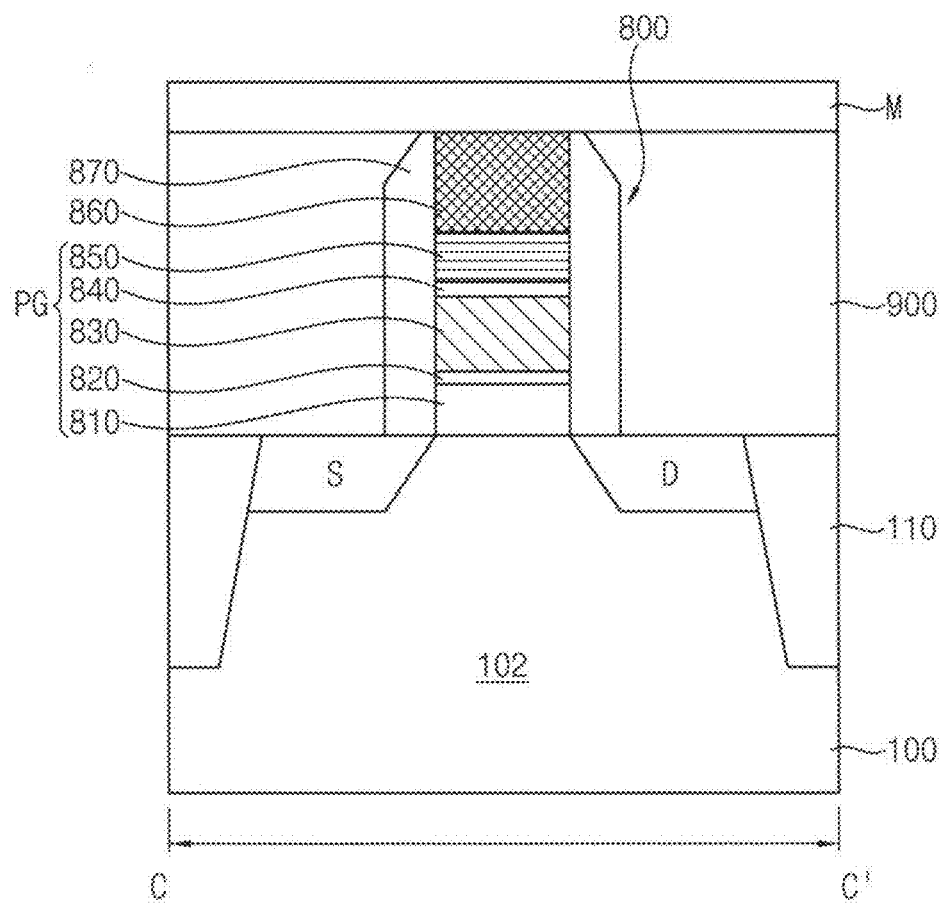
Figure 19D:
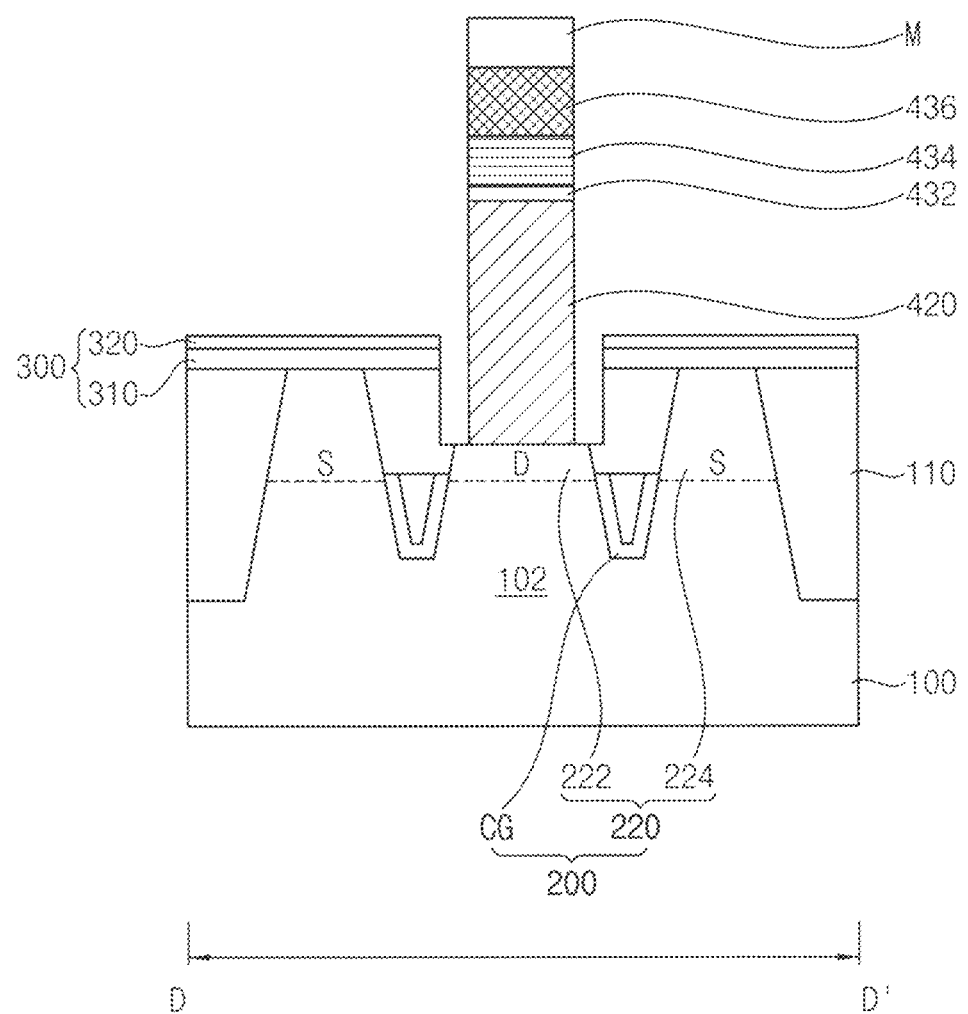
Figure 20A:
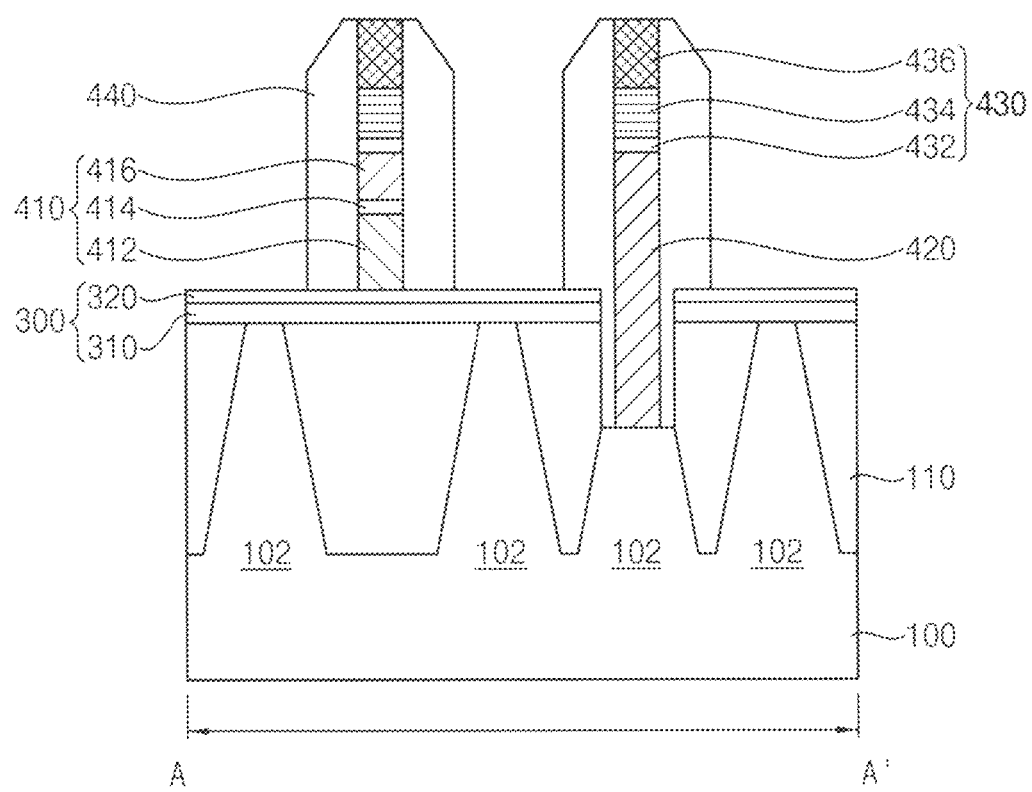
Figure 20B:
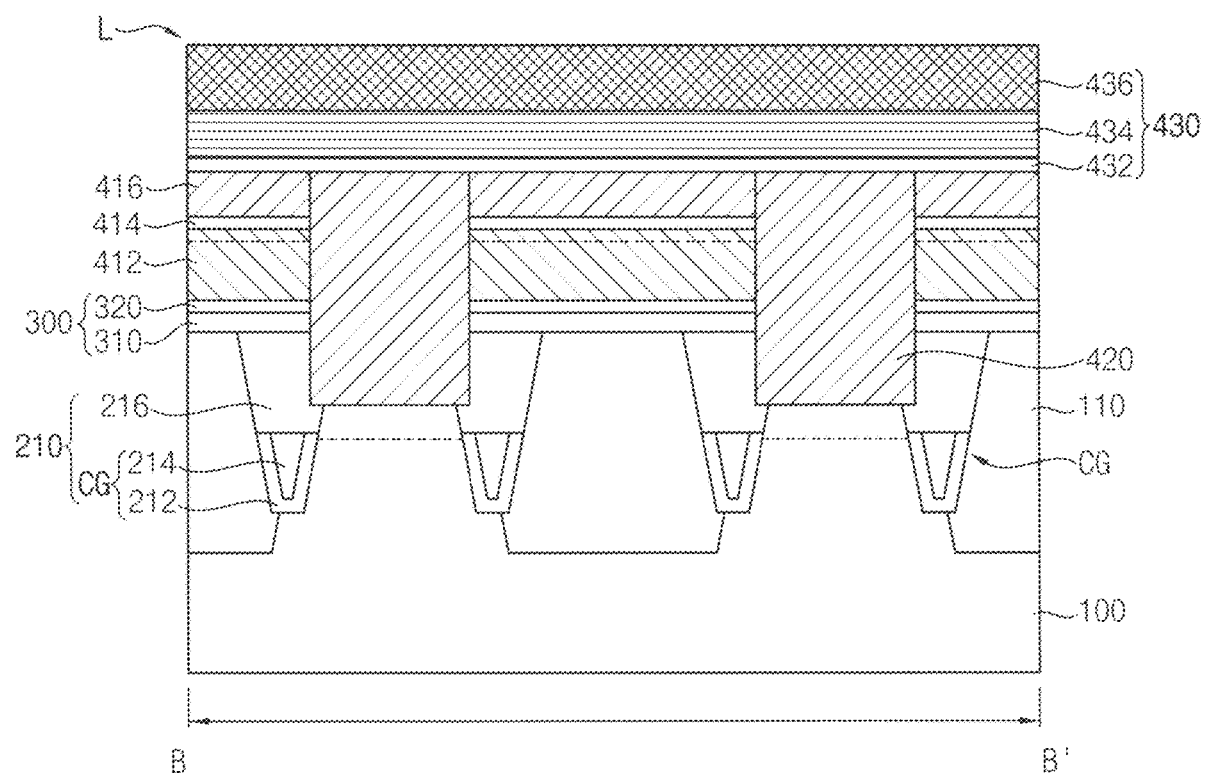
Figure 20C:
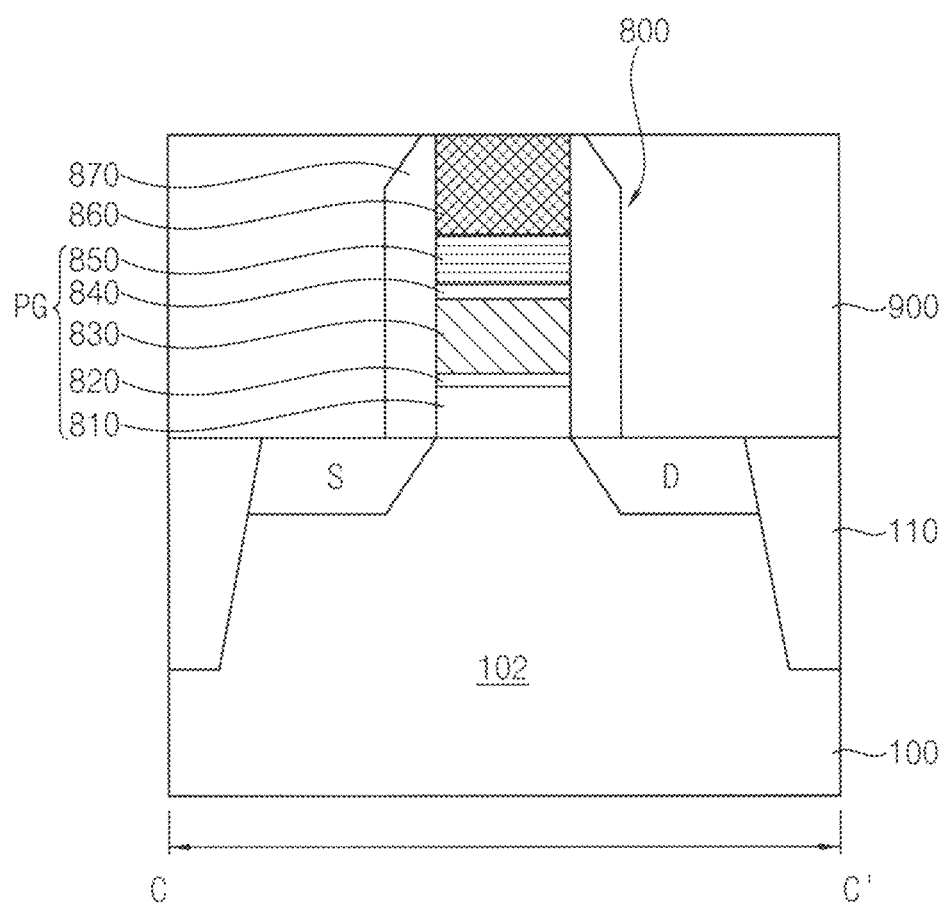
Figure 20D:
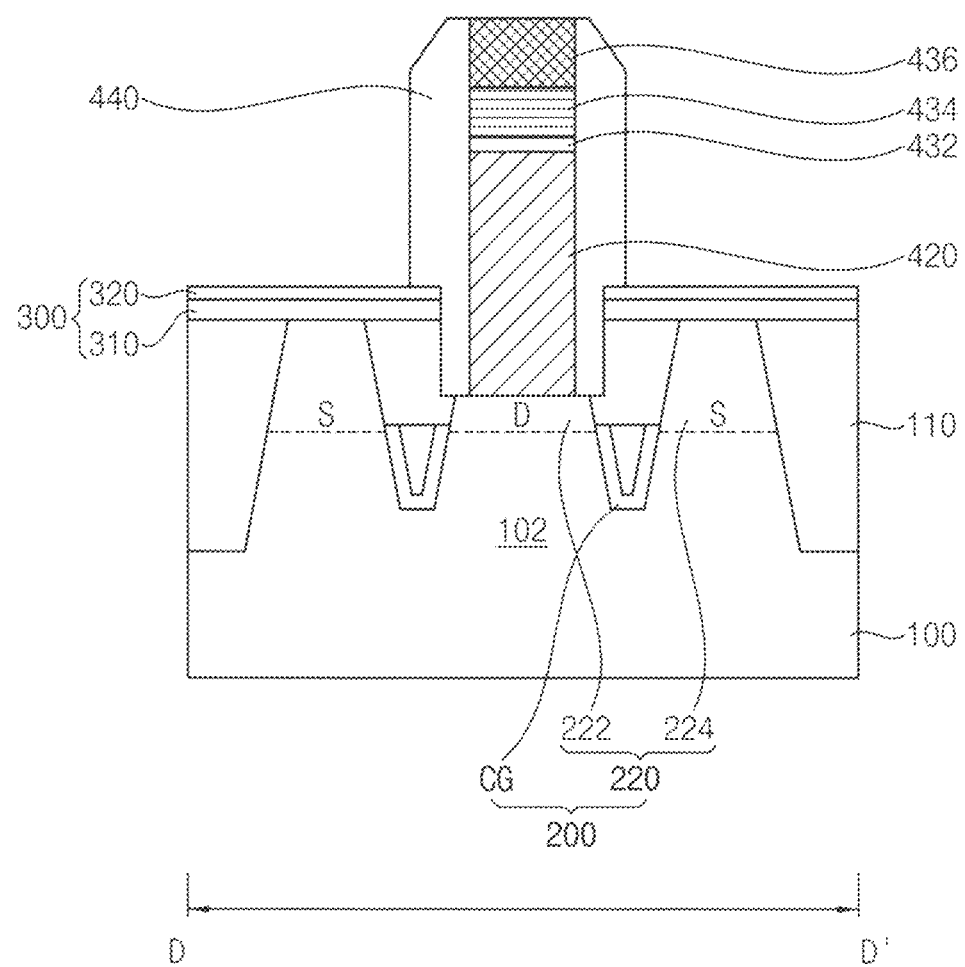

The conductive metal layer 434a and the capping layer 436a may be formed into a conductive line 430 in FIG. 18A in a subsequent process in the cell area C, while the conductive metal layer 850a and the capping layer 860a may be formed into a peripheral transistor 800 in FIG. 17C in a subsequent process in the peripheral area P. For that reason, the conductive metal layer 850a may be referred to as second peripheral gate conductive layer and the capping layer 860a may be referred to as peripheral gate capping layer hereinafter.

Thereafter, a peripheral transistor 800 may be formed on the peripheral area P of the substrate 100.

Referring to FIGS. 3 and 17A to 17D, a mask pattern (not shown) for a peripheral gate PG may be formed on the capping layer 436a and 860a, and the peripheral gate capping layer 860a, the conductive metal layer 850a, the barrier layer 840a, the first peripheral gate conductive layer 830a, the peripheral hardening layer 820 and the peripheral gate insulation layer 810 may be sequentially patterned by an etching process using the mask pattern for the peripheral gate PG as an etching mask, thereby forming the peripheral gate PG and the peripheral gate capping pattern 860 covering the peripheral gate PG.

Then, a peripheral gate spacer 870 may be formed on side surfaces of the peripheral gate PG and the peripheral gate capping pattern 860. An ion implantation process may be formed onto the active region 102 adjacent to the peripheral gate PG, thereby forming a source electrode S and a drain electrode D at surface portions of the active region 102. Thus, a planar type peripheral transistor 800 may be formed on the active region 102 of the peripheral area P of the substrate 100.

Thereafter, a peripheral insulation layer (not shown) may be formed on the peripheral area P to a sufficient thickness to cover the peripheral transistor 800, and then may be planarized by a CMP process until the peripheral gate capping pattern 860 and the capping layer 436*a* of the cell area C may be exposed, thereby forming the peripheral insulation pattern 900. Particularly, the CMP process for planarizing the peripheral insulation layer may be conducted in such a way that the capping layer 436*a* of the cell area C may be further removed to an expected thickness or height. The reduction of the capping layer 436*a* may reduce the aspect ratio of a line pattern in a subsequent bit line etching process.

After forming the peripheral transistor 800 in the peripheral area P of the substrate 100, a bit line etching process may be performed in the cell area C of the substrate 100. The bit line etching process may include consecutive first and second etching processes.

Referring to FIGS. 3 and 18A to 18D, a first etching process may be performed to the conductive layer 430*a* and the preliminary buffer conductive pattern 416*b*, including partially removing the conductive layer 430*a*, the preliminary buffer conductive pattern 416*b*, and the preliminary contact 420*a*, thereby forming a buffer conductive pattern 416 and a conductive line 430 on the buffer conductive pattern 416 that may be shaped into a line extending in the second direction II.

Restated, the conductive layer 430*a* may be partially removed from the cell area according to the first etching process to remove the preliminary buffer conductive pattern 416*b* and an upper portion of the preliminary contact 420*a* from the cell area C by an over etch of the first etching process, thereby forming a buffer conductive pattern 416, an upper contact 422 and a conductive line 430 contacting the buffer conductive pattern 416 and the upper contact 422.

In some example embodiments, the preliminary buffer conductive pattern 416*b* and the preliminary contact 420*a* may include a common material such that the preliminary buffer conductive pattern 416*b* and the upper portion of the preliminary contact 420*a* are removed at a common etching rate by the over etch of the first etching process.

For example, a bit line mask pattern M may be formed on the capping layer 436*a* in the cell area C and the peripheral insulation pattern 900 and the peripheral gate capping pattern 860 in the peripheral area P in such a configuration that the peripheral area P may be covered by the bit line mask pattern M and the capping layer 436*a* may be exposed in a line extending along the second direction II. Then, the first etching process such as a dry etching process may be performed to the capping layer 436*a* using the bit line mask pattern M as an etching mask. For example, the dry etching process may include a plasma etching process.

The capping layer 436*a*, the conductive metal layer 434*a* and the barrier layer 432*a* may be sequentially patterned into a bit line capping pattern 436, a conductive metal pattern 434 and a barrier pattern 432, respectively, thereby forming a conductive line 430 by the first etching process. Particularly, the preliminary buffer conductive pattern 416*b* and an upper portion of the preliminary contact 420*a* corresponding to the preliminary buffer conductive pattern 416*b* may also be patterned by an over etch of the first etching process. Thus, the preliminary buffer conductive pattern 416*b* and an upper portion of the preliminary contact 420*a* may be formed into a buffer conductive pattern 416 and an upper contact 422, respectively.

In some example embodiments, the preliminary buffer conductive pattern 416*b* may have a sufficient thickness for absorbing the over etch of the first etching process, so the preliminary buffer conductive pattern 416*b* may be fully removed and the preliminary hardening pattern 414*b* underlying the preliminary buffer conductive pattern 416*b* may be sufficiently exposed in the first etching process. The preliminary contact 420*a* may also be removed simultaneously with the preliminary buffer conductive pattern 416*b* in the first etching process, so that the upper contact 422 and the buffer conductive pattern 416 may have the same thickness.

When the preliminary buffer conductive pattern 416*b* may have insufficient thickness for absorbing the over etch of the first etching process, the preliminary hardening pattern 414*b* and the preliminary thermal oxide pattern 412*c* may absorb the over etch of the first etching process. In such a case, the preliminary hardening pattern 414*b* and the preliminary thermal oxide pattern 412*c* may be removed by the over etch of the first etching process, and the preliminary contact 420*a* may also be removed simultaneously with the preliminary hardening pattern 414*b* and the preliminary thermal oxide pattern 412*c* as well as with the preliminary buffer conductive pattern 416*b* in the first etching process. Therefore, the thickness of the upper contact 422 may be greater than the thickness of the buffer conductive pattern 416.

Therefore, when the preliminary hardening pattern 414*b* and the preliminary thermal oxide pattern 412*c* may sufficiently absorb the over etch of the first etching process and a residual thickness of the preliminary hardening pattern 414*b* and the preliminary thermal oxide pattern 412*c* after the first etching process may be sufficient for protecting the substrate 100 in a subsequent second etching process, the buffer conductive layer 416*a* or the preliminary buffer conductive pattern 416*b* need not be formed for the buffer pattern 410.

In some example embodiments, the buffer conductive pattern 416 may have a thickness of about 20 Å to about 200 Å. For example, when the preliminary thermal oxide pattern 412*c* may have a thickness of about 50 Å to about 60 Å, the thickness of the buffer conductive pattern 416 may be maximally reduced to about 40 Å.

That is, the thickness or height of the buffer conductive pattern 416 may be reduced according to the over etch of the first etching process and the thickness of the preliminary thermal oxide pattern 412*c*. Therefore, an overall height of the buffer pattern 410 may be reduced due to height reduction of the buffer conductive pattern 416.

Referring to FIGS. 3 and 19A to 19D, a second etching process may be consecutively conducted to the preliminary hardening pattern 414*b*, the preliminary thermal oxide pattern 412*c* and a lower portion of the preliminary contact 420*a* under the upper contact 422.

Thus, the preliminary hardening pattern 414*b* and the preliminary thermal oxide pattern 412*c* may be patterned into a hardening pattern 414 and a thermal oxide pattern 412, respectively, and the lower portion of the preliminary contact 420*a* may be patterned into a lower contact 424 by the second etching process. The lower contact 424 may extend through the first contact hole H1 and the junction recess R to the upper contact 422. The stack structure of the thermal oxide pattern 412, the hardening pattern 414 and the buffer conductive pattern 416 may be provided as a buffer pattern 410 interposed between the insulation pattern 300 and the conductive line 430. In addition, the upper contact 422 and the lower contact 424 may be provided as a first contact 420.

Restated, the preliminary thermal oxide pattern 412*c* and a lower portion of the preliminary contact 420*a* may be partially removed according to a second etching process performed subsequently to the first etching process to form the thermal oxide pattern 412 under the buffer conductive pattern 416 and the lower contact 424 under the upper contact 422 in the in the first contact hold H1 and the junction recess R such that the thermal oxide pattern 412 and the buffer conductive pattern 416 at least partially comprise the buffer pattern 410 and the lower contact 424 and the upper contact 422 at least partially comprise the first contact 420.

The second etching process may include a dry etching process such as a plasma etching process and may be consecutively conducted with the first etching process. The first etching process and the second etching process may constitute the bit line etching process.

Since the etch rates of the preliminary hardening pattern 414b and the preliminary thermal oxide pattern 412c may be much smaller than that of the preliminary contact 420a, the preliminary thermal oxide pattern 412c may be remain although the second etching process may be conducted to the bottom of the junction recess R and the lower portion of the preliminary contact 420a may be formed into the lower contact 424. That is, the substrate 100 may be sufficiently protected from the second etching process although the second etching process may be conducted to the bottom of the junction recess R.

Thus, the thickness and the etch rate of the preliminary hardening pattern 414b and the preliminary thermal oxide pattern 412c may be controlled and adjusted in such a way that the etch stop pattern 320 or the base oxide pattern 310 may be exposed without any damages to the substrate 100 while the second etching process may be conducted to the bottom of the junction recess R and the lower portion of the preliminary contact 420a may be formed into the lower contact 424.

The compositions and thickness of the hardening pattern 414 and the thermal oxide pattern 412 may be determined in consideration of the height of the lower contact 424 and a relative etch rate with respect to the preliminary contact 420a. In some example embodiments, the thermal oxide pattern 412 may have a thickness of about 50 Å to about 100 Å and the hardening pattern 414 may have a thickness of about 20 Å to about 30 Å.

As described above, when the thermal oxide pattern 412 may be sufficiently high (or thick) and resistive to the bit line etching process, the buffer pattern 410 may include only the thermal oxide pattern 412 and the hardening pattern 414 without the buffer conductive pattern 416. In such a case, the thermal oxide pattern 412 and the hardening pattern 414 may absorb the over etch of the first etching process and may be sufficiently resistive to the second etching process for minimizing the damages to the substrate 100 and the BCAT 200 in the bit line etching process.

Accordingly, a plurality of line patterns L may be arranged on the insulation pattern 300 in such a configuration that the line pattern may extend in the second direction II and may be spaced apart from a neighboring line pattern L by the same gap distance in the first direction I. The line pattern L may include the buffer pattern 410 that may be arranged on the insulation pattern 300, the first contact 420 making contact with the first junction 222 through the insulation pattern 300 and having a top surface at the same level as the buffer pattern 410 and the conductive line 430 on the buffer pattern 410 and the first contact 420 and transferring electric signals in the second direction II.

Referring to FIGS. 3 and 20A to 20D, a bit line spacer 440 may be formed on side surfaces of each line pattern L in such a way that the junction recess R and the first contact hole H1 may be filled with the bit line spacer 440, thereby forming a bit line structure 400 on the substrate 100. Restated, a bit line spacer 440 may be formed on side surfaces of the conductive line 430 and the buffer pattern 410, where the bit line spacer fills the first contact hole H1 and junction recess R around the first contact 420.

A spacer layer (not shown) may be formed on the insulation pattern 300 to a sufficient thickness that the gap space between the neighboring the line patterns L and the inner spaces of the junction recess R and the first contact H1 around the lower contact 424 may be filled with insulation materials. Then, the spacer layer may be partially removed by an isotropic etching process and may remain just on the side surfaces of each line pattern L. For example, the spacer layer may be formed by a CVD process and the insulation materials for the spacer layer may include one of oxide, nitride and oxynitride.

Then, the residuals of the mask pattern M may be removed from the bit line capping pattern 436, thereby forming the bit line structure 400 on the substrate 100.

Thereafter, the insulation interlayer pattern 500 for covering the bit line structure 400 and the charge storage structure 600 having the second contact 610 and the charge holder 620 may be formed on the substrate 100 on which the bit line structure 400 may be formed, thereby forming the memory device 1000 shown in FIGS. 4A to 4D.

According to some example embodiments of the memory devices and methods of manufacturing the same, the thermal oxide layer 412b may be formed on the insulation layer 300a by the thermal oxidation process to polysilicon simultaneously with the peripheral gate insulation layer. The thermal oxide layer 412b may be formed into the thermal oxide pattern 412 of the buffer pattern 410 for preventing etching damages to the substrate 100 and the BCAT 200 underlying the insulation layer 300a in the bit line etching process.

The thickness of the thermal oxide layer 412b may be easily controlled just by changing the initial thickness of the polysilicon and the process conditions of the thermal oxidation process for forming the peripheral gate insulation layer 810, so the thermal oxide pattern 412 may be controlled to have a sufficient thickness for protecting the substrate 100 and the BCAT 200 in the bit line etching process. Since the etching rate of the thermal oxide pattern 412 may be much smaller than that of the conductive material of the first contact 420 making contact with the first junction 222, a small thickness of the thermal oxide pattern may be sufficiently protect the substrate 100 in the bit line etching process. Thus, when the thermal oxide pattern may be included in the buffer pattern 410, an overall thickness or height of the buffer pattern 410 may be reduced and thus the aspect ratio of the line pattern L may be reduced in the bit line etching process, thereby preventing the collapse of the line pattern L in the bit line etching process and the bridge defect of the bit line structure 400.

In addition, the height of the buffer conductive pattern 416 in the buffer pattern 410 may also be reduced since the thermal oxide pattern having a good etch resistivity in the bit line etching process may be included in the buffer pattern 410, so that the area of the opposite face between the buffer conductive pattern 416 and the upper contact 422 adjacent to each other may be sufficiently reduced. Thus, the parasitic capacitance between the neighboring bit line structures 400 may be reduced and the sensing margin of the bit line structure 400 may be improved, thereby improving the operation characteristics of the memory device 1000.

The foregoing is illustrative of some example embodiments and is not to be construed as limiting thereof. Although some example embodiments have been described, those skilled in the art will readily appreciate that many modifications are possible in some example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of some example embodiments and is not to be construed as limited to the specific example embodiments disclosed, and that modifications to some example embodiments are intended to be included within the scope of the appended claims.

What is claimed is:

1. A bit line structure for a memory device, comprising:
a buffer pattern arranged on a semiconductor substrate having at least a transistor therein and shaped into a line extending in a direction such that the buffer pattern includes a thermal oxide pattern;
a conductive line arranged on the buffer pattern and extending in the direction such that the conductive line has a same width as the buffer pattern; and
a contact extending downwards from the conductive line into the semiconductor substrate through the buffer pattern such that the contact makes contact with the transistor in the semiconductor substrate.

2. The bit line structure of claim 1, wherein the thermal oxide pattern includes a silicon oxide pattern that is oxidized from polysilicon by a thermal oxidation process.

3. The bit line structure of claim 2, wherein the thermal oxide pattern has a thickness in a range of about 50 Å to about 100 Å.

4. The bit line structure of claim 2, wherein the buffer pattern includes a buffer conductive pattern interposed between the thermal oxide pattern and the conductive line.

5. The bit line structure of claim 4, wherein the buffer conductive pattern includes a polysilicon pattern having a thickness of about 20 Å to about 200 Å.

6. The bit line structure of claim 4, wherein the buffer pattern includes a hardening pattern interposed between the buffer conductive pattern and the thermal oxide pattern.

7. The bit line structure of claim 6, wherein the hardening pattern includes a silicon oxynitride pattern having a thickness of about 20 Å to about 30 Å.

8. The bit line structure of claim 2, wherein the buffer pattern includes a hardening pattern interposed between the thermal oxide pattern and the conductive line such that a top surface of the hardening pattern is arranged at a same level as the top surface of the contact.

9. The bit line structure of claim 1, wherein a top surface of the buffer pattern is coplanar with a top surface of the contact such that a bottom surface of the conductive line is flat on the buffer pattern and the contact.

10. The bit line structure of claim 1, wherein the contact includes polysilicon and is shaped into a cylinder making contact with the transistor below a top surface of the semiconductor substrate.

11. A memory device comprising:
a semiconductor substrate having a plurality of active regions defined by a device isolation layer;
a plurality of transistors buried in the active regions of the semiconductor substrate, each of the transistors having a lower junction lower than a top surface of the device isolation layer;
an insulation pattern arranged on the semiconductor substrate and covering the transistors and the device isolation layer; and
a bit line structure arranged on the insulation pattern and shaped into a line in a direction such that the bit line structure is connected to the lower junctions of the transistors that are arranged in the direction,
wherein the bit line structure includes:
a buffer pattern arranged on the semiconductor substrate and shaped into a line extending in the direction such that the buffer pattern includes a thermal oxide pattern;
a conductive line arranged on the buffer pattern and extending in the direction such that the conductive line has a same width as the buffer pattern; and
a plurality of contacts extending downwards from the conductive line into the semiconductor substrate through the buffer pattern such that the plurality of contacts makes contact with a plurality of the lower junctions of the transistors, respectively, in the semiconductor substrate.

12. The memory device of claim 11, wherein the buffer pattern includes a buffer conductive pattern comprising polysilicon and interposed between the thermal oxide pattern and the conductive line.

13. The memory device of claim 12, wherein each contact includes polysilicon and is shaped into a cylinder making contact with the lower junction of a respective transistor of the transistors.

14. The memory device of claim 12, wherein the buffer pattern includes a hardening pattern interposed between the buffer conductive pattern and the thermal oxide pattern.

15. A memory device comprising:
a substrate having a plurality of active regions defined by a device isolation layer;
a plurality of cell transistors on the plurality of active regions of the substrate, each cell transistor of the plurality of cell transistors including a buried cell gate in the substrate and a junction portion adjacent to the buried cell gate and at least partially distal to the substrate in relation to the buried cell gate;
an insulation pattern on the substrate, the insulation pattern covering the plurality of cell transistors and the device isolation layer; and
a bit line structure on the insulation pattern and connected to the junction portion, the bit line structure including
a buffer pattern extending on the insulation pattern and including a thermal oxide pattern,
a conductive line on the buffer pattern, and
a contact extending from the conductive line to the junction portion through the buffer pattern and the insulation pattern.

16. The memory device of claim 15, wherein the thermal oxide pattern includes silicon oxide.

17. The memory device of claim 16, wherein the buffer pattern includes a buffer conductive pattern that is on the thermal oxide pattern, the buffer conductive pattern having a top surface that is substantially coplanar with a top surface of the contact.

18. The memory device of claim 17, wherein the buffer conductive pattern and the contact include a common conductive material.

19. The memory device of claim 17, wherein the buffer pattern includes a hardening pattern between the buffer conductive pattern and the thermal oxide pattern.

20. The memory device of claim 15, wherein the junction portion includes:

a higher junction having a top surface that is substantially coplanar with a top surface of the device isolation layer, and a lower junction having a top surface proximate to the substrate in relation to the top surface of the device isolation layer, and the contact has a cylindrical shape and extends to the lower junction from the conductive line.

* * * * *